(12) United States Patent
Hisamoto et al.

(10) Patent No.: US 9,054,174 B2
(45) Date of Patent: Jun. 9, 2015

(54) SEMICONDUCTOR DEVICE AND METHOD FOR PRODUCING THE SAME

(71) Applicant: Hitachi, Ltd., Chiyoda-ku, Tokyo (JP)

(72) Inventors: Digh Hisamoto, Kokubunji (JP); Naoki Tega, Kiyose (JP); Kumiko Konishi, Kokubunji (JP); Hiroyuki Matsushima, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/913,021

(22) Filed: Jun. 7, 2013

(65) Prior Publication Data
US 2013/0328062 A1    Dec. 12, 2013

(30) Foreign Application Priority Data
Jun. 7, 2012    (JP) ................................. 2012-129460

(51) Int. Cl.
| | | |
|---|---|---|
| H01L 29/12 | (2006.01) | |
| H01L 29/78 | (2006.01) | |
| H01L 29/66 | (2006.01) | |
| H01L 29/739 | (2006.01) | |
| H01L 29/16 | (2006.01) | |
| H01L 29/872 | (2006.01) | |
| H01L 21/04 | (2006.01) | |
| H01L 29/417 | (2006.01) | |
| H01L 29/47 | (2006.01) | |
| H01L 29/49 | (2006.01) | |
| H01L 29/51 | (2006.01) | |
| H01L 29/06 | (2006.01) | |

(52) U.S. Cl.
CPC .......... *H01L 29/78* (2013.01); *H01L 29/66477* (2013.01); *H01L 29/1608* (2013.01); *H01L 29/665* (2013.01); *H01L 29/872* (2013.01); *H01L 21/0495* (2013.01); *H01L 29/41766* (2013.01); *H01L 29/41775* (2013.01); *H01L 29/47* (2013.01); *H01L 29/495* (2013.01); *H01L 29/517* (2013.01); *H01L 29/66068* (2013.01); *H01L 29/7395* (2013.01); *H01L 29/7802* (2013.01); *H01L 29/7811* (2013.01); *H01L 29/7813* (2013.01); *H01L 29/782* (2013.01); *H01L 29/7839* (2013.01); *H01L 29/0619* (2013.01)

(58) Field of Classification Search
CPC ... H01L 29/78; H01L 29/1608; H01L 29/872; H01L 21/0495; H01L 29/7811; H01L 29/0619; H01L 29/665
See application file for complete search history.

(56) References Cited

U.S. PATENT DOCUMENTS

| | | | | |
|---|---|---|---|---|
| 2008/0093676 | A1* | 4/2008 | Shingu et al. | 257/386 |
| 2009/0242901 | A1* | 10/2009 | Matocha et al. | 257/77 |
| 2010/0059819 | A1* | 3/2010 | Snyder | 257/343 |
| 2010/0148244 | A1* | 6/2010 | Kitabatake et al. | 257/328 |

OTHER PUBLICATIONS

Kedzierski, J., et al., "Complementary silicide source/drain thin-body MOSFETs for the 20nm gate length regime", Tech. Dig. IEDM 2000, pp. 57-60.

\* cited by examiner

*Primary Examiner* — Fei Fei Yeung Lopez
(74) *Attorney, Agent, or Firm* — Miles & Stockbridge P.C.

(57) ABSTRACT

In a MOSFET using a SiC substrate, a source region having low resistance and high injection efficiency is formed without performing a high-temperature heat treatment.

A vertical Schottky barrier transistor in which a source region SR on a SiC epitaxial substrate is constituted by a metal material is formed. The source region SR composed of a metal material can be brought into a low resistance state without performing a high-temperature activation treatment. Further, by segregating a conductive impurity DP at an interface between the source region SR composed of a metal material and the SiC epitaxial substrate, the Schottky barrier height can be reduced, and the carrier injection efficiency from the source region SR can be improved.

10 Claims, 79 Drawing Sheets

SEMICONDUCTOR DEVICE AND METHOD FOR PRODUCING THE SAME

CROSS-REFERENCE TO RELATED APPLICATION

This application claims the priority of Japanese Patent Application No. 2012-129460 filed Jun. 7, 2012, which is incorporated herein by reference in its entirety.

BACKGROUND OF THE INVENTION

1. Field of the Invention

The present invention relates to a semiconductor device and a technique for producing the same, and for example, relates to a technique effectively applied to a semiconductor device including a power device constituting an inverter and a technique for producing the same.

2. Background Art

For example, as disclosed in NPL 1 (J. Kedzierski, et al., "Complementary silicide source/drain thin-body MOSFETs for the 20 nm gate length regime", Tech. Dig. IEDM 2000, pp. 57-60), as a method for forming a MOSFET (Metal Oxide Semiconductor Field Effect Transistor) without resort to high-temperature activation in a silicon semiconductor, a Schottky barrier MOSFET (Schottky Barrier Transistor, hereinafter referred to as "SBT") using a metal material as it is as a material for a diffusion layer electrode such as a source region or a drain region is known.

Recently, in order to achieve low-carbon society, more highly efficient use of energy has become an important and urgent issue. In order to highly efficiently use energy, an effect of reducing power loss in an inverter can contribute thereto, and therefore, the development of a power device constituting an inverter is important. Under the research and development in this manner, as a material for a power MOSFET, replacement of Si (silicon) to SiC (silicon carbide) has been under consideration. This is because as compared with Si (silicon) SiC (silicon carbide) has about 7 times higher dielectric breakdown field strength and about 3 times larger band gap, and therefore has characteristics that it can reduce loss and allow high-temperature operation of power devices. Hereinafter "silicon" and "silicon carbide" are sometimes referred to as "Si" and "SiC", respectively.

A SiC power MOSFET can decrease the on-resistance as compared with a Si power MOSFET in the case where the voltage resistance is equivalent. This is attributed to the fact that the thickness of an epitaxial layer serving as a drift layer can be decreased when using SiC as compared with Si. However, in consideration of commercialization of a product as a practical industrial device, as compared with silicon devices having been established as the advancement of LSI (Large-Scale Integration) since around 1960 and the production process thereof, SiC devices still have a lot of problems.

For example, a SiC power MOSFET is known to have a problem that the channel mobility is decreased. As compared with Si (silicon), SiC (silicon carbide) has a higher dielectric breakdown field strength and a larger band gap, and therefore, the thickness of a drift layer (an epitaxial layer) for ensuring the voltage resistance can be decreased. As a result, the thickness of the drift layer having a low impurity concentration is decreased, and therefore, the on-resistance can be decreased. On the other hand, in the SiC power MOSFET, the channel mobility is decreased. Therefore, if the channel mobility can be increased in the SiC power MOSFET, the on-resistance can be further decreased. That is, in the SiC power MOSFET, due to the fact that as compared with Si, SiC to be used as a substrate material has a higher dielectric breakdown field strength and a larger band gap, if the voltage resistance is equivalent, the on-resistance can be decreased, however, in addition thereto, if the channel mobility can be increased, the on-resistance can be further decreased. In view of this, from the viewpoint of aiming at reduction of on-resistance, the SiC power MOSFET still has room for improvement, and by the reduction of on-resistance, there is a possibility that a SiC power MOSFET having high performance can be realized.

SUMMARY OF THE INVENTION

An object of the present invention is to provide, for example, a technique capable of realizing the improvement of performance of a semiconductor device including a power device.

The above and other objects and novel features of the present invention will be apparent from the description of the present specification and the accompanying drawings.

An embodiment of typical aspects of the invention disclosed in the present application will be briefly described below.

In order to achieve the above object, a semiconductor device according to one embodiment is configured such that in a so-called vertical field-effect transistor formed in a first region of a semiconductor substrate, a source region is constituted by a metal material.

An advantage obtained by typical aspects of the invention disclosed in the present application will be briefly described below.

According to the semiconductor device of the embodiment, the performance of the semiconductor device including a power device can be improved.

DESCRIPTION OF THE PREFERRED EMBODIMENTS

Figure 1:
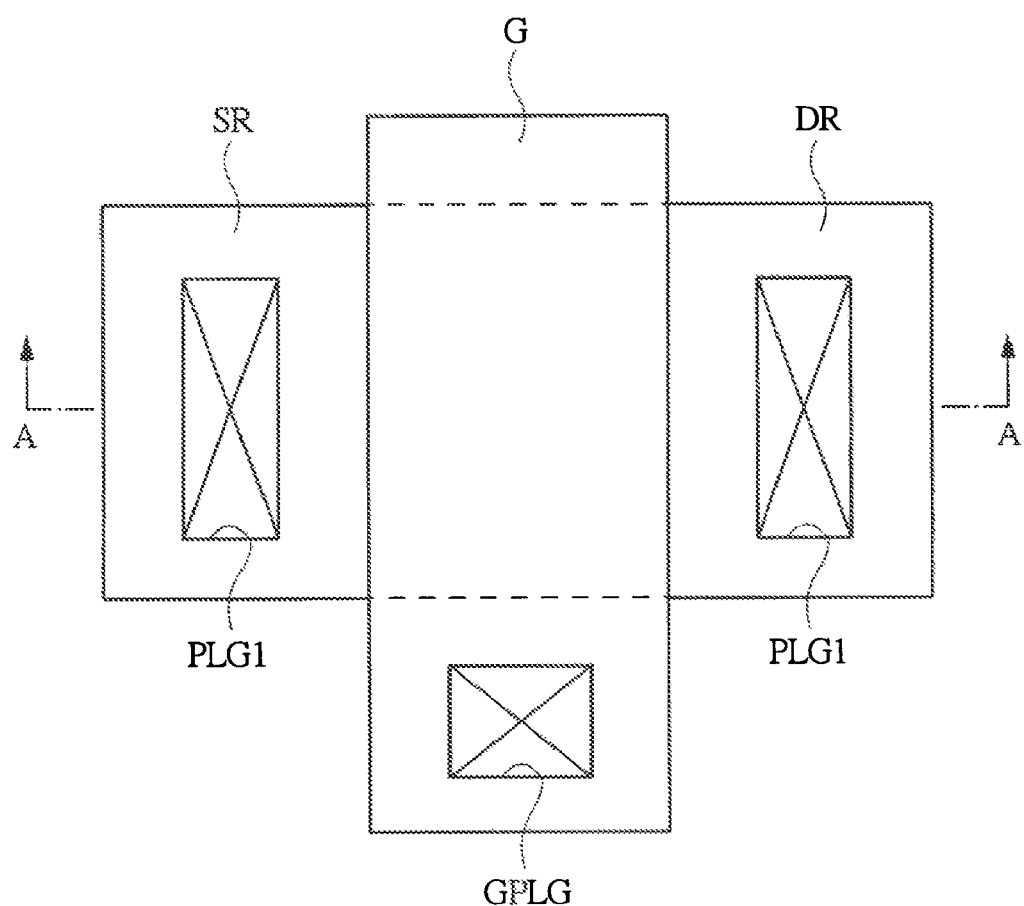
FIG. 1 is a plan view showing a structure of an SBT in the related art.

In the embodiments described below, the present invention will be described by being divided into a plurality of sections or embodiments when required as a matter of convenience. However, these sections or embodiments are not irrelevant to each other unless otherwise explicitly stated, and the one relates to the entire or a part of the other as a modification example, details, a supplementary explanation thereof, or the like.

Also, in the embodiments described below, when referring to the number of elements (including number of pieces, numerical value, amount, range, etc.), the number of the elements is not limited to a specific number unless otherwise explicitly stated or except the case where the number is apparently limited to a specific number in principle, and a number larger or smaller than the specific number is also applicable.

Further, in the embodiments described below, it goes without saying that the components (including element steps, etc.) are not always indispensable unless otherwise explicitly stated or except the case where it is conceivable that the components are apparently indispensable in principle.

Similarly, in the embodiments described below, when the shape of the components, positional relationship thereof, and the like are mentioned, shapes substantially approximate or similar thereto and the like are included therein unless otherwise explicitly stated or except the case where it is conceivable that they are apparently excluded in principle. The same goes for the numerical value and the range described above.

Further, components having the same function are denoted by the same reference numerals in principle in all drawings for explaining the embodiments, and the repetitive explanation thereof is omitted. Incidentally, hatching is sometimes used even in a plan view so as to make the drawings easy to see.

First Embodiment

<New Finding Discovered by Present Inventors>

For example, as compared with Si (silicon), SiC (silicon carbide) has a higher dielectric breakdown field strength and a larger band gap, and therefore, the thickness of a drift layer (an epitaxial layer) for ensuring the voltage resistance can be decreased. As a result, the thickness of the drift layer having a low impurity concentration is decreased, and therefore, the on-resistance can be decreased. On the other hand, it is known that in the SiC power MOSFET, the channel mobility is decreased. Therefore, if the channel mobility can be increased in the SiC power MOSFET, the on-resistance can be further decreased.

Here, at present, in the SiC power MOSFET, as a cause of the decrease in the channel mobility, the surface roughness of a channel interface, the effect of phonon scattering, or the effect of Coulomb scattering based on a fixed charge has been considered as a main factor. However, as a result of intensive studies to find the cause of the decrease in the channel mobility made by the present inventors, it was found that rather than the above-described main factor, the injection efficiency and injection rate of a carrier (electron) from an edge portion of a source region to a channel region has a great influence. That is, the present inventors discovered a new finding different from the conventional finding as to the mechanism causing the observed decrease in the mobility.

On the basis of this new finding, it is considered that if the injection efficient and injection rate of a carrier (electron) from an edge portion of a source region to a channel region can be improved, the on-resistance can be decreased.

Accordingly, on the basis of this new finding, first, from the viewpoint of improving the injection efficient of a carrier (electron), it is contemplated to increase the carrier density in the source region. In general, the source region is formed from a diffusion layer which is a semiconductor region. In this case, it is considered that by increasing a conductive impurity to be doped into the semiconductor region, the carrier density in, the source region can be increased. However, by merely doping the conductive impurity into the semiconductor region, the carrier density cannot be increased, and in general, for increasing the carrier density in the semiconductor region, it is necessary to activate the conductive impurity doped into the semiconductor region. Specifically, for activating the conductive impurity doped into the semiconductor region, a high-temperature heat treatment (annealing) is required. In particular, in the case of a semiconductor material composed of SiC, for sufficiently activating the doped conductive impurity, annealing at a high temperature (about 2000° C.) is required (see "Low-loss 1.2 kV vertical power SiC MOSFET which operates at high temperature" Hiroshi Kono, et al., Toshiba Review, Vol, 65, No. 1, pp. 23-26, 2010).

There is a problem that this temperature exceeds the melting point of silicon oxide ($SiO_2$) or a metal material such as aluminum (Al) to be used as a mask material, an electrode material, or an insulating layer in a process for producing an LSI (Large-Scale Integration) in a silicon semiconductor. That is, in the case where a semiconductor material composed of SiC is used, when a high-temperature heat treatment (annealing) for activating a conductive impurity is performed after forming a MOSFET, since the temperature exceeds the heat resistance of constituent materials (e.g., a gate electrode material and a gate insulating film material) constituting the MOSFET, these constituent materials are destroyed.

Therefore, in the MOSFET using SiC as a semiconductor material, in the case where the source region is constituted by a semiconductor region composed of SiC doped with a conductive impurity, it is necessary to form a source region before forming a gate insulating film or a gate electrode constituting the MOSFET, and thereafter perform a heat treatment for activation. Due to this, there is a problem that a common process for producing a MOSFET cannot be used, and the process for producing a MOSFET using SiC as a semiconductor material is limited. In particular, in a common process for producing a MOSFET, after a gate electrode is formed, a source region is formed in a self-aligned manner with this gate electrode. However, in the MOSFET using SiC as a semiconductor material, in the case where the source region is formed from a semiconductor region, there is a problem that the source region cannot be formed in a self-aligned manner. Therefore, from the viewpoint of the production process, it becomes difficult to adopt a configuration in which the conductive impurity to be doped into the source region is increased for improving the injection efficient of a carrier (electron) from an edge portion of the source region to the channel region.

In view of this, in the MOSFET using SiC as a semiconductor material, for increasing the carrier density in the source region, it is necessary to use another method. Here, for example, it is contemplated that the source region is not constituted by a semiconductor material, but is constituted by a metal material. It is because a countless number of free electrons are present in the metal material, and by using this metal material in the source region, the carrier density in the source region can be increased. That is, by constituting the source region of the MOSFET by a metal material instead of a semiconductor region, even if a high-temperature activation treatment for forming the source region is not performed, the carrier density in the source region can be increased.

For example, in a silicon semiconductor, as the structure of a MOSFET which does not require a high-temperature activation treatment, a Schottky barrier MOSFET (hereinafter referred to as "SBT") in which a metal material is used as it is as a source region and a drain region is known (see NPL 1) In the structure of this SBT, the source region and the drain region are constituted by the metal material, and therefore, it is not necessary to dope a conductive impurity. Due to this, there is an advantage that the resistance of the source region and the drain region can be decreased without performing a heat treatment (annealing) for activating the conductive impurity.

However, in general, as compared with a pn junction, a Schottky barrier junction has poor voltage resistance against a reverse bias and has properties such that the leakage current is large. This prevents the use of an SBT as a common MOSFET. Hereinafter, this point will be described.

FIG. 1 is a plan view showing a structure of an SBT in the related art. As shown in FIG. 1, in an SBT in the related art, a rectangular gate electrode G is formed in the center, and a gate plug GPLG is formed such that it is electrically connected to this gate electrode G. On both sides of the gate electrode G, a source region SR or a drain region DR is formed. In FIG. 1, on the left side of the gate electrode G, a source region SR is formed, and on the right side of the gate electrode G, a drain region DR is formed. On the source region SR, a plug PLG1 which is electrically connected to the source region SR is formed, and on the drain region DR, a plug PLG1 which is electrically connected to the drain region DR is formed.

Figure 2:
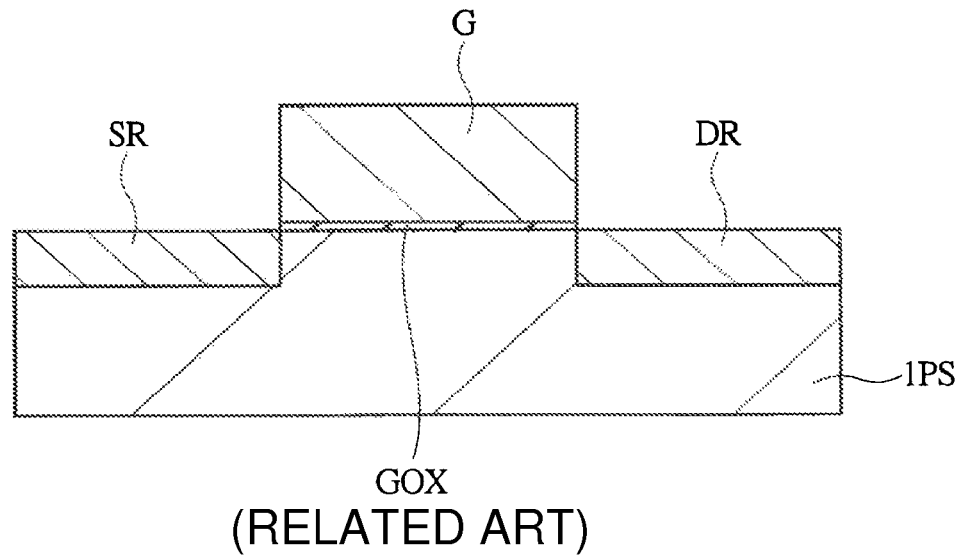
FIG. 2 is a cross-sectional view taken along the line A-A of FIG. 1.

FIG. 2 is a cross-sectional view taken along the line A-A of FIG. 1. As shown in FIG. 2, in the SBT in the related art, for example, on the surface of a semiconductor substrate 1PS doped with a p-type impurity such as boron (B), a gate insulating film. GOX composed of for example, a silicon oxide film is formed. On the gate insulating film GOX, the gate electrode G composed of, for example, a polysilicon film is formed. In the semiconductor substrate 1PS, a region immediately below the gate insulating film GOX becomes a channel forming region, and the source region SR and the drain region DR are formed in regions sandwiching this channel forming region in the semiconductor substrate 1PS.

In the SBT in the related art configured in this manner, the source region SR and the drain region DR are constituted by a metal material, and a Schottky barrier junction is formed between the semiconductor substrate 1PS and the source region SR, and between the semiconductor substrate 1PS and the drain region DR.

The SBT shown in FIGS. 1 and 2 is of a type to be used in a so-called logic integrated circuit (LSI). In a common operation of this SBT, the SBT is turned on by applying a gate voltage which is equal to or higher than the threshold voltage to the gate electrode G in a state where the potential of the drain region DR is brought to a positive voltage with respect to the potential of the source region SR. Specifically, in this case, a channel is formed in the semiconductor substrate 1PS immediately below the gate electrode G, and by this channel, a channel current flows between the source region SR and the drain region DR where a potential difference exists.

On the other hand, when the SBT is turned off, a voltage which is equal to or lower than the threshold voltage is applied to the gate electrode G in a state where a potential difference exists between the source region SR and the drain region DR. In this case, the channel formed in a region immediately below the gate electrode G disappears, and therefore, a channel current does not flow between the source region SR and the drain region DR, and the SBT is turned off.

Also when the SBT is turned off, in the drain region DR, a positive potential still remains applied to the semiconductor substrate 1PS. Therefore, a reverse bias is applied to the Schottky barrier junction formed in the junction region between the drain region DR constituted by a metal material and the semiconductor substrate 1PS constituted by a p-type semiconductor region. At this time, as compared with the pn junction, the Schottky barrier junction has poor voltage resistance against the reverse bias, and a large leakage current flows. Therefore, a large leakage current flows between the drain region DR and the semiconductor substrate 1PS in the SBT. In other words, in the SBT, even when the SBT is turned off, a non-negligible leakage current is present, and therefore, power consumption is increased.

Further, in consideration of the industrial production of the SBT, due to an effect of the formation of a natural oxide film (a silicon oxide film) sandwiched by the semiconductor material and the metal material, etc., it is difficult to form an ideal Schottky barrier junction interface state. In this case, a Schottky barrier height is actually very high, and a large resistance in forward bias with respect to a forward current is generated. Due to this, the SBT in the related art has a problem that favorable on/off characteristics of a transistor cannot be obtained.

Figure 3:
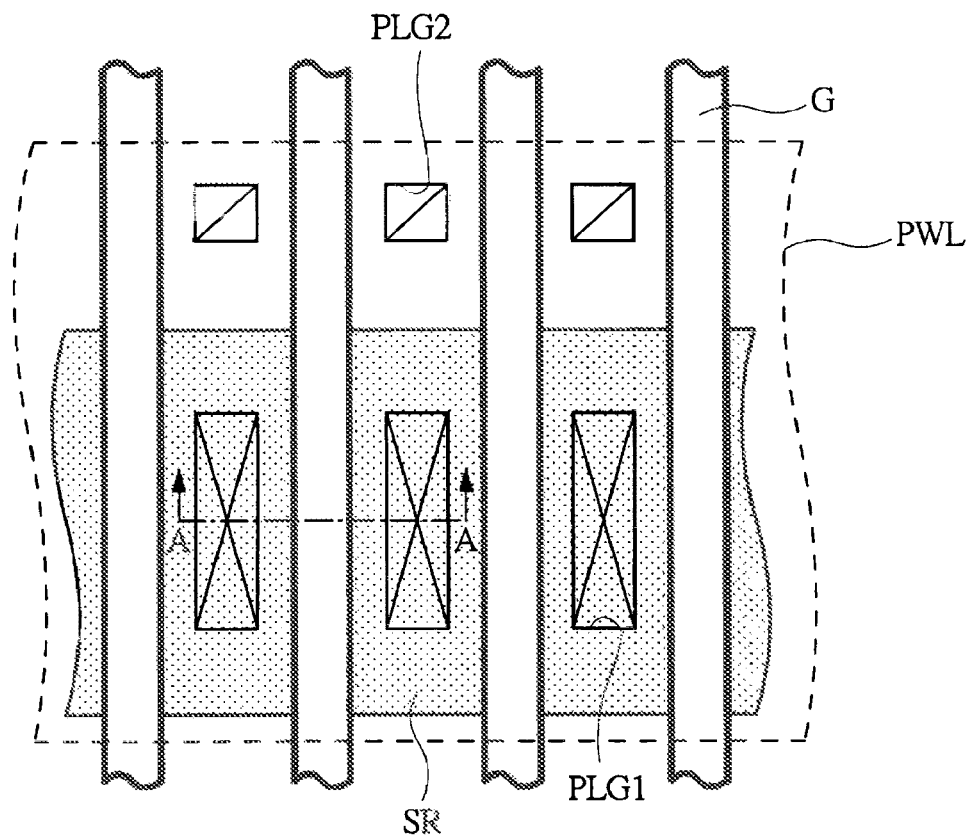
FIG. 3 is a plan view showing a structure of a vertical MOSFET to which an SBT is applied.
Figure 4:
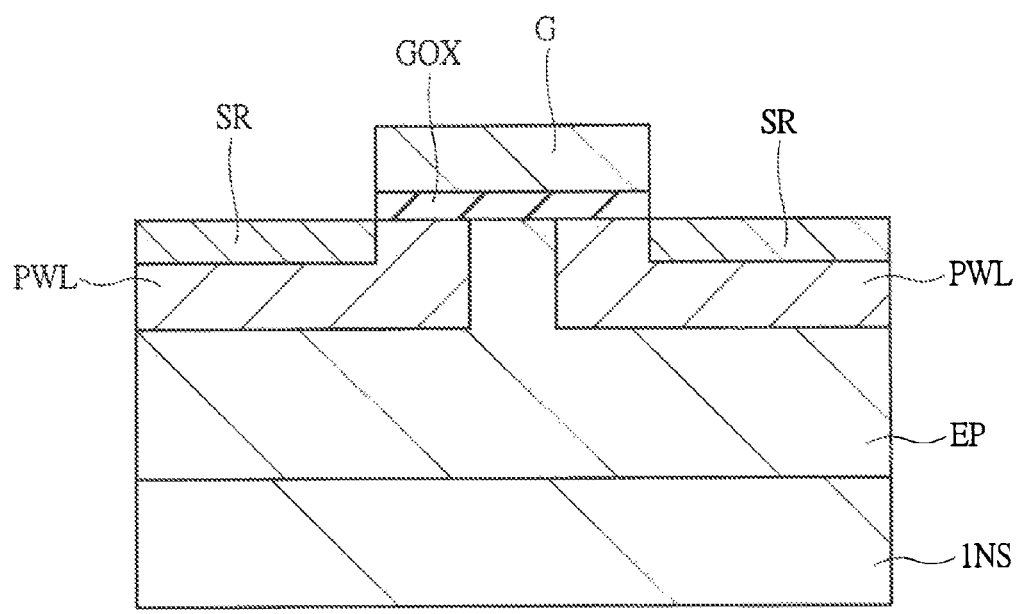
FIG. 4 is a cross-sectional view taken along the line A-A of FIG. 3.

Meanwhile, in the case of a power transistor called "power MOSFET" instead of a logic MOSFET, this is no longer the case. For example, in the power transistor, it is necessary to drive a large current, and therefore, a so-called vertical MOSFET as shown in FIGS. 3 and 4 has been widely used. Hereinafter, advantages of applying the SBT to this vertical MOSFET will be described.

FIG. 3 is a plan view showing a structure of a vertical MOSFET to which the SBT is applied. As shown in FIG. 3, a plurality of gate electrodes G extend in the vertical direction in the drawing, and a source region SR is formed between the adjacent gate electrodes G. On each source region SR, a plug PLG1 electrically connected to the source region SR is formed. On the other hand, a plug PLG2 electrically connected to a p-type well region is formed outside the source region SR.

FIG. 4 is a cross-sectional view taken along the line A-A of FIG. 3. As shown in FIG. 4, the vertical MOSFET has a semiconductor substrate 1NS doped with an n-type impurity such as phosphorus (P) or arsenic (As), and on the semiconductor substrate 1NS, an epitaxial layer EP (a drift layer) constituted by an n-type semiconductor region is formed. This semiconductor substrate 1NS functions as a drain region, however, in a broad sense, it can be said that the epitaxial layer EP (drift layer) also constitutes a part of the drain region. The concentration of the n-type impurity doped into the epitaxial layer EP is lower than the concentration of the n-type impurity doped into the semiconductor substrate 1NS. This epitaxial layer EP is provided for ensuring the voltage resistance when the vertical MOSFET is turned off.

Subsequently, a p-type well PWL composed of a p-type semiconductor region is formed so as to be in contact with the epitaxial layer EP, and the source region SR is formed so as to be included in the surface region of the p-type well PWL. In the transverse direction of FIG. 4, a surface region sandwiched by the source region SR and the epitaxial layer EP becomes a channel forming region, and on a surface region of this channel forming region and the epitaxial layer EP, a gate insulating film GOX composed of, for example, a silicon oxide film is formed. Further, on the gate insulating film GOX, a gate electrode G composed of, for example, a polysilicon film is formed.

Next, the operation of the vertical MOSFET configured in this manner will be described. First, the operation for turning on the vertical MOSFET will be described. The vertical MOSFET is turned on by applying a gate voltage which is equal to or higher than the threshold voltage to the gate electrode G in a state where the potential of the drain region (semiconductor substrate 1NS) is brought to a positive voltage with respect to the potential of the source region SR between the source region SR and the drain region (semiconductor substrate 1NS) in FIG. 4. Specifically, in this case, a channel is formed on the surface of the p-type well PWL immediately below the gate electrode G, and by this channel, a channel current flows between the source region SR and the drain region DR where a potential difference exists. More specifically, a current flows in the longitudinal direction along the epitaxial layer EP from the drain region (semiconductor substrate 1NS), and thereafter, a current flows in the transverse direction toward the source region SR from the channel formed on the surface of the p-type well PWL. In this manner, in the vertical MOSFET, by applying an electric field effect from the gate electrode G to the surface of the p-type well PWL, the channel is formed on the surface of the p-type well PWL and a turn-on operation is performed.

On the other hand, when the vertical MOSFET is turned off, a voltage which is equal to or lower than the threshold voltage is applied to the gate electrode G in a state where a potential difference is generated between the source region SR and the drain region (semiconductor substrate 1NS). In this case, the channel formed on the p-type well PWL in a region immediately below the gate electrode G disappears, and therefore, a channel current does not flow between the source region SR and the drain region (semiconductor substrate 1NS), and the vertical MOSFET is turned off. At this time, in the vertical MOSFET, a reverse bias is applied to a pn junction formed in a boundary region between the p-type well PWL and the epitaxial layer ER.

Here, in the SBT shown in FIGS. 1 and 2, the source region SR and the drain region DR are formed symmetrically with respect to the gate electrode G on the same side of the semiconductor substrate 1PS, and therefore, in the case where the source region SR is constituted by a metal material, not only the source region SR, but also the drain region DR is inevitably constituted by a metal material. Due to this, in the SBT shown in FIGS. 1 and 2, when the SBT is turned off, a reverse bias is applied to a Schottky barrier junction formed between the drain region DR and the semiconductor substrate 1PS, and as a result, there is a problem that a leakage current when the SBT is turned off is problematic.

On the other hand, in the vertical MOSFET, the source region SR and the drain region (semiconductor substrate 1NS) are not formed symmetrically, and the entire semiconductor substrate 1NS functions as the drain region, and therefore, even in the case where the source region SR is constituted by a metal material, the drain region does not have a problem in resistance. Accordingly, it is not necessary to constitute the drain region by a metal material. As a result, when the vertical MOSFET is turned off, a reverse bias is applied to a pn junction formed in a boundary region between the epitaxial layer EP and the p-type well PWL. As compared with a Schottky barrier junction, the pn junction has a small leakage current when a reverse bias is applied, and therefore, the vertical MOSFET has an advantage that a leakage current when a reverse bias is applied is not problematic.

That is, in the vertical MOSFET, only the source region SR can be selectively replaced with a metal material. At this time, a Schottky barrier junction is formed in a boundary region between the source region SR constituted by a metal material and the p-type well PWL, however, the source region SR and the p-type well PWL operate at the same potential, and therefore, a reverse bias is not applied to the Schottky barrier junction. Therefore, in the vertical MOSFET in which only the source region SR is constituted by a metal material, a problem that a leakage current is increased by a reverse bias does not become evident. Accordingly, in the case of utilizing a vertical MOSFET as an SBT, by selectively constituting only the source region SR by a metal material, the carrier density in the source region SR can be increased while suppressing a leakage current by a reverse bias. This advantage is attributed to the arrangement of the source region and the drain region in the vertical MOSFET, and therefore, it is apparent that this advantage is effective not only in a vertical MOSFET using Si as a material, but also in a vertical MOSFET using SiC as a material.

As a consequence, it is found that in a power transistor using SiC, by adopting a vertical MOSFET and constituting a source region SR by a metal material, while ensuring an advantage that a leakage current due to a reverse bias can be suppressed, the carrier density in the source region can be increased without performing a high-temperature activation treatment for forming the source region. Hereinafter, a technical idea of the first embodiment of the invention conceived on the basis of the new finding discovered by the present inventors will be described.

<Structure of Semiconductor Device According to First Embodiment>

The technical idea of the first embodiment of the invention is conceived on the basis of the new finding discovered by the present inventors that if the injection efficiency and injection rate of a carrier (electron) from an edge portion of a source region to a channel region can be improved, the channel mobility can be improved. Hereinafter, first, a structure of the semiconductor device according to this first embodiment will be described.

Figure 5:
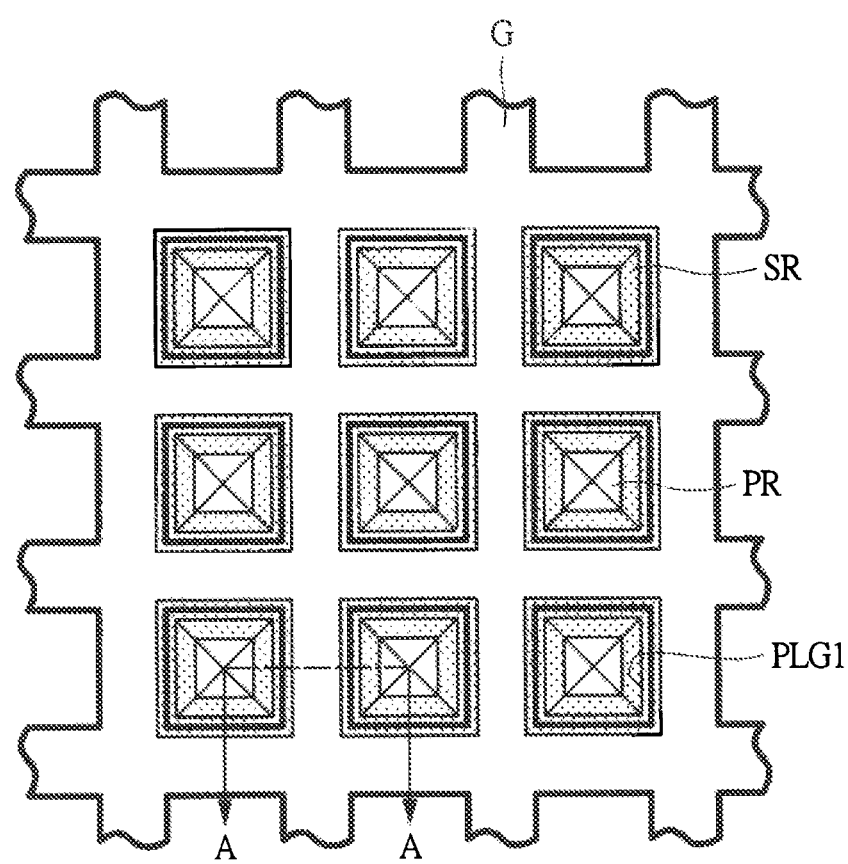
FIG. 5 is a plan view showing an example of a layout structure of a semiconductor device according to a first embodiment.

FIG. 5 is a plan view showing an example of a layout structure of a SiC power MOSFET (a semiconductor device) according to this first embodiment. In FIG. 5, basic cells, which constitute the SiC power MOSFET, are arranged in the form of an array (matrix). In FIG. 5, gate electrodes G are arranged in the form of a lattice, and a source region SR is formed in each of the basic cells surrounded by the gate electrodes G, and a $p^+$-type semiconductor region PR is formed inside the source region SR. Further, a plug PLG1, which is electrically connected to both of the source region SR and the $p^+$-type semiconductor region PR, is formed.

Here, in FIG. 5, the gate electrodes G are arranged orthogonally to the longitudinal and transverse directions. In this case, in each of the intersectional regions of the gate electrodes G extending in the longitudinal and transverse directions, a gate length of the gate electrode G is formed on a diagonal line, and the gate length is longer than the other regions. As a result, a contact area between a gate insulating film and an epitaxial layer to which a drain voltage is applied is increased, which may deteriorate the voltage resistance of the gate insulating film.

Figure 6:
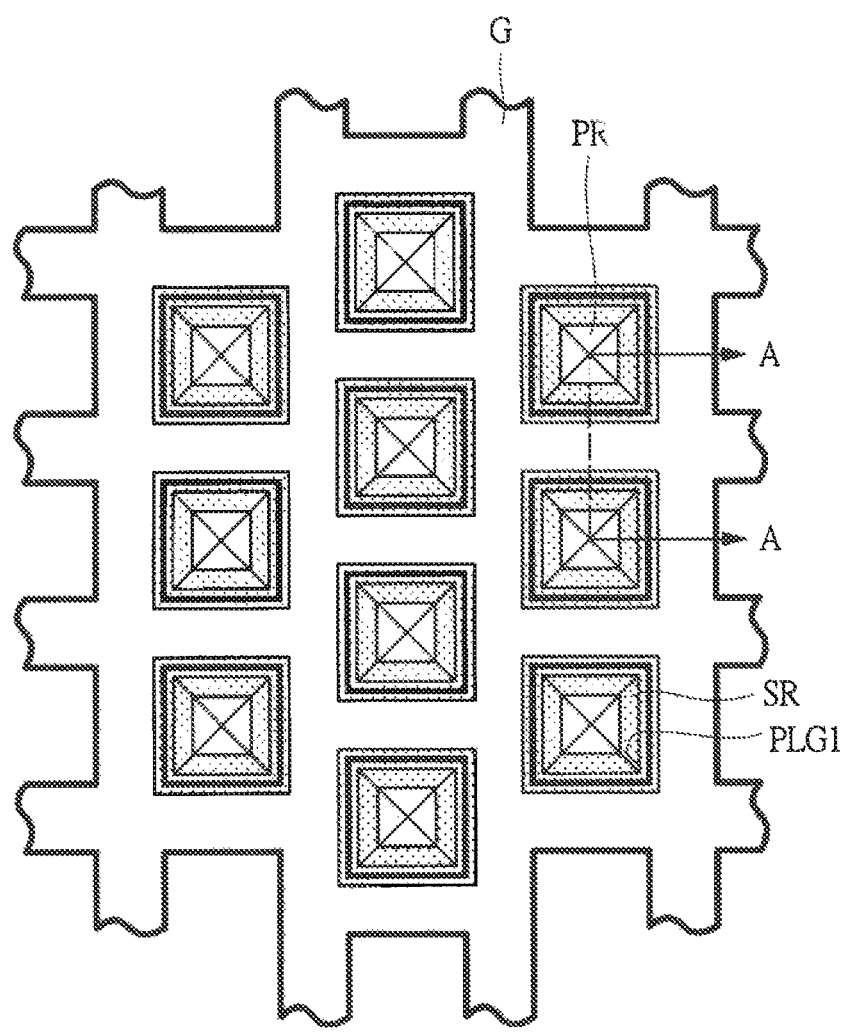
FIG. 6 is a plan view showing an example of another layout structure of the semiconductor device according to the first embodiment.

In view of this, for example, a layout structure of a SiC power MOSFET as shown in FIG. 6 can also be adopted. FIG. 6 is a plan view showing an example of another layout structure of the SiC power MOSFET according to this first embodiment. As shown in FIG. 6, for example, by shifting the arrangement positions of the gate electrodes G on every other line, a diagonal long region is hardly formed, and therefore, the formation of a region in which the gate length of the gate electrode G is long can be prevented. In this manner, according to the layout structure shown in FIG. 6, in the SiC power MOSFET formed on the semiconductor substrate, the voltage resistance of the gate insulating film can be improved. Accordingly, in the SiC power MOSFET according to this first embodiment, from the viewpoint of improving the voltage resistance of the gate insulating film, the layout structure shown in FIG. 6 is useful, however, in this first embodiment, not only in the layout structure shown in FIG. 6, but also in the layout structure shown in FIG. 5, the technical idea of this first embodiment can be realized. That is, the technical idea of this first embodiment can be applied independent of the layout structure.

Figure 7:
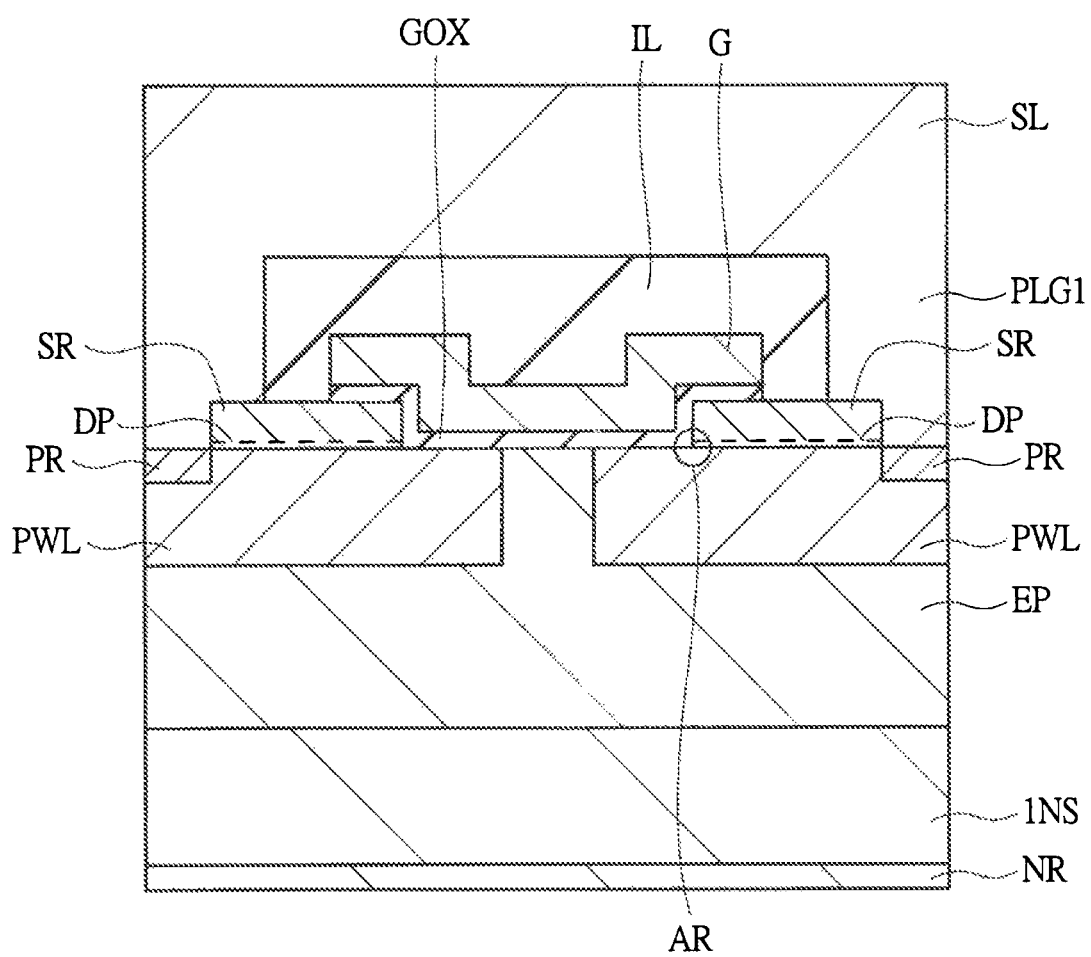
FIG. 7 is a view showing a cross-sectional structure of the semiconductor device according to the first embodiment, and is a cross-sectional view taken along the line A-A of FIG. 5 or a cross-sectional view taken along the line A-A of FIG. 6.

FIG. 7 is a view showing a cross-sectional structure of the SiC power MOSFET according to this first embodiment, and shows a cross-sectional view taken along the line A-A of FIG. 5 or a cross-sectional view taken along the line A-A of FIG. 6. As shown in FIG. 7, the SiC power MOSFET according to this first embodiment has, for example, a semiconductor substrate 1NS composed of SiC doped with an n-type impurity such as nitrogen (N), and on the back surface (lower surface) of this semiconductor substrate 1NS, an $n^+$-type semiconductor region NR doped with an n-type impurity at a higher concentration than that of the n-type impurity doped into the semiconductor substrate 1NS is formed.

On the other hand, on the front surface (upper surface) of the semiconductor substrate 1NS, an epitaxial layer EP is formed. This epitaxial layer EP is also called a drift layer and is constituted by SiC doped with an n-type impurity such as nitrogen (N). The impurity concentration of the n-type impurity doped into the epitaxial layer EP is lower than that of the n-type impurity doped into the semiconductor substrate 1NS, and the epitaxial layer EP is formed for ensuring the voltage resistance of the SiC power MOSFET. However, in this first embodiment, since the epitaxial layer EP is formed from SiC (silicon carbide) having a higher dielectric breakdown field strength and a larger band gap than Si (silicon), in the SiC power MOSFET, the thickness of the drift layer (epitaxial layer EP) for ensuring the voltage resistance can be decreased. As a result, according to the SiC power MOSFET of this first embodiment, the thickness of the drift layer (epitaxial layer EP) having a low impurity concentration is decreased, and therefore, the on-resistance can be decreased. That is, according to the SiC power MOSFET of this first embodiment, as compared with a Si power MOSFET in which Si (silicon) is used as a semiconductor material, both of the improvement of the voltage resistance and the reduction of the on-resistance can be achieved, and therefore, a power MOSFET having high performance can be provided.

By the above-described semiconductor substrate 1NS, $n^+$-type semiconductor region NR, and epitaxial layer EP, a drain region of the SiC power MOSFET can be formed, however, in this specification, particularly, the semiconductor substrate 1NS is called a drain region of the SiC power MOSFET. Incidentally, the actual SiC power MOSFET, on the lower surface of the $n^+$-type semiconductor region NR, for example, a drain electrode composed of a metal material is formed, however, in the SiC power MOSFET shown in FIG. 7, illustration of this drain electrode is omitted.

Subsequently, on the epitaxial layer EP, for example, a p-type well PWL composed of SiC doped with a p-type impurity such as aluminum (Al) is formed so as to be in contact with the epitaxial layer EP, and on this p-type well PWL, a source region SR is formed. The source region SR is constituted by a metal material, and is formed from, for example, a metal silicide represented by nickel silicide. This point is a first characteristic feature of this first embodiment.

Then, a $p^+$-type semiconductor region PR is formed on a surface region of the p-type well PWL in contact with the source region SR in plan view in FIG. 7. This $p^+$-type semiconductor region PR is doped with a p-type impurity at a higher concentration than that of the p-type impurity doped into the p-type well PWL. This $p^+$-type semiconductor region PR is provided for stably supplying a potential to the p-type well PWL.

On the transverse direction of the FIG. 7, a surface region of the p-type well PWL sandwiched by the source region SR and the epitaxial layer EP becomes a channel forming region, and a gate insulating film GOX composed of, for example, a silicon oxide film is formed so as to cover the surface region of this channel forming region and the epitaxial layer EP and a part of the source region SR. Further, on the gate insulating film GOX, a gate electrode G composed of, for example, a polysilicon film is formed.

Here, a second characteristic feature of this first embodiment resides in that, for example, a conductive impurity DP is segregated at an interface between the source region SR constituted by nickel silicide and the p-type well PWL. That is, in this first embodiment, as indicated by a dashed line in FIG. 7, a conductive impurity DP is doped at an interface between the source region SR and the p-type well PWL. More specifically, a conductive impurity DP is doped at an interface between the source region SR and the channel forming region in the p-type well PWL. At this time, the conductive impurity DP may be either an n-type impurity or a p-type impurity.

Subsequently, as shown in FIG. 7, an interlayer insulating film IL composed of, for example, a silicon oxide film is formed so as to cover the gate electrode G and a part of the source region SR, and in this interlayer insulating film IL, an opening is formed. From this opening, a part of the source region SR and the p$^+$-type semiconductor region PR are exposed, and in the opening, for example, an aluminum film is buried, whereby a plug PLG1 is formed. This plug PLG1 is electrically connected to the source region SR and the p$^+$-type semiconductor region PR, and from a source line SL formed on the plug PLG1, a reference potential (a GND potential) is supplied to both of the source region SR and the p$^+$-type semiconductor region PR through the plug PLG1. At this time, the p$^+$-type semiconductor region PR having a high impurity concentration is formed so as to be in ohmic contact with the plug PLG1 composed of an aluminum film, and therefore, to the p-type well PWL, a reference potential is stably supplied from the source line SL through the plug PLG1 and the p$^+$-type semiconductor region PR. The SiC power MOSFET according to this first embodiment is configured as described above.

<Characteristic Features of First Embodiment>

Next, the characteristic features of this first embodiment will be described in detail. Specifically, the first characteristic feature of this first embodiment resides in that as the power transistor in which SiC is used as a semiconductor material, a so-called vertical MOSFET is adopted, and the source region is constituted by a metal material (for example, a metal silicide represented by nickel silicide). Due to this, according to the SiC power MOSFET of this first embodiment, while ensuring an advantage that a leakage current due to a reverse bias can be suppressed, the carrier density in the source region can be increased without performing a high-temperature activation treatment for forming the source region. That is, from the viewpoint of improving the injection efficient of a carrier (electron) from an edge portion of the source region to the channel region, the first characteristic feature of this first embodiment is adopted. According to this first characteristic feature, the carrier density in the source region can be increased, and as a result, the channel mobility can be improved.

That is, in this first embodiment, from the viewpoint of increasing the carrier density in the source region SR, the source region SR is constituted by a metal material. Therefore, since it is only necessary to increase the carrier density in the source region SR, for example, the constituent material of the source region SR is not limited to the above-described metal silicide represented by nickel silicide, and may be other metal material. Here, the advantage of using a metal material in the source region SR is that the carrier density can be increased without performing a high-temperature activation treatment, which is required for a semiconductor region.

That is, in the case where the source region SR is constituted by a semiconductor region, for increasing the carrier density in the semiconductor region, it is necessary to activate a conductive impurity doped into the semiconductor region. Specifically, for activating a conductive impurity doped into the semiconductor region, a high-temperature heat treatment (annealing) is required. In particular, in the case of a semiconductor material composed of SiC, for sufficiently activating a doped conductive impurity, annealing at a high temperature (about 2000° C.) is required. In this case, when a high-temperature heat treatment (annealing) for activating the conductive impurity is performed after forming a power MOSFET, since the temperature exceeds the heat resistance of constituent materials (e.g., a gate electrode material and a gate insulating film material) constituting the power MOSFET, it becomes difficult to use an already established production technique for the power MOSFET. On the other hand, in the case where a metal material is used as the source region SR as described in this first embodiment, it is not necessary to perform an activation treatment for forming the source region SR, and therefore, the above-described problem does not become evident.

On the other hand, in the case where the source region SR is constituted by a metal material, in a MOSFET to be used in a so-called logic system, the drain region is also constituted by a metal material, and as a result, a Schottky barrier junction is formed not only in a boundary region between the source region SR and the semiconductor substrate, but also in a boundary region between the drain region and the semiconductor substrate. The Schottky barrier junction has poor voltage resistance against a reverse bias as compared with a pn junction, and a large leakage current flows. Therefore, when the MOSFET is turned off, a reverse bias is applied between the drain region and the semiconductor substrate, as a result, when the MOSFET is turned off, a large leakage current flows in a Schottky barrier junction formed between the drain region and the semiconductor substrate. That is, in the logic MOSFET, in the case where the source region SR and the drain region are constituted from a metal material, even when the MOSFET is turned off, a non-negligible leakage current is present, and therefore, power consumption is increased.

On the other hand, in a power transistor called a power MOSFET, it is necessary to drive a large current, and therefore, a so-called vertical MOSFET is widely used. In this vertical MOSFET, only a source region SR can be selectively constituted by a metal material. In this case, since the drain region is constituted by a semiconductor region (a semiconductor substrate), when the vertical MOSFET is turned off, a reverse bias is applied to a pn junction formed in a boundary region between an epitaxial layer EP and a p-type well PWL. In the pn junction, as compared with the Schottky barrier junction, a leakage current when a reverse bias is applied is small. Therefore, in the vertical MOSFET, it is possible to obtain an advantage that a leakage current when a reverse bias is applied is not evident.

To be more specific, in the vertical MOSFET adopted as the SiC power MOSFET in this first embodiment, only the source region SR can be selectively replaced with a metal material. At this time, a Schottky barrier junction is formed in a boundary region between the source region SR constituted by a metal material and the p-type well PWL, however, the source region SR and the p-type well PWL operate at the same potential, and therefore, a reverse bias is not applied to the Schottky barrier junction. Accordingly, in the vertical MOSFET in which only the source region SR is constituted by a metal material, a problem that a leakage current is increased by a reverse bias does not become evident.

In view of this, as this first embodiment, in the case of utilizing the vertical MOSFET as a SiC power MOSFET, by selectively constituting only the source region SR by a metal material, the carrier density in the source region SR can be increased while suppressing a leakage current due to a reverse bias.

Next, the second characteristic feature of this first embodiment is a structure focusing on the point of improving the injection efficiency and injection rate of a carrier (electron) from an edge portion of the source region SR to the channel region. That is, on the basis of the above-described first characteristic feature, in the case where the source region SR is constituted by a metal material, a Schottky barrier junction is formed between the source region SR and the channel forming region. In this Schottky barrier junction, a Schottky barrier is formed in a boundary region between the source region SR and the channel forming region. When a forward bias is applied to the Schottky barrier junction, if the Schottky barrier height is decreased, it becomes easy for electrons to move from the source region SR to the channel forming region. That is, if the Schottky barrier height is decreased, the height of the potential barrier over which electrons should cross is decreased by the decrement of the Schottky barrier height, and as a result, it becomes easy for electron to move from the source region SR to the channel forming region. This means that if the Schottky barrier height can be decreased, the injection efficiency of a carrier (electron) from an edge portion of the source region SR to the channel region can be improved. Moreover, if the Schottky barrier height can be decreased, energy consumed when a carrier (electron) crosses over the Schottky barrier is also decreased, and therefore, the injection rate of a carrier (electron) to be injected into the channel forming region can be also increased. In this manner, it is found that the structure in which the Schottky barrier height is decreased is useful from the viewpoint of improving the channel mobility by improving the injection efficiency and injection rate of a carrier (electron) from an edge portion of the source region SR to the channel region.

Accordingly, the second characteristic feature of this first embodiment resides in that for realizing the structure in which the Schottky barrier height is decreased, a conductive impurity DP is doped at an interface between the source region SR constituted by a metal material and the channel forming region constituted by a semiconductor material. In other words, the second characteristic feature of this first embodiment resides in that a conductive impurity DP is segregated at an interface between the source region SR and the channel forming region. This is because when a conductive impurity DP is present at a high concentration at an interface between a metal material and a semiconductor material, the Schottky barrier height of the Schottky barrier junction can be decreased (see, for example, A. Kinoshita, et al. "Solution for High-Performance Schottky-Source/Drain MOSFETs", Tech. Dig. 2004 Sympo. on VLSI Tech. pp 168-169.). In view of this, in this first embodiment, by segregating a conductive impurity DP between the source region SR and the channel forming region, a Schottky barrier junction having a low Schottky barrier height can be obtained in an edge portion of the source region SR. As a result, according to this first embodiment, since the Schottky barrier height is decreased, the potential can be easily modulated (decreased) due to the electric field effect of the gate electrode G, and therefore, the injection efficiency of a carrier (electron) can be improved and also a SiC power MOSFET whose controllability by a gate electrode G is high can be realized.

<Method for Producing Semiconductor Device According to First Embodiment>

Figure 8:
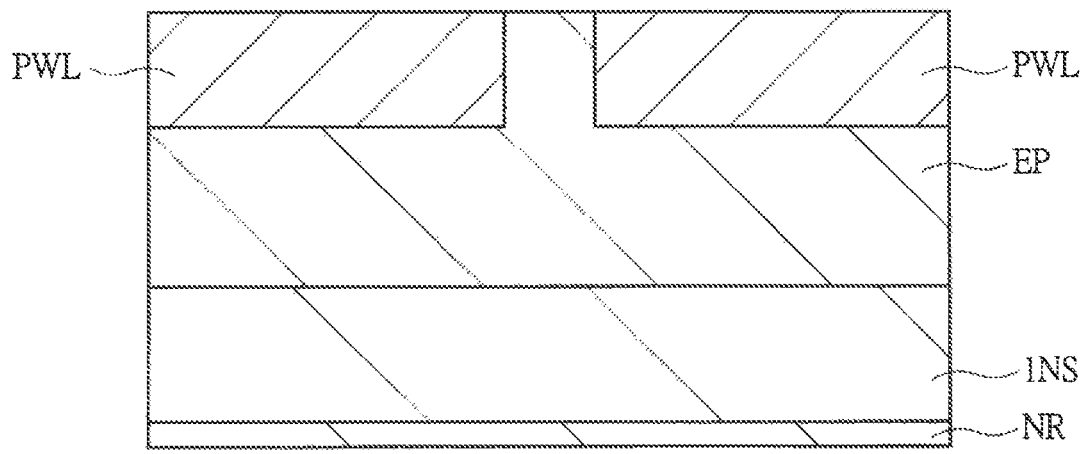
FIG. 8 is a cross-sectional view showing a process for producing the semiconductor device according to the first embodiment.

The semiconductor device according to this first embodiment is configured as described above, and hereinafter, a production method thereof will be described with reference to the accompanying drawings. First, as shown in FIG. 8, on a semiconductor substrate 1NS composed of SiC containing an n-type impurity at a high concentration, an epitaxial layer (a drift layer) EP containing an n-type impurity at a low concentration is formed, and on this epitaxial layer EP, a p-type well layer PWL in which aluminum (Al) serving as a p-type impurity is ion-implanted is formed.

Specifically, a semiconductor substrate 1NS composed of a 4H-SiC substrate is prepared. Into this semiconductor substrate 1NS, an n-type impurity is implanted. As this n-type impurity, for example, nitrogen (N) can be used, and the impurity concentration is in a range from $1 \times 10^{18}$ to $1 \times 10^{21}$ cm$^{-3}$. Further, the surface of the semiconductor substrate 1NS may be either a Si surface or a C surface (carbon surface).

On the semiconductor substrate 1NS configured in this manner, the epitaxial layer EP into which the n-type impurity is implanted at a lower concentration than the semiconductor substrate 1NS is formed. This epitaxial layer EP is formed by, for example, an epitaxial growth method. The impurity concentration in this epitaxial layer EP depends on the device rating of a semiconductor element (a semiconductor device) to be produced, but is, for example, in a range from $1 \times 10^{14}$ to $1 \times 10^{17}$ cm$^{-3}$.

Subsequently, an n$^+$-type semiconductor region NR is formed on the back surface of the semiconductor substrate 1NS. The impurity concentration in this n$^+$-type semiconductor region NR is desirably high, and for example, in a range from $1 \times 10^{19}$ to $1 \times 10^{21}$ cm$^{-3}$.

Subsequently, by using a photolithographic technique and an ion implantation method, a p-type well PWL is formed on the epitaxial layer EP. The depth of the p-type well PWL is as deep as 0.5 to 2.0 μm, and in general, an energy for implanting a p-type impurity is several hundreds keV to several MeV. Therefore, as a mask, a hard mask made of silicon oxide (SiO$_2$) is generally used. Specifically, first, by a plasma CVD (Chemical Vapor Deposition) method, on the epitaxial layer EP, a silicon oxide film is deposited to a thickness of about 1 to 3 μm. Subsequently, on the silicon oxide film, a resist film is applied, and the resist film is patterned by being exposed to light and developed. The patterning of the resist film is performed such that the resist film is not left in a region where the p-type well PWL is formed. Thereafter, the silicon oxide film is processed by dry etching using the patterned resist film as a mask, and then, the patterned resist film is removed. In this manner, a hard mask composed of the patterned silicon oxide film can be formed on the epitaxial layer EP.

At this time, in a terminal end portion of the semiconductor device forming region, a region where the p-type well PWL is not formed is covered with a hard mask, and a high-voltage structure is formed in the terminal end portion. For example, as a high-voltage structure, an FLR (Floating field Limited Ring) structure can be used. However, as the high-voltage structure of the terminal end portion, another structure may be adopted. For example, as another high-voltage structure, a JTE (Junction Termination Extension) structure is exemplified.

Subsequently, by performing ion implantation using the patterned silicon oxide film as a mask, the p-type well PWL is formed in the epitaxial layer EP. The p-type impurity is, for example, aluminum (Al) and the impurity concentration of the p-type impurity is, for example, in a range from $1 \times 10^{16}$ to $1 \times 10^{19}$ cm$^{-3}$.

Figure 9:
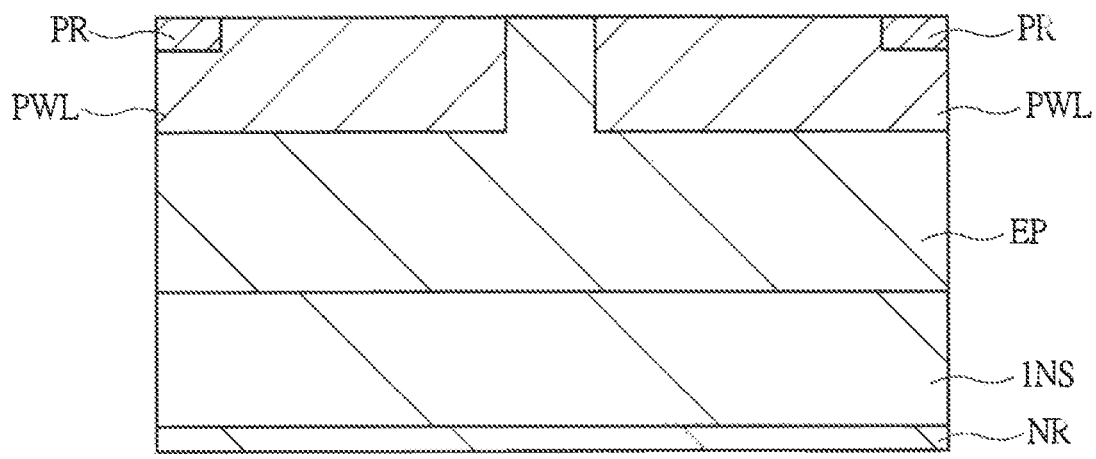
FIG. 9 is a cross-sectional view showing the process for producing the semiconductor device continued from FIG. 8.

Subsequently, as shown in FIG. 9, a p$^+$-type semiconductor region PR is formed on a part of the surface of the p-type well PWL. This p$^+$-type semiconductor region PR is provided for fixing the potential of the p-type well PWL. Specifically, the p$^+$-type semiconductor region PR is formed as follows. First, a silicon oxide film is formed on the epitaxial layer EP having the p-type well PWL formed thereon. Then, a resist film is applied on the silicon oxide film, and the resist film is patterned by being exposed to light and developed. The patterning of the resist film is performed such that the resist film is not left in a region where the p$^+$-type semiconductor region PR is formed. Thereafter, the silicon oxide film is processed by etching using the patterned resist film as a mask, and then, the patterned resist film is removed. In this manner, a hard mask composed of the patterned silicon oxide film can be formed on the p-type well PWL. Subsequently, by performing ion implantation using the patterned silicon oxide film as a mask, the p$^+$-type semiconductor region PR is formed on a part of the surface of the p-type well PWL. The p-type impurity is, for example, aluminum (Al), and the impurity concentration of the p-type impurity is, for example, in a range from $1 \times 10^{19}$ to $1 \times 10^{21}$ cm$^{-3}$.

Subsequently, a guard ring (not shown) is formed around the semiconductor device forming region. First, a silicon oxide film is formed on the epitaxial layer EP having the p-type well PWL formed thereon. Then, a resist film is applied on the silicon oxide film, and the resist film is patterned by being exposed to light and developed. The patterning of the resist film is performed such that the resist film is not left in a region where the guard ring is formed. Thereafter, the silicon oxide film is processed by etching using the patterned resist film as a mask, and then, the patterned resist film is removed. In this manner, a hard mask composed of the patterned silicon oxide film can be formed. Subsequently, by performing ion implantation using the patterned silicon oxide film as a mask, the guard ring is formed. The impurity to be implanted into the guard ring is, for example, nitrogen (N), and the impurity concentration of nitrogen (N) is, for example, in a range from $1 \times 10^{19}$ to $1 \times 10^{21}$ cm$^{-3}$. At this time, the impurity profile can be designed so as to obtain a desired device rating.

Figure 10:
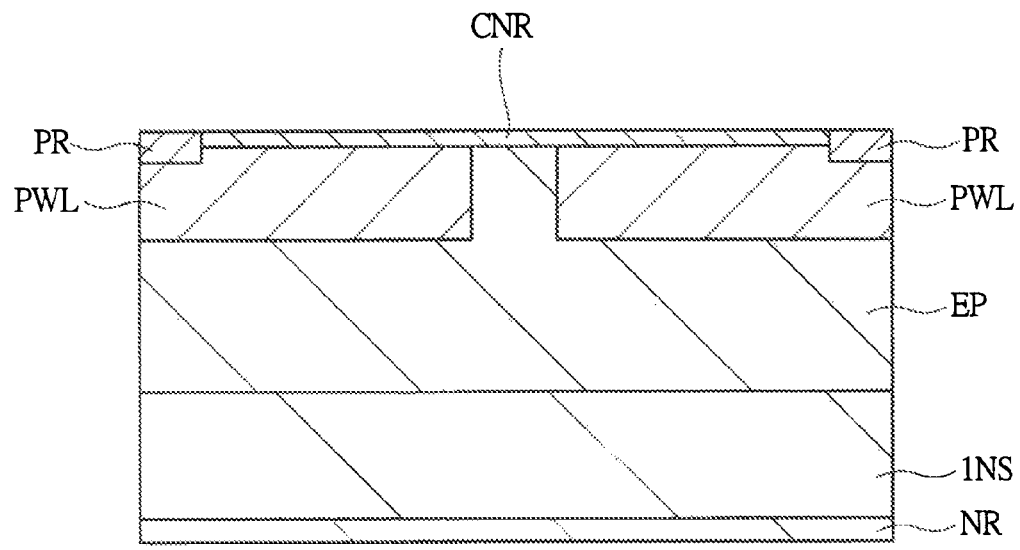
FIG. 10 is a cross-sectional view showing the process for producing the semiconductor device continued from FIG. 9.

Here, by ion-implanting an impurity into the surface of the channel forming region, the threshold voltage of the MOSFET can be set to a predetermined value. For example, in the case where a large current is obtained by decreasing the threshold voltage, an n-type impurity (e.g., nitrogen) is doped into the surface of the p-type well PWL. In this case, when the n-type impurity is implanted in a larger amount than the p-type impurity contained in the p-type well PWL, in the vicinity of the surface of the p-type well PWL, the p-type well PWL is converted into n-type. This state is shown in FIG. 10. As shown in FIG. 10, it is found that an n-type semiconductor region CNR is formed on the surface of the p-type well PWL. In FIG. 10, the n-type semiconductor region CNR is a region doped with an n-type impurity. This structure is a so-called "buried channel" structure, and is one of the methods for setting the threshold voltage from the viewpoint of device operation. Therefore, in this first embodiment, a structure in which the n-type semiconductor region CNR is not formed is described as a representative example, however, the technical idea according to this first embodiment can be applied also to the "buried channel" structure.

A substrate obtained by forming an n$^+$-type semiconductor region NR on the back surface of a semiconductor substrate 1NS, and forming an epitaxial layer EP, a p-type well PWL, and a p$^+$-type semiconductor region PR on the front surface of the semiconductor substrate 1NS in this manner is referred to as a SiC epitaxial substrate.

After doping all the impurities as described above, the doped impurities are activated. A heat treatment for activating the impurity doped into SiC requires a temperature of 1500° C. or higher. However, if the temperature exceeds 1500° C., a Si atom (a silicon atom) or the doped impurity is released from the surface of the SiC epitaxial substrate. Further, the flatness of the surface of the SiC epitaxial substrate is deteriorated. Therefore, for example, after the front and back surfaces of the SiC epitaxial substrate are covered with a carbon film, the heat treatment for activating the impurities is performed. This carbon film is deposited on the front and back surfaces of the SiC epitaxial substrate to a thickness of about 30 nm by a plasma CVD method. Then, a heat treatment at a high temperature of 1500° C. or higher is performed for several minutes for the SiC epitaxial substrate covered with this carbon film. After performing this heat treatment, the carbon film used for covering is removed by an oxygen plasma treatment. In this first embodiment, since the heat treatment for activating the impurities is performed before forming the gate insulating film or the gate electrode on the SiC epitaxial substrate, even if the heat treatment at 1500° C. or higher is performed, the gate insulating film or the gate electrode can be prevented from being destroyed.

Figure 11:
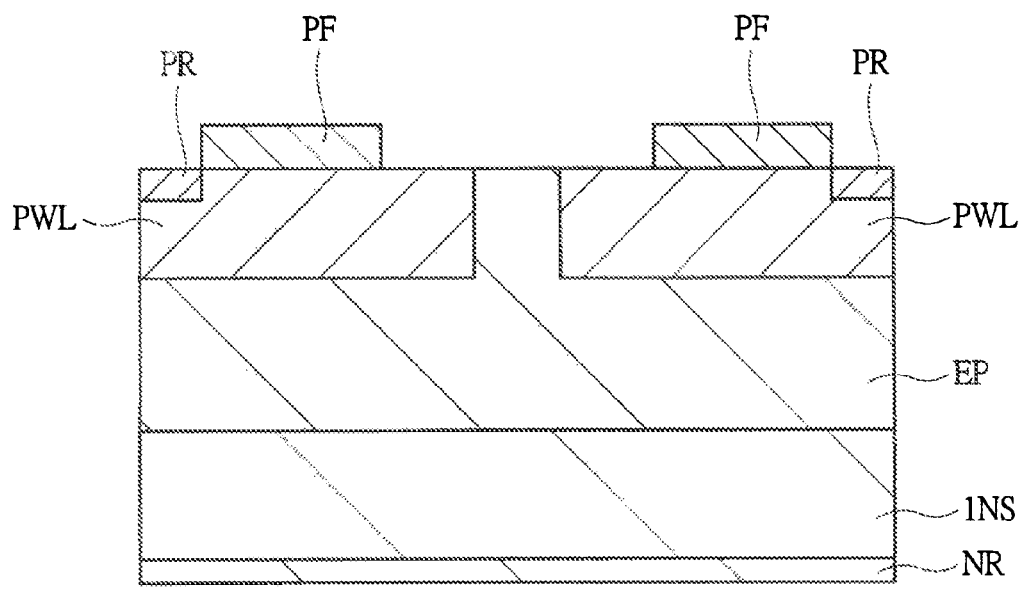
FIG. 11 is a cross-sectional view showing the process for producing the semiconductor device continued from FIG. 10.

Subsequently, as shown in FIG. 11, a polysilicon film (a polycrystalline silicon film) PF containing an n-type impurity such as phosphorus (S) or arsenic (As) at a high concentration is formed on the SiC epitaxial substrate. This polysilicon film PF can be formed by using, for example, a CVD method, and the thickness thereof is, for example, about 50 nm. Thereafter, by using a photolithographic technique and an etching technique, the polysilicon film PF is patterned. The patterning of the polysilicon film PF is performed such that the polysilicon film PF is left in a region where a source region is formed. At this time, in the dry etching of the polysilicon film PF, the selection ratio relative to SiC constituting the SiC epitaxial substrate serving as a base can be applied, and therefore, by stopping etching when the surface of the SiC epitaxial substrate is exposed, the polysilicon film PF can be accurately processed.

Incidentally, this first embodiment is configured such that the polysilicon film PF doped with an n-type impurity at a high concentration is deposited, but is not limited thereto, and for example, as the method for doping an impurity into the polysilicon film PF, another method may be used. For example, the embodiment may be configured such that a polysilicon film PF undoped with a conductive impurity is deposited by a CVD method, and thereafter, a conductive impurity is doped into a predetermined region of the polysilicon film PF by using an ion-implantation method. At this time, in the case where arsenic is used as the conductive impurity to be ion-implanted, since arsenic is heavier than phosphorus, arsenic can be accurately doped into the polysilicon film PF.

Further, the impurity to be doped into the polysilicon film PF is not limited to an n-type impurity, and may be a p-type impurity. Further, in place of the method of depositing the polysilicon film PF on the SiC epitaxial substrate by a CVD method, by allowing silicon to epitaxially grow on the surface of the SiC epitaxial substrate, a silicon layer may be formed on the SiC epitaxial substrate. In this case, the silicon layer has single crystallinity, however, in this first embodiment, this silicon layer is not used as a channel forming region, and therefore has an advantage that poor crystallinity is not problematic.

Figure 12:
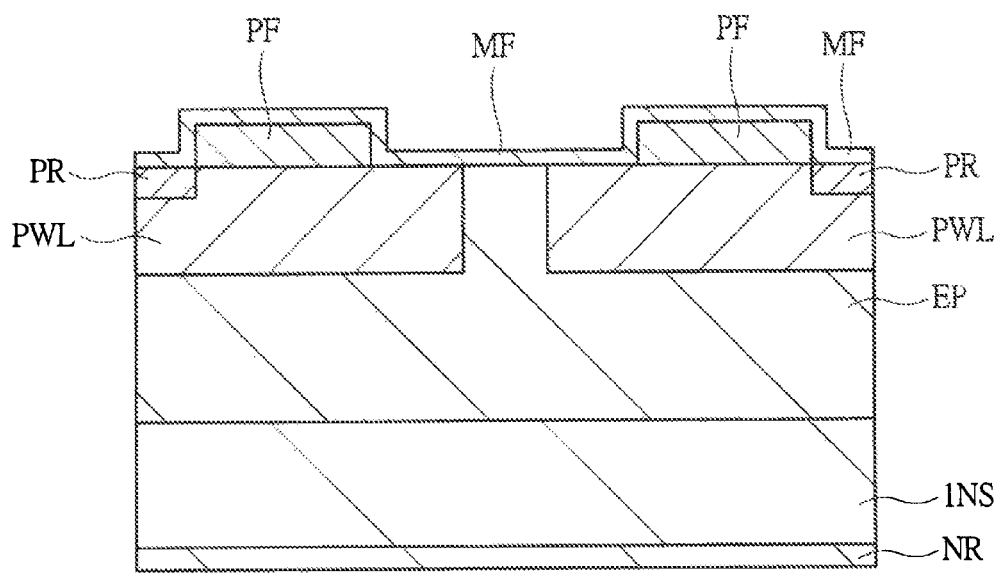
FIG. 12 is a cross-sectional view showing the process for producing the semiconductor device continued from FIG. 11.

Subsequently, as shown in FIG. 12, a metal film MF is formed on the SiC epitaxial substrate having the patterned polysilicon film PF formed thereon. Specifically, as the metal film MF, for example, a nickel film can be formed, and the thickness thereof is, for example, about 50 nm. This nickel film can be formed by using, for example, a sputtering method.

Figure 13:
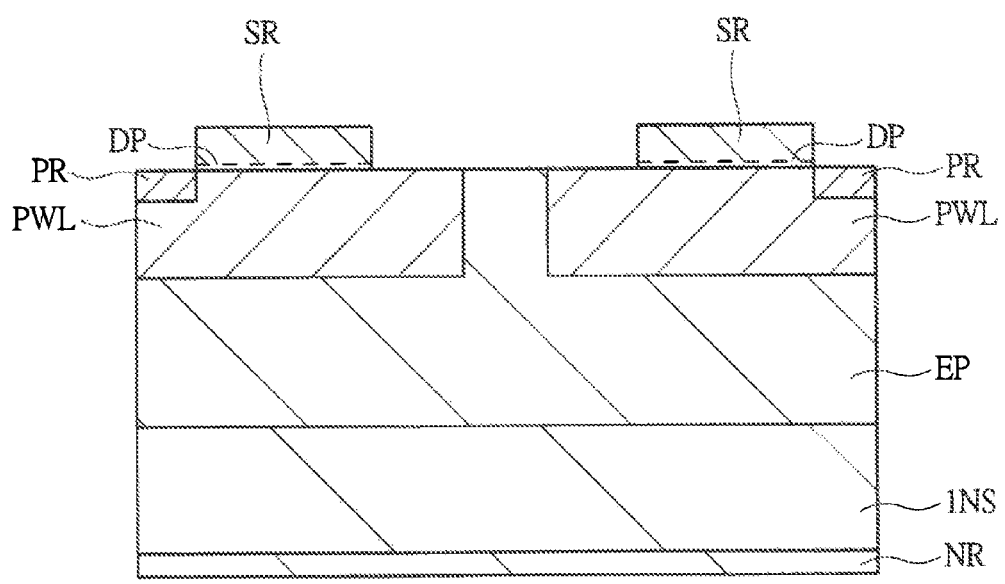
FIG. 13 is a cross-sectional view showing the process for producing the semiconductor device continued from FIG. 12.

Subsequently, as shown in FIG. 13, a silicidation reaction between the polysilicon film PF and the nickel film is performed by applying a heat treatment at 320° C. for 60 seconds as first annealing (a first heat treatment) to the SiC epitaxial substrate. In such a low-temperature treatment, the nickel film does not react with SiC, and therefore, only the polysilicon film PF and the nickel film can be reacted with each other. Then, the unreacted nickel film is removed with a mixed liquid of sulfuric acid and hydrogen peroxide, and thereafter as second annealing (a second heat treatment), a heat treatment at 500° C. for 30 seconds is performed. By doing this, a nickel silicide film formed on the surface of the polysilicon film PF is allowed to grow, whereby the polysilicon film PF is completely replaced with a nickel silicide film. In such a low-temperature treatment, the nickel film does not react with SiC, and therefore, a silicidation reaction with the polysilicon film PF proceeds, and when the reaction reaches the SiC epitaxial substrate, the silicidation reaction stops. During this silicidation reaction, the conductive impurity DP (phosphorus) doped into the polysilicon film PF moves and aggregates at an interface with the SiC epitaxial substrate. In this manner, according to this first embodiment, between the nickel silicide film and the SiC epitaxial substrate, an interface at which the conductive impurity DP (phosphorus) is segregated in a self-aligned manner can be provided. As described above, according to this first embodiment, a source region SR composed of a nickel silicide film can be formed, and also the conductive impurity DP (phosphorus) can be segregated at an interface between the source region SR and the p-type well PWL.

In this manner, this first embodiment focuses on the fact that the temperature of the silicidation reaction between the polysilicon film PF and the nickel film is lower than the temperature of the silicidation reaction between SiC and the nickel film. That is, by performing the heat treatment (annealing) at a temperature at which the silicidation reaction between the polysilicon film PF and the nickel film proceeds but the silicidation reaction between SiC and the nickel film does not proceed, only the polysilicon film PF can be replaced with the nickel silicide film. In other words, in this first embodiment, the polysilicon film PF is formed in a region which will become a source region, and only the polysilicon film PF can be replaced with the nickel silicide film by utilizing a difference between this polysilicon film PF and SiC in temperature of the silicidation reaction. Accordingly, in this first embodiment, the source region SR composed of a nickel silicide film can be accurately formed in a self-aligned manner.

Further, since the silicidation reaction of the polysilicon film PF proceeds from the upper portion to the lower portion of the polysilicon film PF, the conductive impurity DP (phosphorus) doped into the polysilicon film PF is swept to the lower portion of the polysilicon film PF as the silicidation reaction proceeds, and aggregates at an interface between the polysilicon film PF and the p-type well PWL in the end. As a result, according to this first embodiment, by performing the heat treatment at a temperature at which only the silicidation reaction of the polysilicon film PF is caused, the source region SR composed of a nickel silicide film can be accurately formed in a self-aligned manner, and also as a result of the silicidation reaction, the conductive impurity DP (phosphorus) can be segregated automatically at an interface between the source region SR and the p-type well PWL.

Here, in plan view (in the transverse direction of FIG. 13), a surface region of the p-type well PWL sandwiched by the source region SR and the surface of the epitaxial layer EP becomes a channel forming region.

Figure 14:
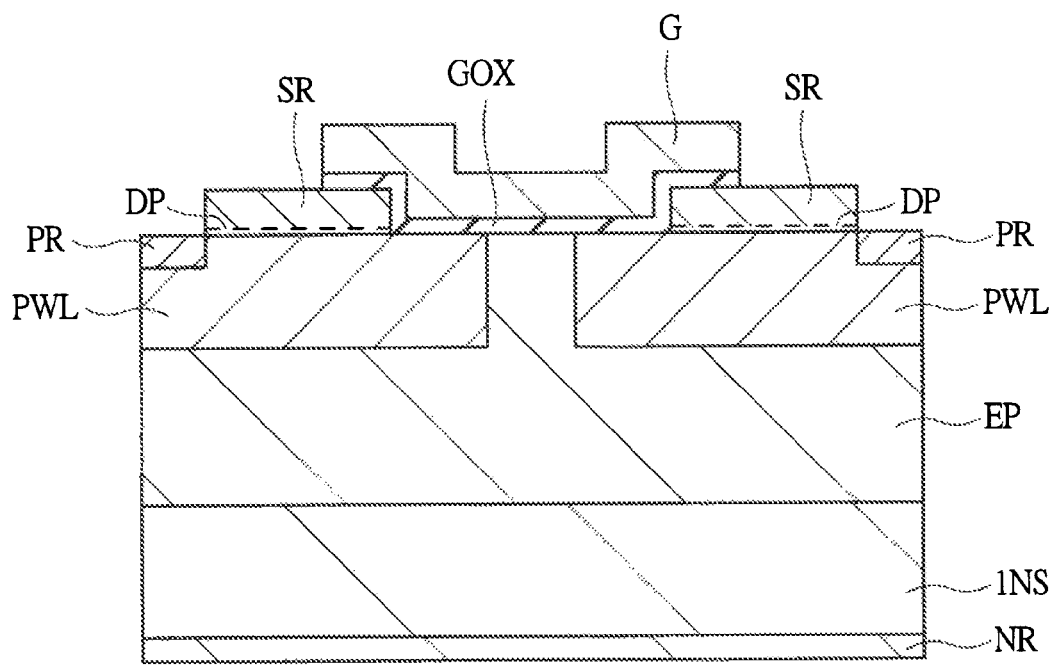
FIG. 14 is a cross-sectional view showing the process for producing the semiconductor device continued from FIG. 13.

Subsequently, as shown in FIG. 14, a gate insulating film GOX is formed on the surface of the SiC epitaxial substrate having the source region SR formed thereon. This gate insulating film GOX is formed from, for example, a silicon oxide film, and can be formed by using, for example, a CVD method. The thickness of the gate insulating film GOX is, for example about 50 nm. Thereafter, on the gate insulating film GOX, a polysilicon film containing phosphorus at a high concentration is formed. This polysilicon film can be formed by using, for example, a CVD method, and the thickness thereof is, for example, about 300 nm.

Thereafter, by using a photolithographic technique and an etching technique, the polysilicon film is patterned to form a gate electrode G. As shown in FIG. 14, this gate electrode G is formed such that the gate electrode G extends from the space between the source regions SR to the above the source regions SR. At this time, when the gate electrode G is formed by processing the polysilicon film, the gate insulating film GOX is exposed in a region where the polysilicon film is removed. This exposed gate insulating film GOX may be removed or may be left as such at this stage since it can also be processed simultaneously with an interlayer insulating film made of the same material as the gate insulating film in a later step.

Incidentally, in this first embodiment, an example in which a silicon oxide film is used as the gate insulating film GOX and a polysilicon film is used as the gate electrode G is described, however, the source region SR composed of a metal material (a nickel silicide film) and the semiconductor region in the SiC epitaxial substrate have already been formed and a large heat load is not applied, and therefore, it is also possible to form the gate insulating film GOX from a high-dielectric constant film having a higher dielectric constant than the silicon oxide film, and to form the gate electrode G from a metal material film made of aluminum (Al) or the like.

Figure 15:
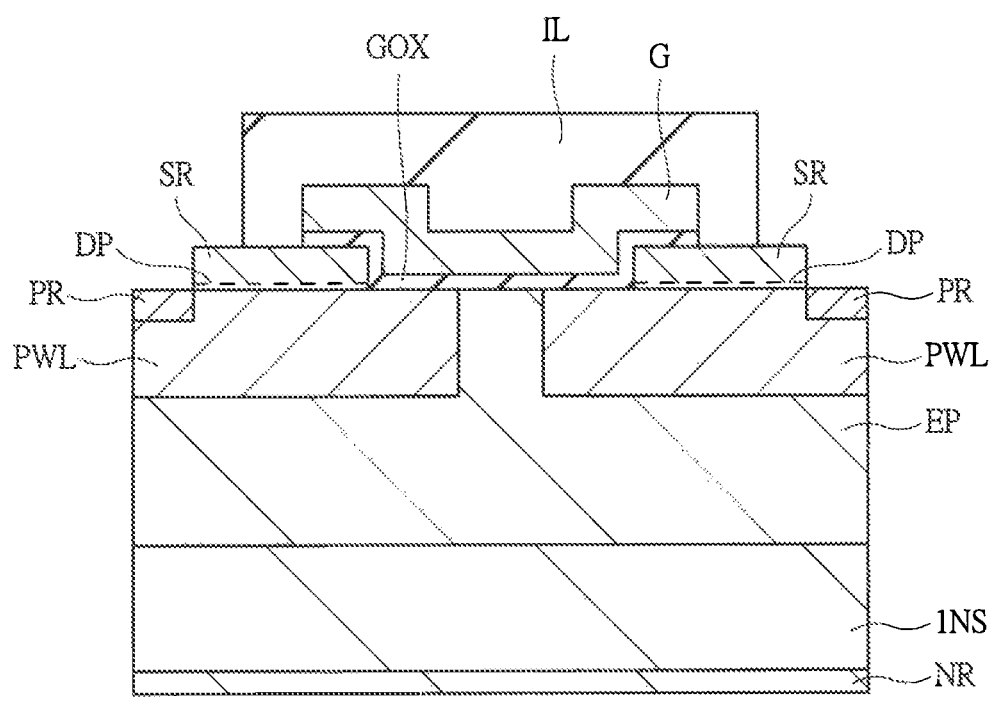
FIG. 15 is a cross-sectional view showing the process for producing the semiconductor device continued from FIG. 14.

Subsequently, as shown in FIG. 15, an interlayer insulating film IL is formed on the SiC epitaxial substrate having the source region SR and the gate electrode G formed thereon. This interlayer insulating film IL is formed so as to cover the source region SR and the gate electrode G, and is formed from, for example, a silicon oxide film. Thereafter, as shown in FIG. 15, by using a photolithographic technique and an etching technique, an opening (a contact hole) is formed in the interlayer insulating film IL. This opening is formed so as to expose a part of the source region SR and the p$^+$-type semiconductor region PR. Although not shown in FIG. 15, it is also possible to form an opening reaching the gate electrode G.

Subsequently, as shown in FIG. 7, for example, by using a sputtering method, an aluminum film is formed on the interlayer insulating film IL having the opening therein. The thickness of this aluminum film is, for example, 2 μm. At this time, by burying the aluminum film in the opening formed in the interlayer insulating film IL, a plug PLG1 is formed. Then, by using a photolithographic technique and an etching technique, this aluminum film is patterned, whereby a source line SL electrically connected to this plug PLG1 is formed.

The steps after this line forming step can be performed by a known semiconductor process, and the SiC power MOSFET (semiconductor device) according to this first embodiment can be produced in the end. According to the method for producing a semiconductor device according to this first embodiment, an advantage that the SiC power MOSFET according to this first embodiment can be produced by a relatively simple process is obtained.

In the SiC power MOSFET according to this first embodiment, as shown in FIG. 7, a drain voltage is supplied to the epitaxial layer EP from the drain electrode (not shown) provided on the back surface of the semiconductor substrate 1NS through the $n^+$-type semiconductor region NR and the semiconductor substrate 1NS. Then, due to the electric field effect of the gate electrode G through the gate insulating film GOX, the formation of a channel in the surface region of the p-type well PWL between the epitaxial layer EP and the source region SR is controlled, whereby the on/off operation of the SiC power MOSFET is performed.

At this time, according to this first embodiment, since the source region SR can be formed from a nickel silicide film which is a metal material film, a source region SR having a low resistance and a large carrier density can be formed. Further, according to this first embodiment, the conductive impurity DP (phosphorus) can be segregated at an interface between the source region SR and the p-type well PWL including the channel forming region, and therefore, the height of the Schottky barrier formed between the source region SR and the channel forming region (p-type well PWL) can be decreased. Accordingly, the injection efficiency and injection rate of a carrier (electron) from an edge portion of the source region to the channel region can be improved, and as a result, the channel mobility in the SiC power MOSFET can be improved.

Second Embodiment

In the above-described first embodiment, an example in which the source region SR is formed such that it does not overlap the $p^+$-type semiconductor region PR formed on a part of the surface of the p-type well PWL in plan view is described, however, in the second embodiment of the invention, an example in which the source region SR is also formed in a region covering the $p^+$-type semiconductor region PR will be described.

<Structure of Semiconductor Device According to Second Embodiment>

Figure 16:
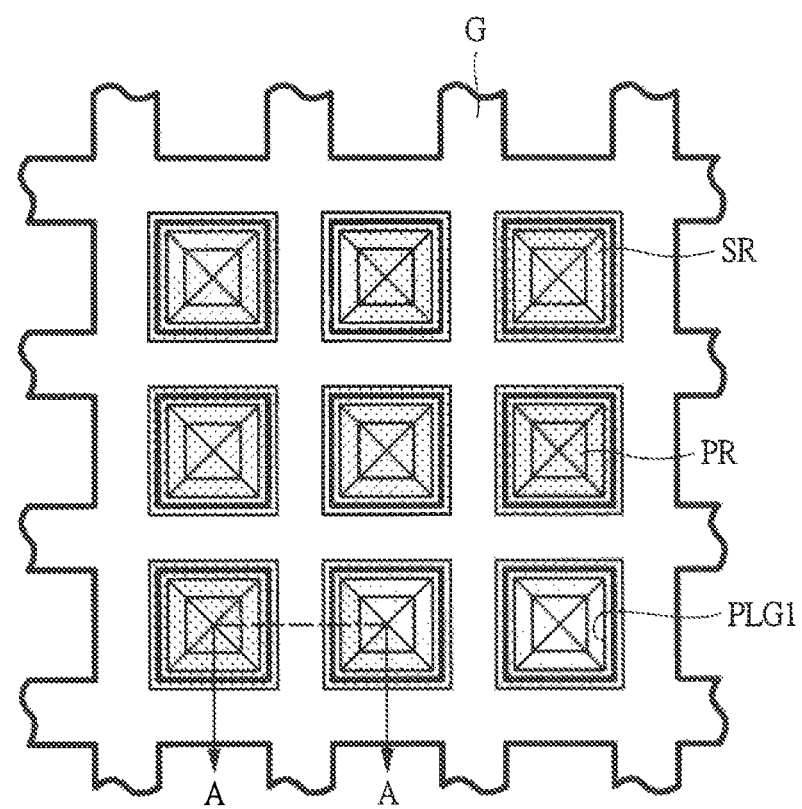
FIG. 16 is a plan view showing an example of a layout structure of the semiconductor device according to a second embodiment.

FIG. 16 is a plan view showing a structure of a SiC power MOSFET according to a second embodiment of the invention. As shown in FIG. 16, basic cells constituting the SiC power MOSFET are arranged in the form of an array (matrix) in FIG. 16, gate electrodes G are arranged in the form of a lattice, and a source region SR is formed in each of the basic cells surrounded by the gate electrodes G.

Here, in the above-described first embodiment, as shown in FIG. 5, the $p^+$-type semiconductor region PR is formed inside the source region SR in plan view. On the other hand, in this second embodiment, as shown in FIG. 16, a source region SR is formed in the entire area inside the basic cell surrounded by the gate electrodes G in plan view. Further, in this second embodiment, a $p^+$-type semiconductor region PR is formed on a lower layer overlapping the source region SR in plan view. That is, a different point is that in the above-described first embodiment, the source region SR and the $p^+$-type semiconductor region PR are formed such that they do not overlap each other in plan view, however, in this second embodiment, the source region SR is formed also in a region covering the $p^+$-type semiconductor region PR. Further, in this second embodiment, as shown in FIG. 16, the source region SR and a plug PLG1 are electrically connected to each other.

Figure 17:
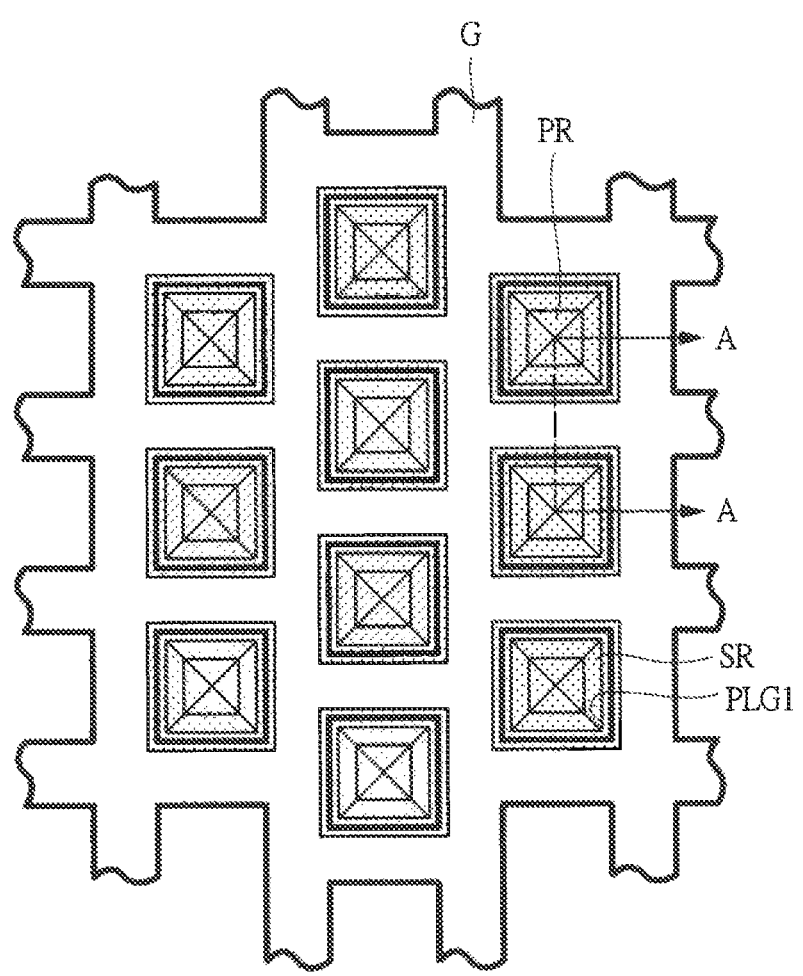
FIG. 17 is a plan view showing an example of another layout structure of the semiconductor device according to the second embodiment.

Also the SiC power MOSFET according to this second embodiment is not limited to the layout structure shown in FIG. 16, and for example, also in a layout structure in which a diagonal long region is hardly formed by shifting the arrangement positions of the gate electrodes G on every other line as shown in FIG. 17, the technical idea of this second embodiment can be realized. That is, also the technical idea of this second embodiment can be applied independent of the layout structure in the same manner as in the above-described first embodiment.

Figure 18:
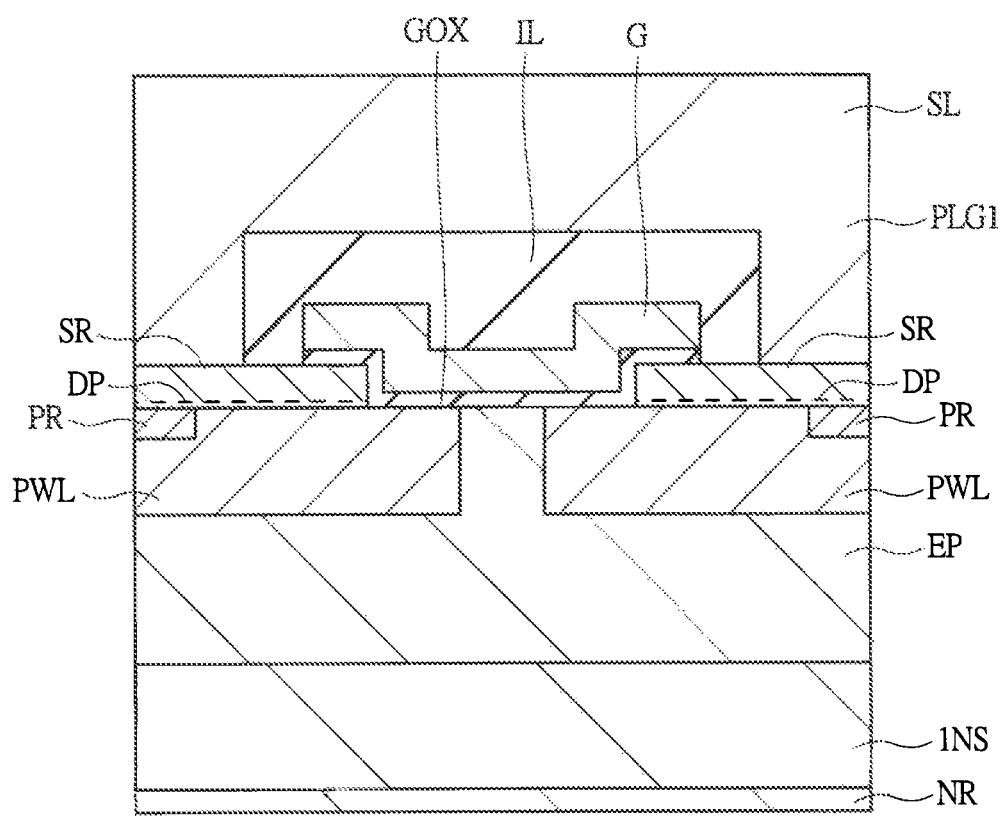
FIG. 18 is a view showing a cross-sectional structure of the semiconductor device according to the second embodiment, and is a cross-sectional view taken along the line A-A of FIG. 16 or a cross-sectional view taken along the line A-A of FIG. 17.

FIG. 18 is a view showing a cross-sectional structure of the SiC power MOSFET according to this second embodiment, and shows a cross-sectional view taken along the line A-A of FIG. 16 or a cross-sectional view taken along the line A-A of FIG. 17. In FIG. 18, the structure of the SiC power MOSFET according to this second embodiment is substantially the same as that of the SiC power MOSFET according to the above-described first embodiment shown in FIG. 7, and therefore, a different point will be mainly described.

As shown in FIG. 18, in the SiC power MOSFET according to this second embodiment, the source region SR is formed so as to cover the $p^+$-type semiconductor region PR formed on a part of the surface of the p-type well PWL. That is, in this second embodiment, the source region SR and the $p^+$-type semiconductor region PR are formed so as to overlap each other in plan view.

Also in the SiC power MOSFET according to this second embodiment configured in this manner, the source region SR is formed from a nickel silicide film which is a metal material film in the same manner as in the above-described first embodiment, and therefore, a source region having a low resistance and a large carrier density can be formed. Further, also in this second embodiment, the conductive impurity DP (phosphorus) is segregated at an interface between the source region SR and the p-type well PWL including a channel forming region, and therefore, the height of the Schottky barrier formed between the source region SR and the channel forming region (p-type well PWL) can be decreased. Due to this, the injection efficiency and injection rate of a carrier (electron) from an edge portion of the source region SR to the channel region can be improved, and as a result, the channel mobility in the SiC power MOSFET can be improved.

<Advantage of Second Embodiment>

Hereinafter, an advantage specific to the SiC power MOSFET according to this second embodiment will be described. As shown in FIG. 18, in this second embodiment, the source region SR is formed so as to cover the $p^+$-type semiconductor region PR. Due to this, in this second embodiment, the size of the flat surface of the source region SR can be increased as compared with the above-described first embodiment in which the source region SR does not cover the $p^+$-type semiconductor region PR. This means that according to this second embodiment, the resistance of the source region SR can be further decreased. At this time, in this second embodiment, only the size of the flat surface of the source region SR is enlarged so as to cover the $p^+$-type semiconductor region PR, and therefore, although the size of the flat surface of the source region is increased, the size of the SiC power MOSFET is the same as that of the above-described first embodiment. As a result, according to this second embodiment, an advantage that the size of the flat surface of the source region SR can be increased without increasing the size of the SiC power MOSFET is obtained. That is, according to this second embodiment, it is possible to obtain an advantage that the source resistance of the source region SR can be reduced while ensuring the integration density of the SiC power MOSFET.

As described above, the characteristic feature of this second embodiment resides in that the source region SR is formed so as to cover the p$^+$-type semiconductor region PR, however, this characteristic feature is a configuration which can be realized because the source region SR is constituted by a metal material (a metal silicide).

This point will be described below. For example, a case in which the source region SR is constituted by a semiconductor region doped with an n-type impurity is assumed. In this case, when the source region SR is formed so as to cover the p$^+$-type semiconductor region PR, the source line SL (plug PLG1) and the p$^+$-type semiconductor region PR cannot be electrically connected to each other. To be more specific, since the source region SR is formed from a semiconductor region doped with an n-type impurity and the p$^+$-type semiconductor region PR is a semiconductor region doped with a p-type impurity, a pn junction is formed in a boundary region between the source region SR and the p$^+$-type semiconductor region PR. Due to a built-in potential in the pn junction, the source region SR and the p$^+$-type semiconductor region PR are electrically insulated from each other. Therefore, when the source region SR is formed so as to cover the p$^+$-type semiconductor region PR, since the plug PLG1 and the source region SR are in contact with each other, a reference potential (a GND potential) can be supplied to the source region SR, from the source line SL through the plug PLG1. However, the plug PLG1 and the p$^+$-type semiconductor region PR are not in direct contact with each other, and also the pn junction is formed between the source region SR and the p$^+$-type semiconductor region PR, and therefore, a reference potential (a GND potential) cannot be supplied to the p$^+$-type semiconductor region PR from the plug PLG1. In this case, the potential of the source region SR and the potential of the p$^+$-type semiconductor region PR (p-type well PWL) cannot be made the same, and therefore, the SiC power MOSFET cannot be operated normally. Due to this, in the case where the source region SR is constituted by a semiconductor region, a structure in which the source region SR is formed so as to cover the p$^+$-type semiconductor region PR as described in this second embodiment cannot be adopted.

On the other hand, in this second embodiment, the source region SR is constituted by a metal material (a metal silicide). Due to this, even if the source region SR is formed so as to cover the p$^+$-type semiconductor region PR, the source region SR and the p$^+$-type semiconductor region PR can be electrically connected to each other. That is, in this second embodiment, since the source region SR is constituted by a metal material, a pn junction is not formed in a boundary region between the source region SR and the p$^+$-type semiconductor region PR, and a metal-semiconductor contact can be formed. At this time, since the concentration of the conductive impurity doped into the p$^+$-type semiconductor region PR is high, an ohmic contact can be formed between the source region SR and the p$^+$-type semiconductor region PR. As a result, the source region SR and the p$^+$-type semiconductor region PR are electrically connected to each other. Accordingly, even if the source region SR is formed so as to cover the p$^+$-type semiconductor region PR, the p$^+$-type semiconductor region PR and the plug PLG1 can be electrically connected to each other. That is, in the case where the source region SR is formed so as to cover the p$^+$-type semiconductor region PR, the plug PLG1 is electrically connected to the source region SR, and the p$^+$-type semiconductor region PR and the plug PLG1 are not in direct contact with each other.

However, since the source region SR and the p$^+$-type semiconductor region PR are in ohmic contact with each other, the plug PLG1 and the p$^+$-type semiconductor region PR are indirectly electrically connected to each other through the source region SR. Due to this, in this second embodiment, even if the source region SR is formed so as to cover the p$^+$-type semiconductor region PR, a reference potential (a GND potential) can be supplied to both of the source region SR and the p$^+$-type semiconductor region PR from the plug PLG1. In this manner, according to this second embodiment, even if the source region SR is formed so as to cover the p$^+$-type semiconductor region PR, the size of the flat surface of the source region SR can be increased while supplying the same potential to the source region SR and the p$^+$-type semiconductor region PR from the plug PLG1. As a result, according to this second embodiment, the size of the flat surface of the source region SR can be increased, and therefore, the reduction in resistance of the source region SR can be promoted.

<Method for Producing Semiconductor Device According to Second Embodiment>

The semiconductor device according to this second embodiment is configured as described above, and hereinafter, a production method thereof will be described with reference to the accompanying drawings. Incidentally, the process until the steps shown in FIGS. 8 and 9 in this embodiment is the same as that in the above-described first embodiment, and therefore, the steps thereafter will be described.

Figure 19:
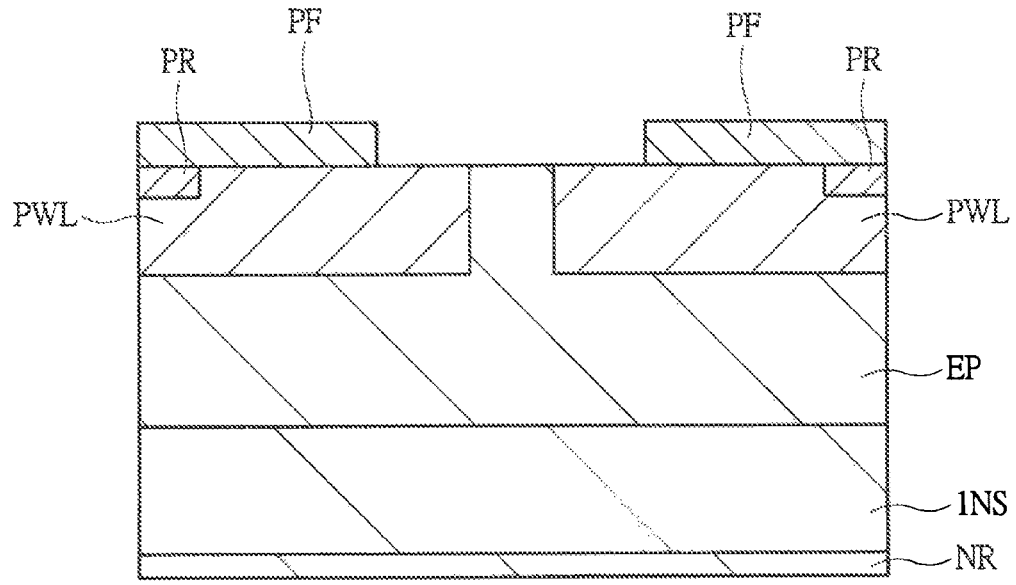
FIG. 19 is a cross-sectional view showing a process for producing the semiconductor device according to the second embodiment.

First, as shown in FIG. 19, a polysilicon film (a polycrystalline silicon film) PF containing an n-type impurity such as phosphorus (P) or arsenic (As) at a high concentration is formed on the SiC epitaxial substrate. This polysilicon film PF can be formed by using, for example, a CVD method, and the thickness thereof is, for example, about 50 nm. Thereafter, by using a photolithographic technique and an etching technique, the polysilicon film PF is patterned. The patterning of the polysilicon film PF is performed such that the polysilicon film PF is left in a region where a source region is formed. At this time, in the dry etching of the polysilicon film PF, the selection ratio relative to SiC constituting the SiC epitaxial substrate serving as a base can be applied, and therefore, by stopping etching when the surface of the SiC epitaxial substrate is exposed, the polysilicon film PF can be accurately processed. Here, it is found that as shown in FIG. 19, in this second embodiment, the polysilicon film PF is formed so as to cover the p$^+$-type semiconductor region PR formed on a part of the surface of the P-type well PWL.

Figure 20:
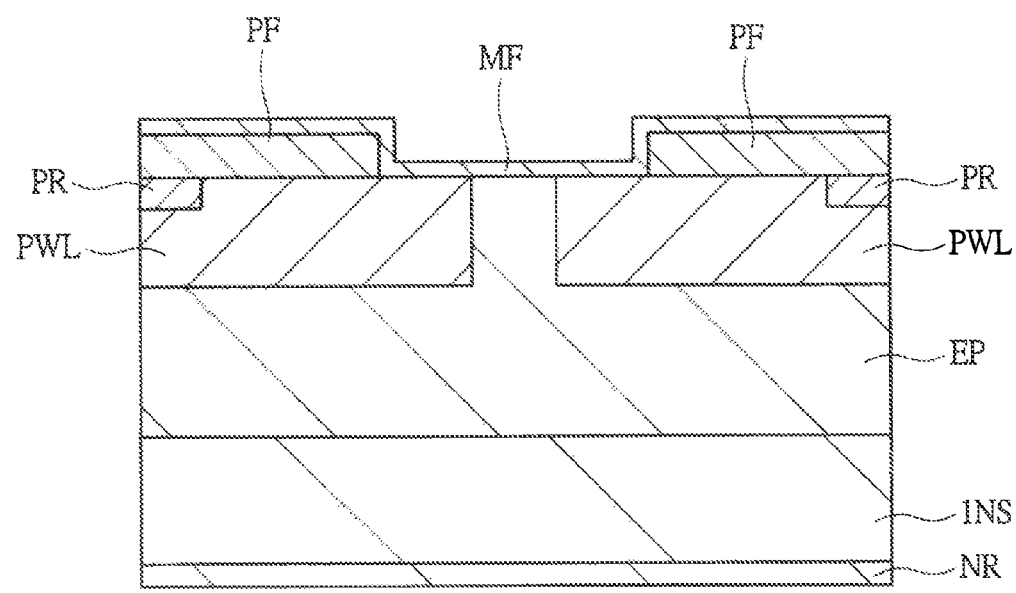
FIG. 20 is a cross-sectional view showing the process for producing the semiconductor device continued from FIG. 19.

Subsequently, as shown in FIG. 20, a metal film MF is formed on the SiC epitaxial substrate having the patterned polysilicon film PF formed thereon. Specifically, as the metal film MF, for example, a nickel film can be formed, and the thickness thereof is, for example, about 50 nm. This nickel film can be formed by using, for example, a sputtering method.

Figure 21:
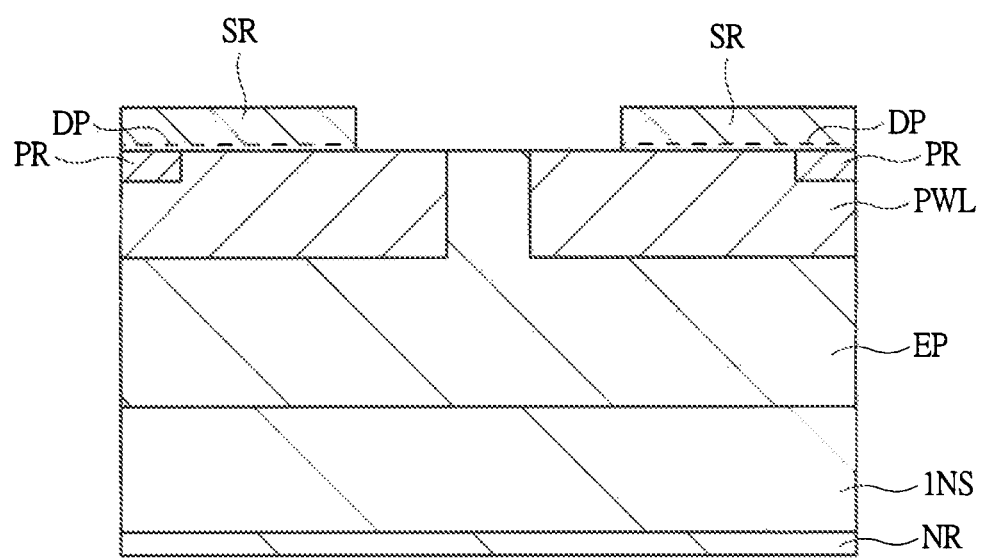
FIG. 21 is a cross-sectional view showing the process for producing the semiconductor device continued from FIG. 20.

Subsequently, as shown in FIG. 21, a silicidation reaction between the polysilicon film PF and the nickel film is performed by applying a heat treatment at 320° C. for 60 seconds as first annealing (a first heat treatment) to the SiC epitaxial substrate. In such a low-temperature treatment, the nickel film does not react with SiC, and therefore, only the polysilicon film PF and the nickel film can be reacted with each other. Then, the unreacted nickel film is removed with a mixed liquid of sulfuric acid and hydrogen peroxide, and thereafter as second annealing (a second heat treatment), a heat treatment at 500° C. for 30 seconds is performed. By doing this, a nickel silicide film formed on the surface of the polysilicon film PF is allowed to grow, whereby the polysilicon film PF is completely replaced with a nickel silicide film. In such a low-temperature treatment, the nickel film does not react with SiC, and therefore, a silicidation reaction with the polysilicon film PF proceeds, and when the reaction reaches the SiC epitaxial substrate, the silicidation reaction stops. During this silicidation reaction, the conductive impurity DP (phosphorus) doped into the polysilicon film PF moves and aggregates at an interface with the SiC epitaxial substrate. In this manner, according to this second embodiment, between the nickel silicide film and the SiC epitaxial substrate, an interface at which the conductive impurity DP (phosphorus) is segregated in a self-aligned manner can be provided. As described above, according to this second embodiment, a source region SR composed of a nickel silicide film can be formed, and also the conductive impurity DP (phosphorus) can be segregated at an interface between the source region SR and the p-type well PWL.

Here, in this second embodiment, the source region SR is constituted by a metal material and the $p^+$-type semiconductor region PR is doped with a p-type impurity at a high concentration, and therefore, an ohmic contact can be formed between the source region SR and the $p^+$-type semiconductor region PR, and as a result, the source region SR and the $p^+$-type semiconductor region PR can be electrically connected to each other.

The steps thereafter are the same as those in the above-described first embodiment (see FIGS. 14 and 15), and the SiC power MOSFET (semiconductor device) according to this second embodiment can be produced in the end. According to this second embodiment, since the size of the flat surface of the source region SR can be increased, the resistance of the source region SR can be decreased, and as a result, improvement of the performance represented by reduction in on-resistance of the SiC power MOSFET of this second embodiment can be achieved. Further, this second embodiment has an advantage that the plug PLG1 electrically connected to the source region SR can be easily formed. That is, in this second embodiment, for example, as shown in FIG. 18, the source region SR is formed so as to cover the $p^+$-type semiconductor region PR, and the bottom surface of the plug PLG1 is flat. Due to this, an opening which passes through the interlayer insulating film IL and reaches the source region SR can be easily formed, and also when the plug PLG1 is formed by burying a metal material in this opening, the filling performance of the metal material in the opening can be improved. As a result, according to this second embodiment, the plug PLG1 electrically connected to the source region SR can be easily formed.

Third Embodiment

In a third embodiment of the invention, an example in which a source region SR composed of a metal material (a metal silicide) is formed while protecting a channel forming region will be described.

<Structure of Semiconductor Device According to Third Embodiment>

Also in the third embodiment of the invention, the layout structures explained in the above-described second embodiment as shown in FIGS. 16 and 17 can be adopted. That is, also the SiC power MOSFET according to this third embodiment is not limited to the layout structure shown in FIG. 16, and for example, also in a layout structure in which a diagonal long region is hardly formed by shifting the arrangement positions of the gate electrodes G on every other line as shown in FIG. 17, the technical idea of this third embodiment can be realized. That is, also the technical idea of this third embodiment can be applied independent of the layout structure in the same manner as in the above-described second embodiment.

Figure 22:
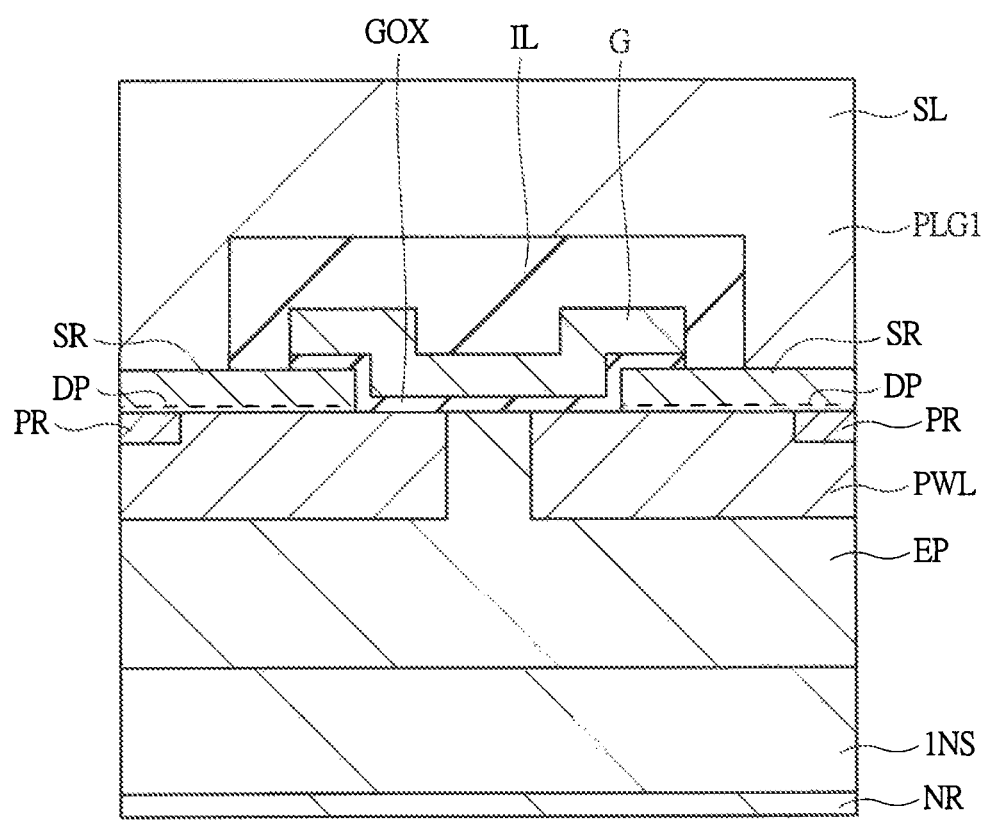
FIG. 22 is a view showing a cross-sectional structure of a semiconductor device according to a third embodiment.

FIG. 22 is a cross-sectional view showing a structure of a semiconductor device according to this third embodiment. The structure of the SiC power MOSFET according to this third embodiment shown in FIG. 22 is the same as that of the SiC power MOSFET according to the above-described second embodiment shown in FIG. 18. Therefore, also in this third embodiment, since the source region SR is formed from a nickel silicide film which is a metal material film, a source region SR having a low resistance and a large carrier density can be formed. Further, also in this third embodiment, the conductive impurity DP (phosphorus) is segregated at an interface between the source region SR and the p-type well PWL including the channel forming region, and therefore, the height of the Schottky barrier formed between the source region SR and the channel forming region (p-type well PWL) can be decreased. Due to this, the injection efficiency and injection rate of a carrier (electron) from an edge portion of the source region SR to the channel region can be improved, and as a result, the channel mobility in the SiC power MOSFET can be improved.

Further, also in this third embodiment, since the source region SR is formed so as to cover the $p^+$-type semiconductor region PR, the size of the flat surface of the source region SR can be increased. Due to this, the resistance of the source region SR can be decreased, and as a result, improvement of the performance represented by reduction in on-resistance of the SiC power MOSFET of this third embodiment can be achieved.

<Method for Producing Semiconductor Device According to Third Embodiment>

This third embodiment has a characteristic feature in the method for producing a SiC power MOSFET. Hereinafter, this method for producing a semiconductor device will be described with reference to the accompanying drawings. Incidentally, the process until the steps shown in FIGS. 8 and 9 in this embodiment is the same as that in the above-described first embodiment, and therefore, the steps thereafter will be described.

Figure 23:
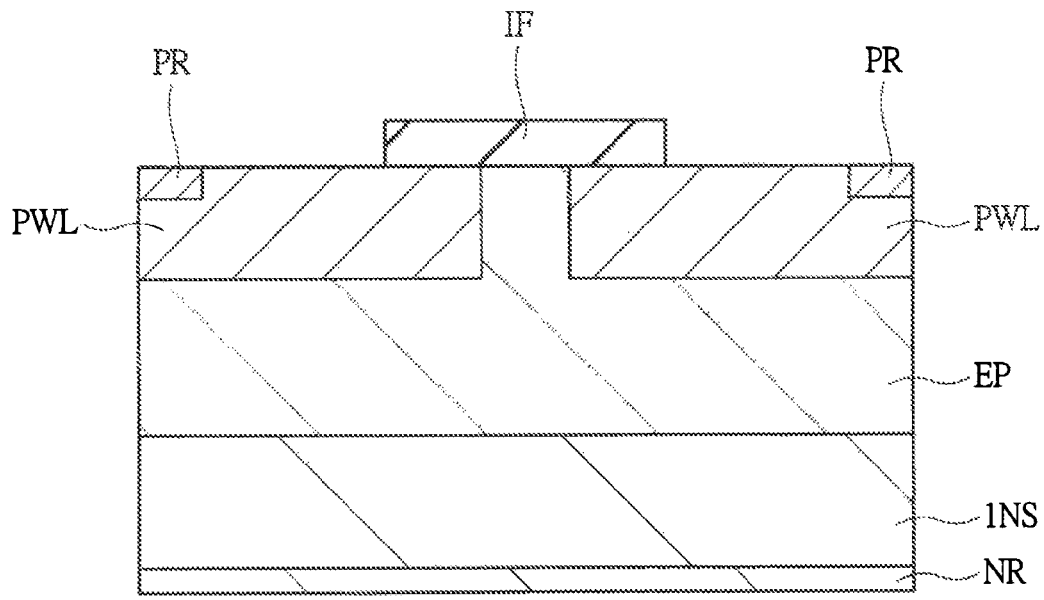
FIG. 23 is a cross-sectional view showing a process for producing the semiconductor device according to the third embodiment.

First, as shown in FIG. 23, an insulating film IF is formed on the surface of the SiC epitaxial substrate. This insulating film IF is formed from, for example, a silicon oxide film by using a CVD method, and the thickness thereof is, for example, about 100 nm. Thereafter, by using a photolithographic technique and an etching technique, the insulating film IF is patterned. The patterning of the insulating film IF is performed such that the source forming region is exposed and the channel forming region is covered.

Figure 24:
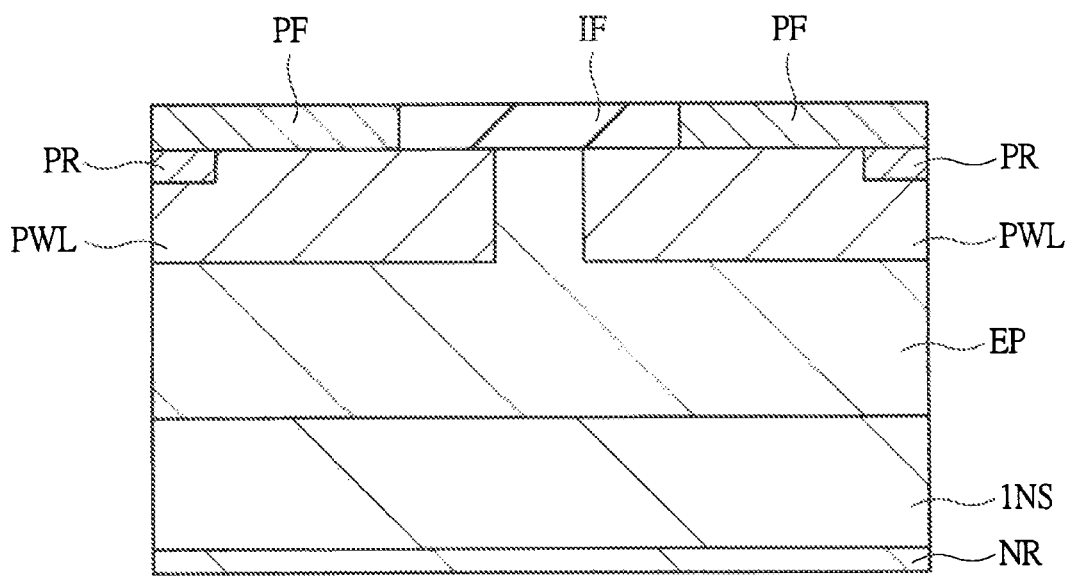
FIG. 24 is a cross-sectional view showing the process for producing the semiconductor device continued from FIG. 23.

Subsequently, as shown in FIG. 24, a polysilicon film (a polycrystalline silicon film) PF containing an n-type impurity such as phosphorus (P) or arsenic (As) at a high concentration is formed on the SiC epitaxial substrate having the patterned insulating film IF on the surface thereof. This polysilicon film PF can be formed by using, for example, a CVD method, and the thickness thereof is, for example, about 100 nm. At this time, the polysilicon film PF is formed so as to cover the insulating film IF. Thereafter, by using a CMP (Chemical Mechanical Polishing) method, the polysilicon film PF is polished until the surface of the insulating film IF is exposed. Here, the polishing by CMP can be adjusted such that the polysilicon film PF has a predetermined thickness.

Figure 25:
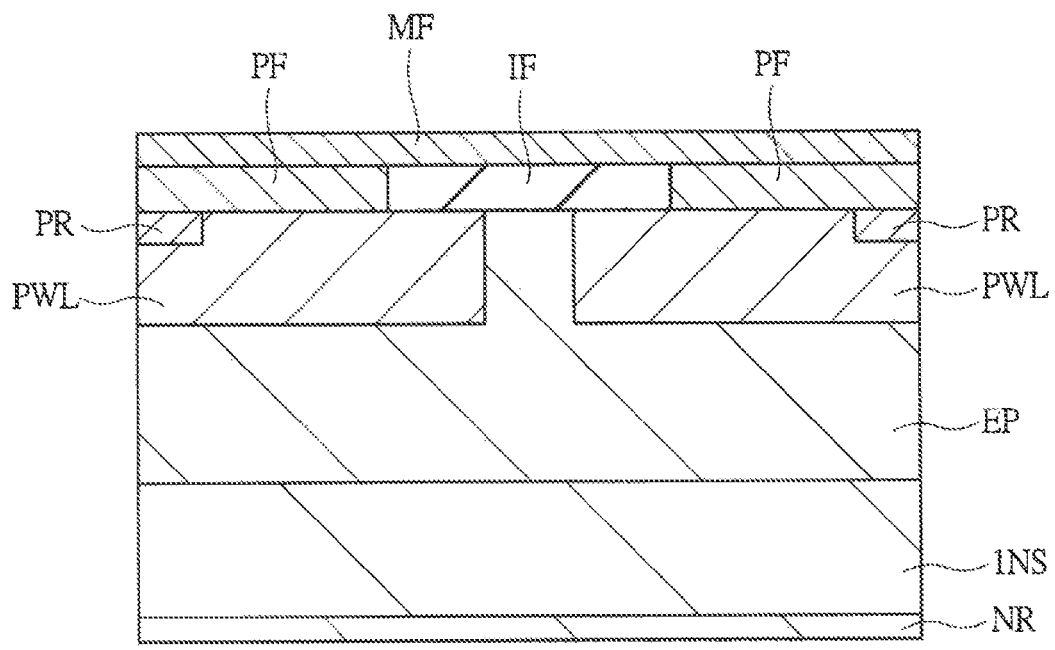
FIG. 25 is a cross-sectional view showing the process for producing the semiconductor device continued from FIG. 24.

Subsequently, as shown in FIG. 25, a metal film MF is formed on the SiC epitaxial substrate having the polysilicon film PF and the insulating film IF formed thereon. Specifically, as the metal film MF, for example, a nickel film can be formed, and the thickness thereof is, for example, about 100 nm. This nickel film can be formed by using, for example, a sputtering method.

Figure 26:
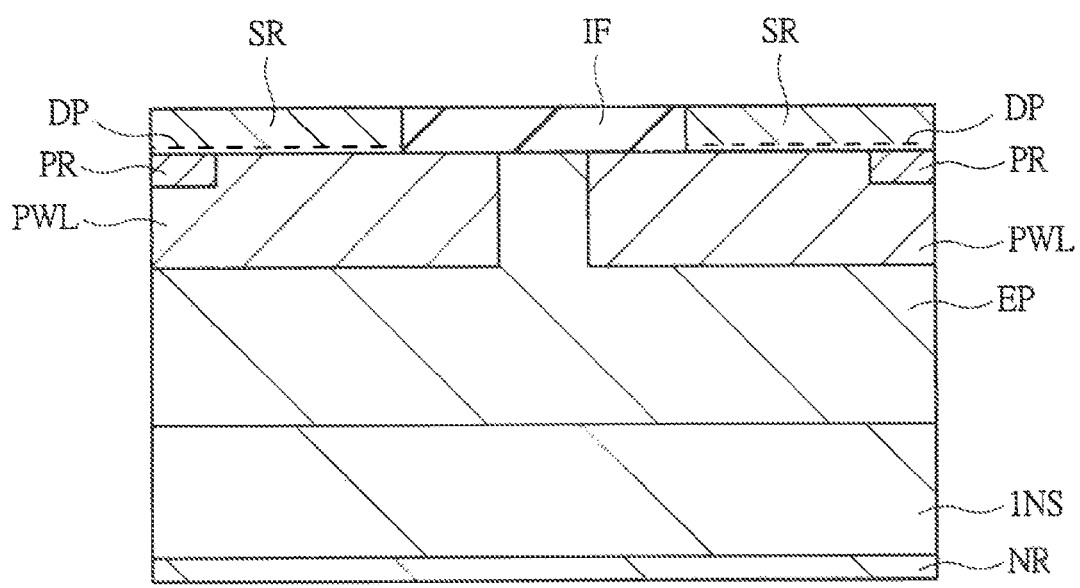
FIG. 26 is a cross-sectional view showing the process for producing the semiconductor device continued from FIG. 25.

Subsequently, as shown in FIG. 26, a silicidation reaction between the polysilicon film PF and the nickel film is performed by applying a heat treatment at 320° C. for 60 seconds as first annealing (a first heat treatment) to the SiC epitaxial substrate. In such a low-temperature treatment, the nickel film does not react with SiC, and therefore, only the polysilicon film PF and the nickel film can be reacted with each other. Then, the unreacted nickel film is removed with a mixed liquid of sulfuric acid and hydrogen peroxide, and thereafter as second annealing (a second heat treatment), a heat treatment at 500° C. for 30 seconds is performed. By doing this, a nickel silicide film formed on the surface of the polysilicon film PF is allowed to grow, whereby the polysilicon film PF is completely replaced with a nickel silicide film. In such a low-temperature treatment, the nickel film does not react with SiC, and therefore, a silicidation reaction with the polysilicon film PF proceeds, and when the reaction reaches the SiC epitaxial substrate, the silicidation reaction stops. During this silicidation reaction, the conductive impurity DP (phosphorus) doped into the polysilicon film PF moves and aggregates at an interface with the SiC epitaxial substrate. In this manner, according to this third embodiment, between the nickel silicide film and the SiC epitaxial substrate, an interface at which the conductive impurity DP (phosphorus) is segregated in a self-aligned manner can be provided. As described above, according to this third embodiment, a source region SR composed of a nickel silicide film can be formed, and also the conductive impurity DP (phosphorus) can be segregated at an interface between the source region SR and the p-type well PWL. Incidentally, the insulating film IF does not react with the nickel film, and therefore, the insulating film IF remains on the SiC epitaxial substrate.

Here, also in this third embodiment, the source region SR is constituted by a metal material and the $p^+$-type semiconductor region PR is doped with a p-type impurity at a high concentration, and therefore, an ohmic contact can be formed between the source region SR and the $p^+$-type semiconductor region PR, and as a result, the source region SR and the $p^+$-type semiconductor region PR can be electrically connected to each other.

Figure 27:
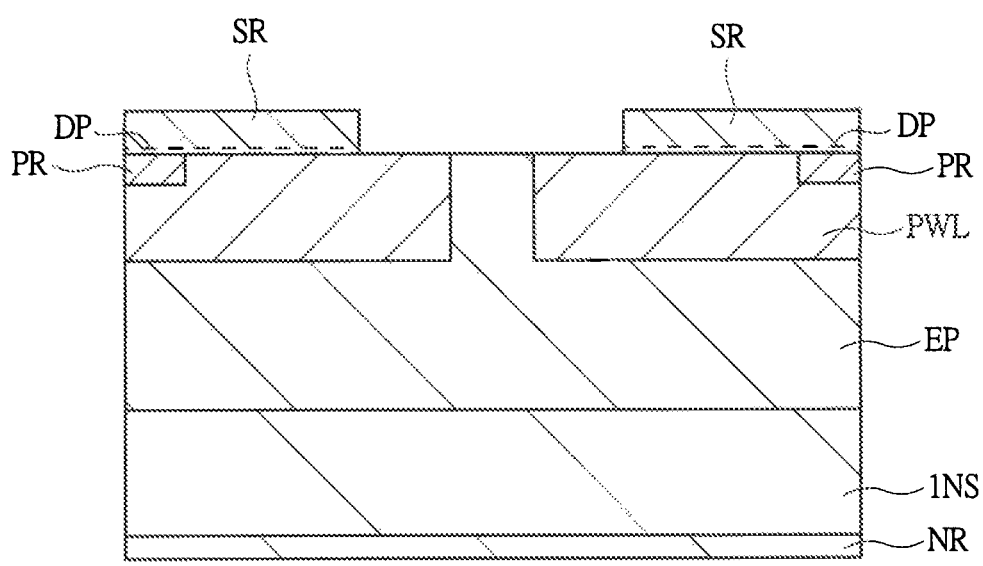
FIG. 27 is a cross-sectional view showing the process for producing the semiconductor device continued from FIG. 26.

Thereafter, as shown in FIG. 27, the insulating film IF formed on the SiC epitaxial substrate is removed. The steps thereafter are the same as those in the above-described first embodiment (see FIGS. 14 and 15), and the SiC power MOSFET (semiconductor device) according to this third embodiment can be produced in the end. Also in this third embodiment, since the size of the flat surface of the source region SR can be increased, the resistance of the source region SR can be decreased, and as a result, improvement of the performance represented by reduction in on-resistance of the SiC power MOSFET of this third embodiment can be achieved.

<Advantage of Third Embodiment>

In the method for producing a semiconductor device according to this third embodiment, as shown in FIG. 25, the insulating film IF is formed so as to cover the channel forming region present in a part of the surface of the p-type well PWL. Further, the metal film MF (nickel film) is formed on the surface of the insulating film IF and the surface of the polysilicon film PF. Therefore, according to this third embodiment, the metal film MF can be prevented from coming in direct contact with the channel forming region. That is, in this third embodiment, the channel forming region is covered with the insulating film IF, and it is found that the insulating film IF functions as a protection film that protects the channel forming region.

As a result, for example, as shown in FIG. 26, when the polysilicon film PF and the metal film MF are subjected to a silicidation reaction by performing a heat treatment of the SiC epitaxial substrate, the channel forming region formed in a part of the surface of the p-type well PWL is covered with the insulating film IF serving as a surface protection film. Due to this, according to this third embodiment, the interface of the substrate where the channel is formed can be maintained in a favorable state, and therefore, the performance of the SiC power MOSFET can be improved.

For example, when a heat treatment is applied in a state where the metal film MF is in direct contact with the channel forming region, the metal element constituting the metal film MF may diffuse in the channel forming region. In this case, by the effect of the penetrating metal element, the threshold voltage at which the channel is formed in the channel forming region is deviated from the designed value, or by the effect of the penetrating metal element (impurity), scattering of a carrier (electron) flowing in the channel is increased, and the channel mobility may be deteriorated.

In view of this, according to this third embodiment, when the polysilicon film PF and the metal film MF are subjected to a silicidation reaction, since the channel forming region is protected by being covered with the insulating film IF, for example, the possibility that the penetration of the metal element constituting the metal film MF into the channel forming region due to the heat treatment for the silicidation reaction can be decreased. As a result, according to this third embodiment, the insulating film IF formed so as to cover the channel forming region protects the interface of the channel forming region, and therefore, undesirable penetration of an impurity into the channel forming region can be prevented. Due to this, according to this third embodiment, a SiC power MOSFET (semiconductor device) having high reliability can be produced. That is, according to this third embodiment, processing and silicidation are performed in a state where the channel forming region is covered with the insulating film IF, and therefore, processing and silicidation can be performed while protecting the channel forming region.

<Modification Example>

In this third embodiment, for example, the layout structures explained in the above-described second embodiment as shown in FIGS. 16 and 17 can be adopted. Particularly, also the technical idea of this third embodiment can be applied independent of the layout structure in the same manner as in the above-described first and second embodiments. Hereinafter, a modification example of the layout structure to which the technical idea of this third embodiment is applied will be described.

Figure 28:
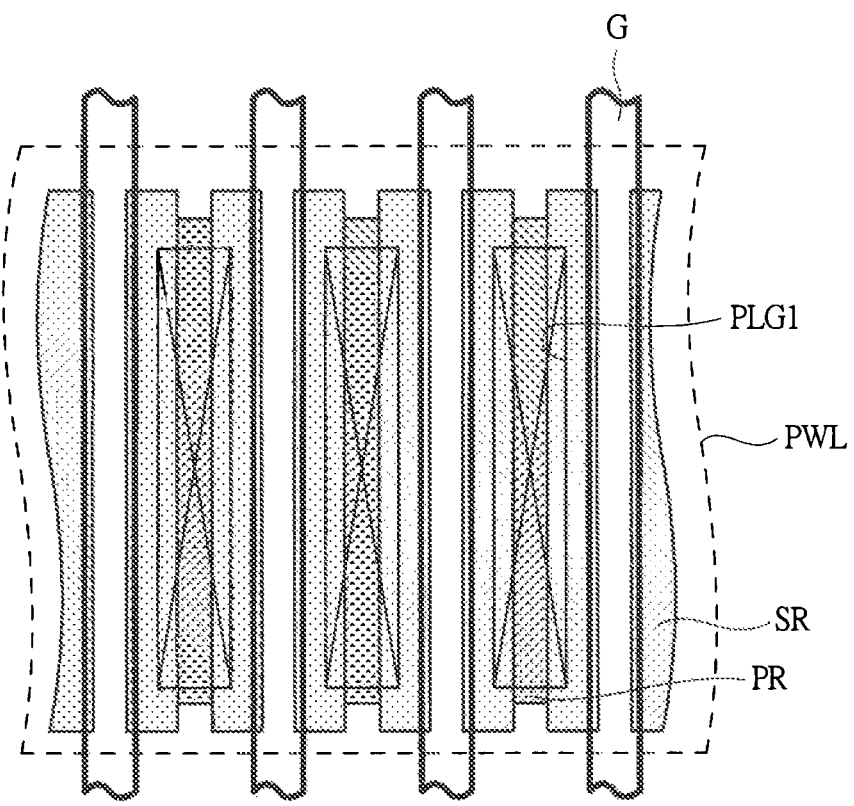
FIG. 28 is a plan view showing one example of a modification example according to the third embodiment.

FIG. 28 is a plan view showing one example of a modification example according to this third embodiment. For example, in FIGS. 16 and 17, the source region SR having a substantially square pattern is shown, however, in FIG. 28, by arranging gate electrodes in the form of a stripe, a source region SR having a rectangular pattern can be formed. In this case, also a $p^+$-type semiconductor region PR has a rectangular shape. Further, a rectangular plug PLG1 is formed such that it is electrically connected to both of the rectangular source region SR and the rectangular $p^+$-type semiconductor region PR. In this manner, according to the layout structure shown in FIG. 28, by forming the source region SR having a rectangular pattern, the area of the flat surface of the source region SR can be increased. As a result, reduction in resistance of the source region SR can be promoted.

Figure 29:
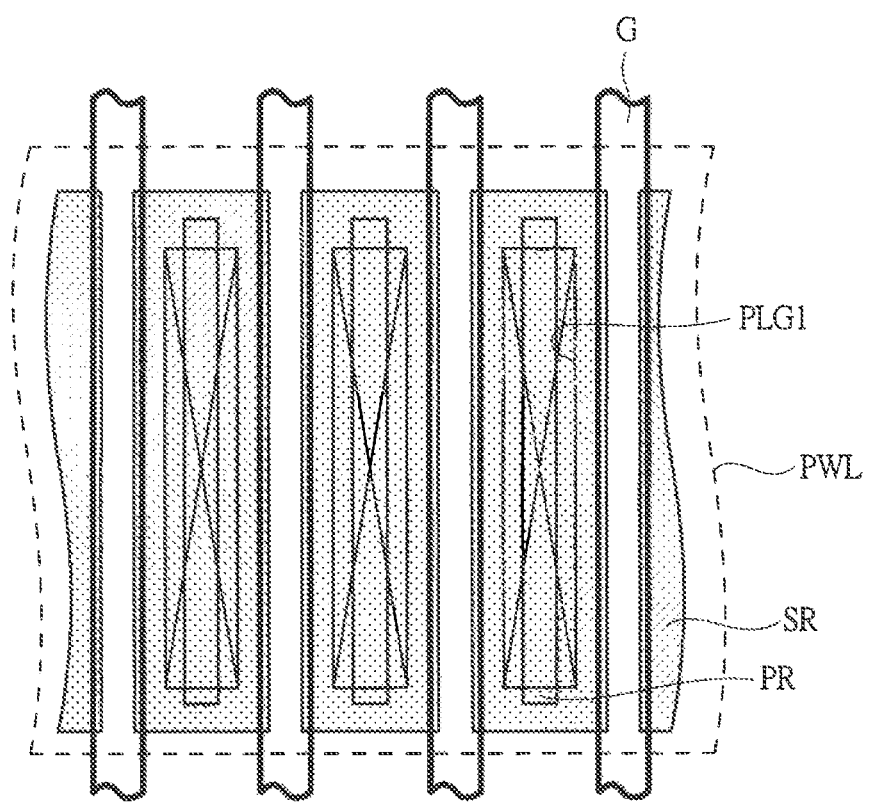
FIG. 29 is a plan view showing another example of the modification example according to the third embodiment.

Further, FIG. 29 is a plan view showing another example of the modification example according to this third embodiment. In FIG. 29, a source region SR is formed so as to cover a rectangular p+-type semiconductor region PR. Due to this, the area of the flat surface of the source region SR can be further increased, and as a result, further reduction in resistance of the source region SR can be realized.

Incidentally, in the layout structures shown in FIGS. 28 and 29, by forming the plug PLG1 into a rectangular shape, the contact area between the source region SR and the plug PLG1 can be increased, and therefore, also an effect of enabling the reduction in contact resistance between the source region SR and the plug PLG1 can be obtained.

Figure 30:
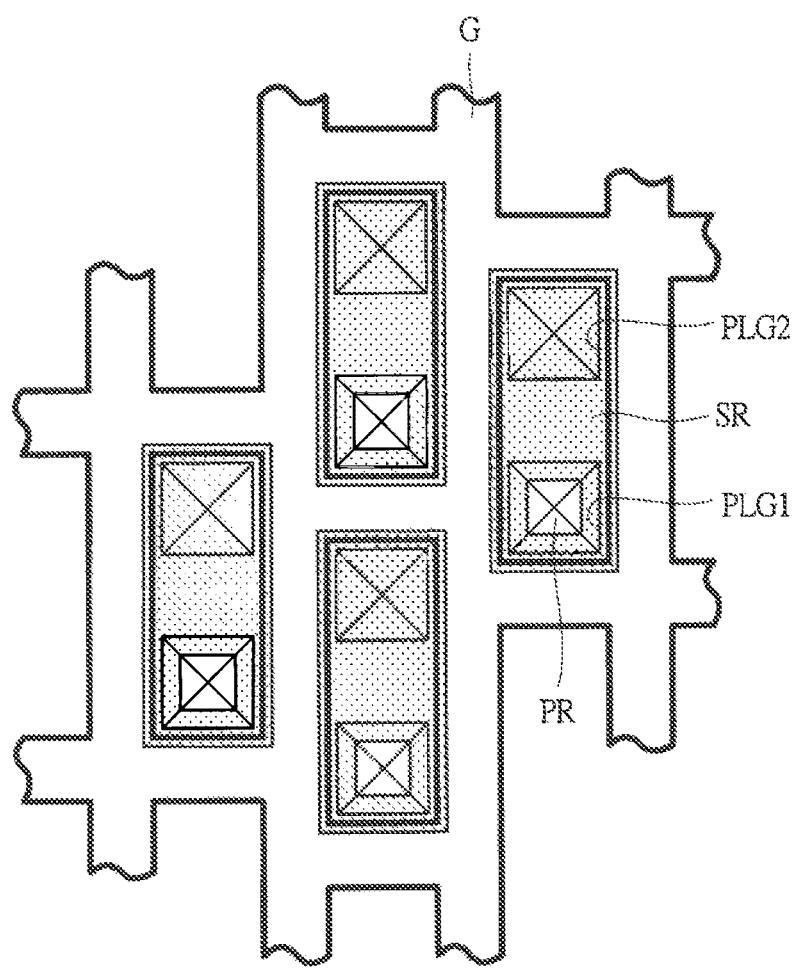
FIG. 30 is a plan view showing still another example of the modification example according to the third embodiment.

Further, FIG. 30 is a plan view showing still another example of the modification example according to this third embodiment. In a layout structure shown in FIG. 30, an example of a layout structure in which basic cells having a rectangular pattern are combined is shown. In this layout structure, a source region SR also has a rectangular shape, and this source region SR is electrically connected to two plugs: a plug PLG1 and a plug PLG2. Due to this, the contact area between the source region SR and the plugs (the plug PLG1 and the plug PLG2) can be increased, and therefore, the contact resistance between the plugs (the plug PLG1 and the plug PLG2) and the source region SR can be decreased.

Fourth Embodiment

In a fourth embodiment of the invention, an example in which a source region SR composed of a metal material (a metal silicide) is formed in a self-aligned manner with a gate electrode G will be described.

<Structure of Semiconductor Device According to Fourth Embodiment>

Figure 31:
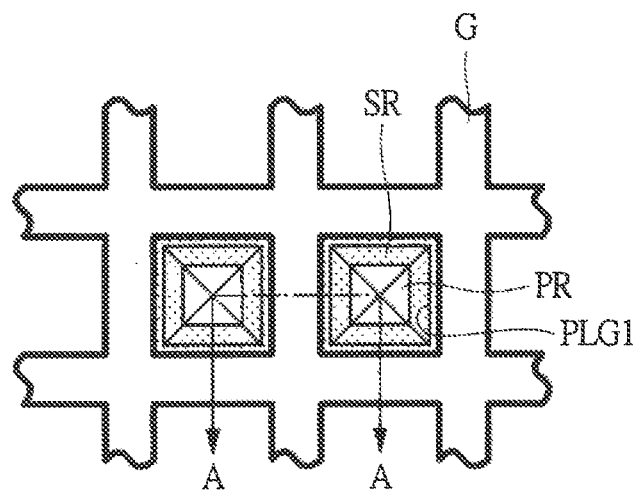
FIG. 31 is a plan view showing an example of a layout structure of a semiconductor device according to a fourth embodiment.
Figure 32:
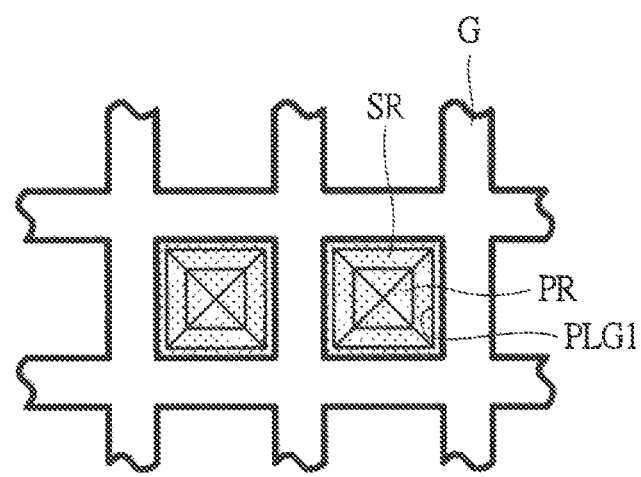
FIG. 32 is a plan view showing an example of another layout structure of the semiconductor device according to the fourth embodiment.

FIG. 31 is a plan view showing an example of a layout structure of a SiC power MOSFET according to this fourth embodiment of the invention, and FIG. 32 is a plan view showing an example of another layout structure of the SiC power MOSFET according to this fourth embodiment. First, as shown in FIGS. 31 and 32, basic cells constituting the SiC power MOSFET are arranged in the form of an array (matrix). In FIGS. 31 and 32, gate electrodes C are arranged in the form of a lattice, and a source region SR is formed in each of the basic cells surrounded by the gate electrodes G.

Here, in FIG. 31, a p+-type semiconductor region PR is formed inside the source region SR in plan view. On the other hand, in FIG. 32, the source region SR is formed in the entire area inside the basic cell surrounded by the gate electrodes C in plan view. Further, in FIG. 32, a p+-type semiconductor region PR is formed on a lower layer overlapping the source region SR in plan view. That is, a different point is that in FIG. 31, the source region SR and the p+-type semiconductor region PR are formed such that they do not overlap each other in plan view, however, in FIG. 32, the source region SR is formed also in a region covering the p+-type semiconductor region PR. Further, as shown in FIG. 32, the source region SR and a plug PLG1 are electrically connected to each other. Here, in the layout structures according to this fourth embodiment shown in FIGS. 31 and 32, unlike the above-described first embodiment shown in FIGS. 5 and 6 or the above-described second embodiment shown in FIGS. 16 and 17, an edge portion of the source region SR does not protrude from the gate electrode G. That is, in this fourth embodiment, the source region SR is formed in a self-aligned manner with the gate electrode G. This point is the characteristic feature of this fourth embodiment and is a different point from the above-described first and second embodiments.

Incidentally, the SiC power MOSFET according to this fourth embodiment is not limited to the layout structures shown in FIGS. 31 and 32, and for example, also in a layout structure in which a diagonal long region is hardly formed by shifting the arrangement positions of the gate electrodes G on every other line, the technical idea of this fourth embodiment can be realized. That is, also the technical idea of this fourth embodiment can be applied independent of the layout structure in the same manner as in the above-described first embodiment.

Figure 33:
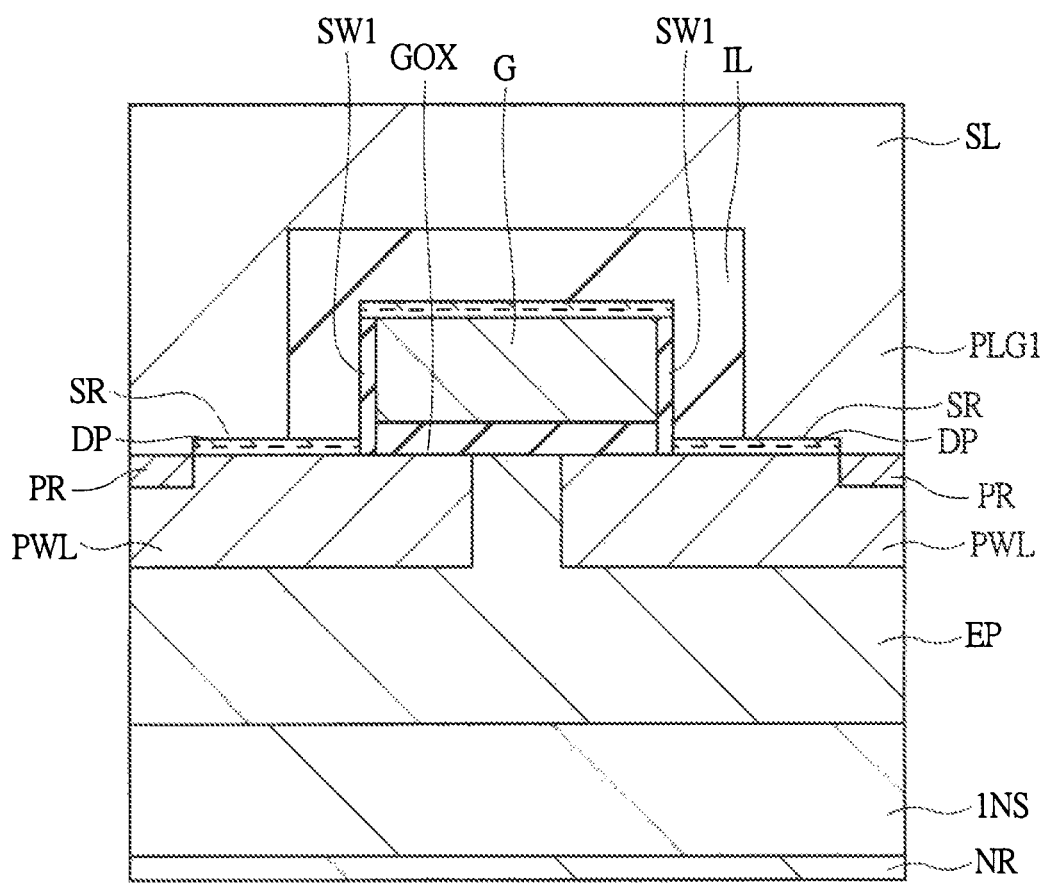
FIG. 33 is a view showing a cross-sectional structure of the semiconductor device according to the fourth embodiment, and is a cross-sectional view taken along the line A-A of FIG. 31.

FIG. 33 is a view showing a cross-sectional structure of the SiC power MOSFET according to this fourth embodiment, and shows a cross-sectional view taken along the line A-A of FIG. 31. In FIG. 33, the structure of the SiC power MOSFET according to this fourth embodiment is substantially the same as that of the SiC power MOSFET according to the above-described first embodiment shown in FIG. 7, and therefore, a different point will be mainly described.

As shown in FIG. 33, in the SiC power MOSFET according to this fourth embodiment, the source region SR is formed in a self-aligned manner with the gate electrode G. That is, in this fourth embodiment, the source region SR and the gate electrode G are arranged such that there is no region where these members overlap each other in plan view. Further, in this fourth embodiment, on the upper surface (front surface) of the gate electrode G, a metal silicide film is formed.

Also in the SiC power MOSFET according to this fourth embodiment configured in this manner, the source region SR is formed from a nickel silicide film which is a metal material film in the same manner as in the above-described first embodiment, and therefore, a source region SR having a low resistance and a large carrier density can be formed. Further, in this fourth embodiment, a nickel silicide film is formed on the upper surface (front surface) of the gate electrode G using the same material as the nickel silicide constituting the source region SR. Therefore, in this fourth embodiment, the resistance of the gate electrode G can be decreased. That is, the gate electrode G is formed from, for example, a polysilicon film, however, by silicidation of the surface of this polysilicon film, the resistance of the gate electrode G can be decreased.

Further, also in this fourth embodiment, the conductive impurity DP (phosphorus) is segregated at an interface between the source region SR and the p-type well PWL including the channel forming region, and therefore, the height of a Schottky barrier formed between the source region SR and the channel forming region (p-type well PWL) can be decreased. Due to this, the injection efficiency and injection rate of a carrier (electron) from an edge portion of the source region SR to the channel region can be improved, and as a result, the channel mobility in the SiC power MOSFET can be improved.

<Method for Producing Semiconductor Device According to Fourth Embodiment>

Figure 34:
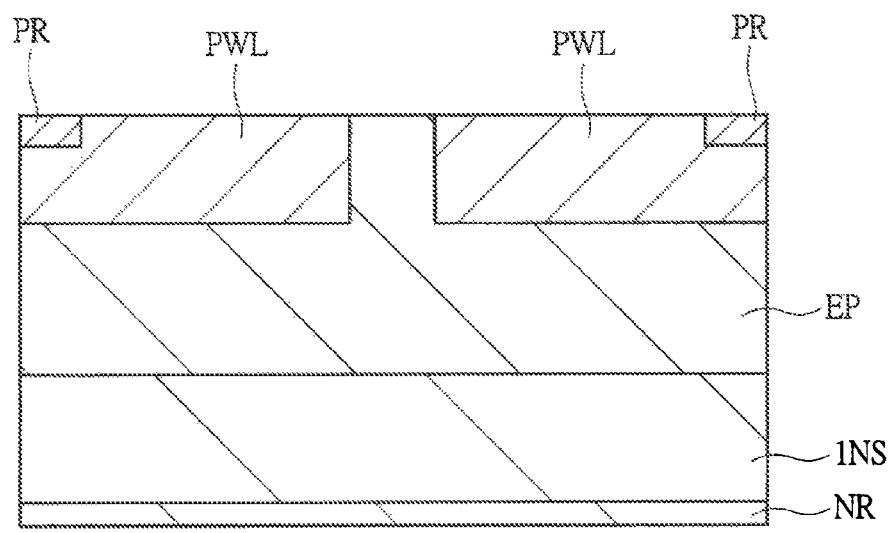
FIG. 34 is a cross-sectional view showing a process for producing the semiconductor device according to the fourth embodiment.

The semiconductor device according to this fourth embodiment is configured as described above, and hereinafter, a production method thereof will be described with reference to the accompanying drawings. Incidentally, the process until the steps shown in FIGS. 8 and 9 in this embodiment is the same as that in the above-described first embodiment, and therefore, the steps thereafter will be described. FIG. 34 is a view showing a cross-sectional structure of the SiC epitaxial substrate after the steps shown in FIGS. 8 and 9. That is, also in this fourth embodiment, all the semiconductor regions required for the SiC epitaxial substrate by the stage shown in FIG. 34 are formed.

Figure 35:
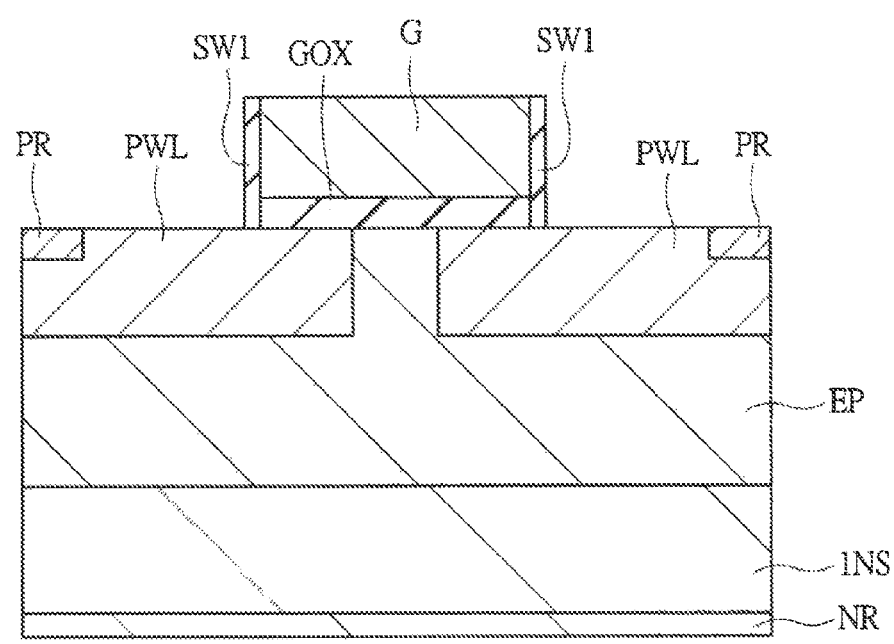
FIG. 35 is a cross-sectional view showing the process for producing the semiconductor device continued from FIG. 34.

Subsequently, as shown in FIG. 35, a gate insulating film GOX is formed on the surface of the SiC epitaxial substrate.

This gate insulating film GOX is formed from, for example, a silicon oxide film, and the thickness thereof is, for example, about 55 nm. Specifically, the gate insulating film GOX can be formed by first oxidizing the surface of the SiC epitaxial substrate by a thermal oxidation method to form a silicon oxide film having a thickness of, for example, about 5 nm, and thereafter depositing a silicon oxide film having a thickness of about 50 nm by, for example, a CVD method. Thereafter, on the gate insulating film GOX, a polysilicon film containing a conductive impurity (phosphorus) at a high concentration is formed. This polysilicon film can be formed by, for example, a CVD method, and the thickness thereof is, for example, about 300 nm.

Subsequently, by using a photolithographic technique and an etching technique, the polysilicon film is patterned, whereby a gate electrode G is formed. Then, on the SiC epitaxial substrate having the gate electrode G formed thereon, a silicon oxide film covering the gate electrode G is formed. This silicon oxide film can be formed by using, for example, a CVD method, and the thickness thereof is, for example, about 10 nm. Thereafter, the deposited silicon oxide film is subjected to anisotropic etching (etching back), whereby the silicon oxide film is left only on both side surfaces of the gate electrode G. By doing this, as shown in FIG. 35, a side wall SW1 composed of the silicon oxide film can be formed on both side surfaces of the gate electrode G.

Figure 36:
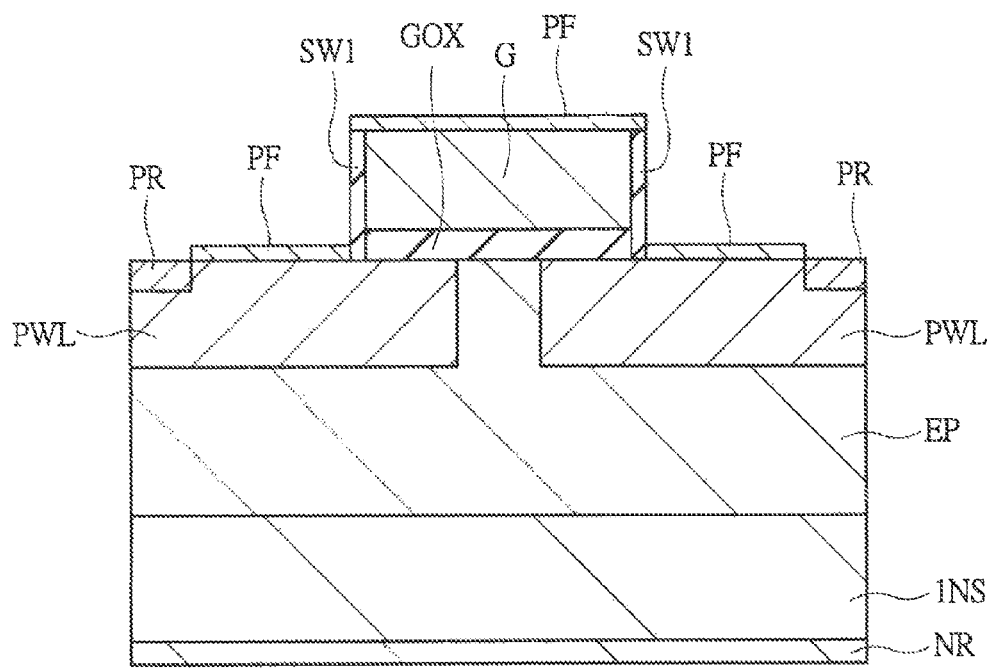
FIG. 36 is a cross-sectional view showing the process for producing the semiconductor device continued from FIG. 35.

Subsequently, as shown in FIG. 36, a polysilicon film PF is formed on the surface of the SiC epitaxial substrate having the gate electrode G formed thereon. This polysilicon film PF is formed by using a directional sputtering method, and the thickness thereof is, for example, about 30 nm. At this time, since the polysilicon film PF is formed by a directional sputtering method, it is mainly formed in the source forming region and an upper part of the gate electrode G and is hardly formed on the side surfaces of the gate electrode G. Then, a conductive impurity DP (phosphorus) is doped into the polysilicon film PF at a high concentration. Thereafter, by using a photolithographic technique and an etching technique, the polysilicon film PF is patterned. The patterning of the polysilicon film PF is performed such that the p+-type semiconductor region PR is exposed.

Figure 37:
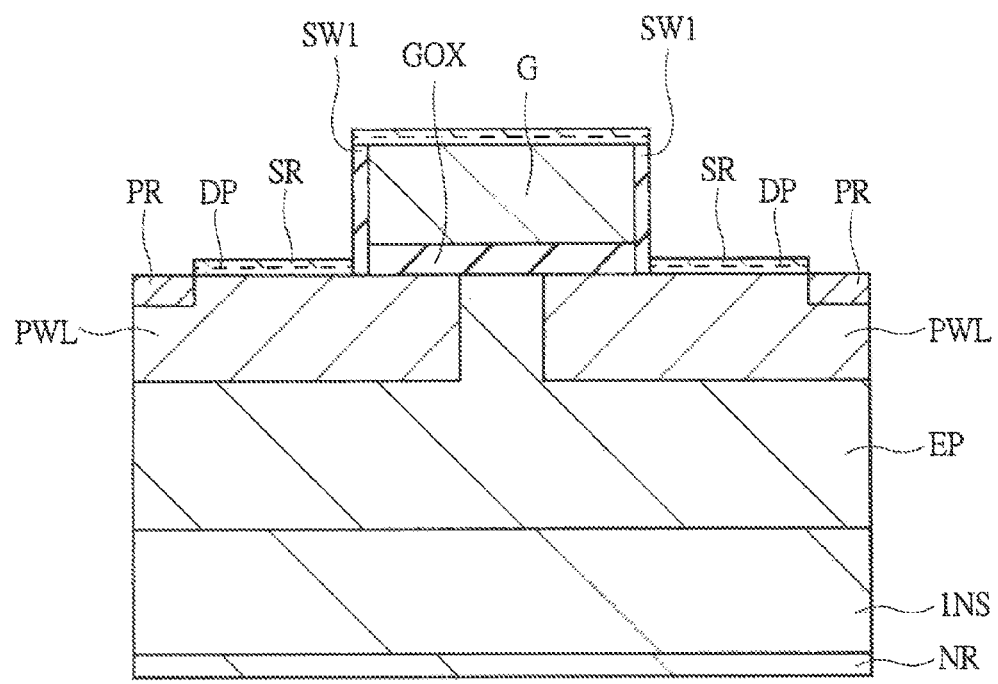
FIG. 37 is a cross-sectional view showing the process for producing the semiconductor device continued from FIG. 36.

Subsequently, as shown in FIG. 37, a metal film MF is formed on the SiC epitaxial substrate having the patterned polysilicon film PF formed thereon. Specifically, as the metal film MF, for example, a nickel film can be formed, and the thickness thereof is, for example, about 50 nm. This nickel film can be formed by using, for example, a sputtering method.

Subsequently, a silicidation reaction between the polysilicon film PF and the nickel film is performed by applying a heat treatment at 320° C. for 60 seconds as first annealing (a first heat treatment) to the SiC epitaxial substrate. In such a low-temperature treatment, the nickel film does not react with SiC, and therefore, only the polysilicon film PF and the nickel film can be reacted with each other. Then, the unreacted nickel film is removed with a mixed liquid of sulfuric acid and hydrogen peroxide, and thereafter as second annealing (a second heat treatment), a heat treatment at 500° C. for 30 seconds is performed. By doing this, a nickel silicide film formed on the surface of the polysilicon film PF is allowed to grow, whereby the polysilicon film PF is completely replaced with a nickel silicide film. In such a low-temperature treatment, the nickel film does not react with SiC, and therefore, a silicidation reaction proceeds with the polysilicon film PF proceeds, and when the reaction reaches the SiC epitaxial substrate, the silicidation reaction stops. During this silicidation reaction, the conductive impurity DP (phosphorus) doped into the polysilicon film PF moves and aggregates at an interface with the SiC epitaxial substrate. In this manner, according to this fourth embodiment, between the nickel silicide film and the SiC epitaxial substrate, an interface at which the conductive impurity DP (phosphorus) is segregated in a self-aligned manner can be provided.

As described above, according to this fourth embodiment, a source region SR composed of a nickel silicide film can be formed, and also the conductive impurity DP (phosphorus) can be segregated at an interface between the source region SR and the p-type well PWL. Further, in this fourth embodiment, also on the upper surface (front surface) of the gate electrode G, a nickel silicide film can be formed. As a result, the gate electrode G is formed from a laminate of the polysilicon film and the nickel silicide film, and therefore, since the gate electrode G contains the nickel silicide film which is a metal material film, according to this fourth embodiment, the resistance of the gate electrode G can be decreased.

The steps thereafter are the same as those in the above-described first embodiment, and the SiC power MOSFET (semiconductor device) according to this fourth embodiment can be produced in the end.

<Advantage of Fourth Embodiment>

In the method for producing a semiconductor device according to this fourth embodiment, after forming the gate electrode G on the SiC epitaxial substrate, the source region SR is formed in a self-aligned manner with the gate electrode G. This configuration is a production method which can be realized because the source region SR is formed from a metal material (nickel silicide).

That is, for example, in the case where the source region SR is formed from a semiconductor region composed of SiC doped with a conductive impurity, when the source region SR is formed, a high-temperature heat treatment for activating the doped impurity is required. In particular, in the case of a semiconductor material composed of SiC, for sufficiently activating the doped conductive impurity, annealing at a high temperature (about 2000° C.) is required. Therefore, in the case where the source region SR is formed after forming the gate electrode G, it is necessary to perform a high-temperature heat treatment (annealing) for activating the conductive impurity in a state where the gate electrode is formed. In this case, since the temperature exceeds the heat resistance of a gate electrode material and a gate insulating film material constituting the SiC power MOSFET, it becomes difficult to use an already established production technique for the power MOSFET. That is, in the case where a source region SR is formed in a self-aligned manner with a gate electrode G, inevitably, the source region SR is formed after forming the gate electrode G. As described above, however, in the case where the source region SR is constituted by a semiconductor region composed of SiC, an extremely high-temperature heat treatment is required, and due to this heat treatment, the gate electrode G is destroyed. Therefore, in the case where the source region SR is formed from a semiconductor region composed of SiC, it becomes difficult to form the source region SR in a self-aligned manner with the gate electrode G.

On the other hand, in the case where a metal material is used as the source region SR as described in this fourth embodiment, an activation treatment for forming the source region SR is not required, and therefore, as in the above-described production method, also in the production process for the SiC power MOSFET, the source region SR can be formed in a self-aligned manner with the gate electrode G. That is, in the case where the source region SR is constituted by a metal material (nickel silicide) as described in this fourth embodiment, in a silicidation reaction, it is not necessary to perform a heat temperature at a high temperature (about 2000° C.) which is required for the activation of a conductive impurity doped into SiC, and therefore, the source region SR can be formed after forming the gate electrode G. As described above, in this fourth embodiment, also in the case of a SiC power MOSFET, the source region SR can be formed in a self-aligned manner with the gate electrode G owing to that the source region SR is constituted by a metal material.

As a result, according to the technical idea of this fourth embodiment, advantages as described below can be obtained. A first advantage is that the method for producing a SiC power MOSFET is not limited and a SiC power MOSFET can be realized in various methods. For example, as described in the above-described first and second embodiments, a production method in which a gate electrode G is formed after forming a source region SR can also be adopted, and as described in this fourth embodiment, a production method in which a source region SR is formed after forming a gate electrode G can also be adopted. In view of this, according to the present invention, a SiC power MOSFET can be produced by a wide variety of production methods.

In particular, as described in this fourth embodiment, the source region SR can be formed in a self-aligned manner with the gate electrode G. In this case, for example, the following advantages can be obtained.

A second advantage is that, in this fourth embodiment, the source region SR can be formed in a self-aligned manner with the gate electrode G, and therefore, deterioration of the properties of the SiC power MOSFET due to a misalignment between the gate electrode G and the source region SR can be prevented. Further, according to this fourth embodiment, since a misalignment between the gate electrode G and the source region SR does not occur, there is no need to provide a marginal region in consideration of the misalignment. Due to this, according to this fourth embodiment, the area of a semiconductor chip having the SiC power MOSFET formed therein can be decreased.

A third advantage is that, since the source region SR can be formed in a self-aligned manner with the gate electrode G, an overlapping region between the gate electrode G and the source region SR can be eliminated. In other words, according to this fourth embodiment, the gate electrode G and the source region SR can be arranged such that an overlapping region between the gate electrode G and the source region SR in plan view is not formed. This means that a parasitic capacitance (a gate-source capacitance) which is formed by overlapping of the gate electrode G with the source region SR can be prevented from occurring. As a result, according to the SiC power MOSFET produced by the production method of this fourth embodiment, high performance and low parasitic capacitance can be realized. Specifically, since the parasitic capacitance can be reduced, according to the SiC power MOSFET of this fourth embodiment, for example, high frequency operation, in other words, high-speed switching operation can be performed.

Further, a fourth advantage of this fourth embodiment is that, since the source region SR composed of a metal material (a metal silicide) is formed by a silicidation reaction after forming the gate electrode G, a metal silicide film can be formed also on an upper portion of the gate electrode G by utilizing this silicidation reaction. Due to this, according to the SiC power MOSFET of this fourth embodiment, the resistance of the gate electrode G can be decreased. As described above, according to the SiC power MOSFET of this fourth embodiment, the performance thereof can be improved.

Fifth Embodiment

In a fifth embodiment of the invention, an example in which a source region SR is formed on the entire surface of the SiC epitaxial substrate will be described.

<Structure of Semiconductor Device According to Fifth Embodiment>

Figure 38:
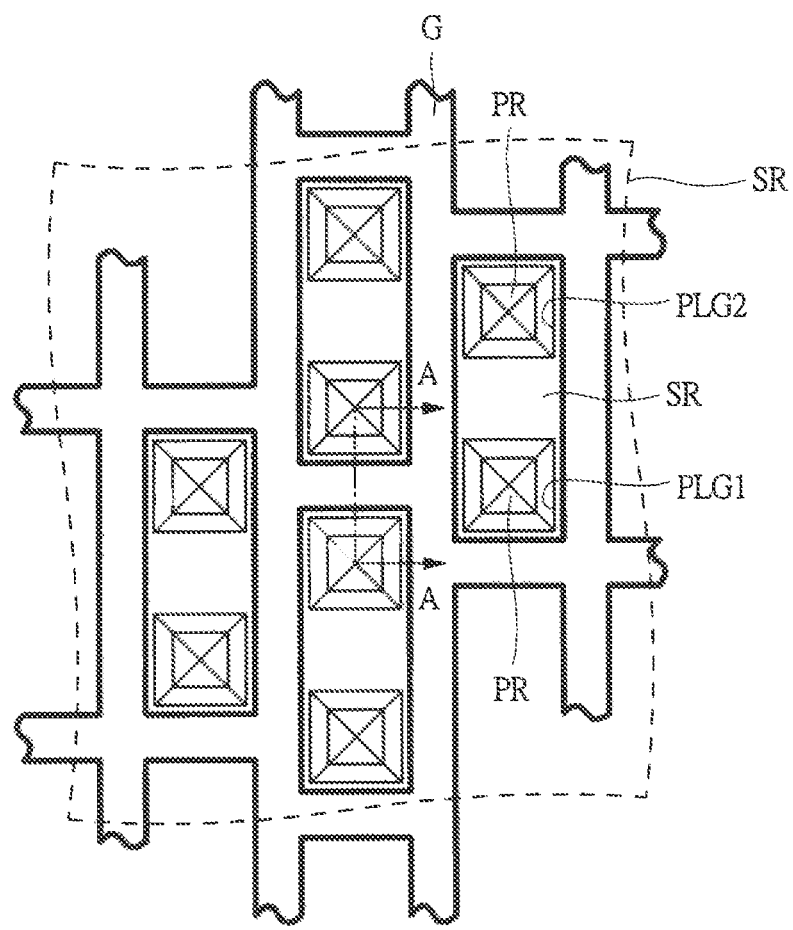
FIG. 38 is a plan view showing a layout structure of a semiconductor device according to a fifth embodiment.

FIG. 38 is a plan view showing a layout structure of a semiconductor device according to a fifth embodiment of the invention. In the layout structure shown in FIG. 38, gate electrodes G extend in the longitudinal and transverse directions, and in a region surrounded by the gate electrodes G, a basic cell having a rectangular pattern is formed.

At this time, in the fifth embodiment of the invention, a source region SR is formed on the entire surface of the SiC epitaxial substrate. That is, in FIG. 38, the source region SR is formed not only in the basic cell surrounded by the gate electrodes G, but also in a region on the upper side of the gate electrode G. Further, to the source region SR formed in the basic cell, a plug PLG1 and a plug PLG2 are electrically connected. Further, on a lower layer of the source region SR formed in the basic cell, a p$^+$-type semiconductor region PR is formed. In particular, as shown in FIG. 38, two p$^+$-type semiconductor regions PR are formed in one basic cell, and one of the p$^+$-type semiconductor regions PR is electrically connected to the plug PLG1 through the source region SR, and the other p$^+$-type semiconductor region PR is electrically connected to the plug PLG2 through the source region SR.

Here, the two p$^+$-type semiconductor regions PR are formed in one p-type well not shown in FIG. 38. Therefore, in the basic cell, the p-type well is electrically connected to the plug PLG1 through the source region SR and one of the p$^+$-type semiconductor regions PR, and also is electrically connected to the plug PLG2 through the source region SR and the other p$^+$-type semiconductor region PR.

Figure 39:
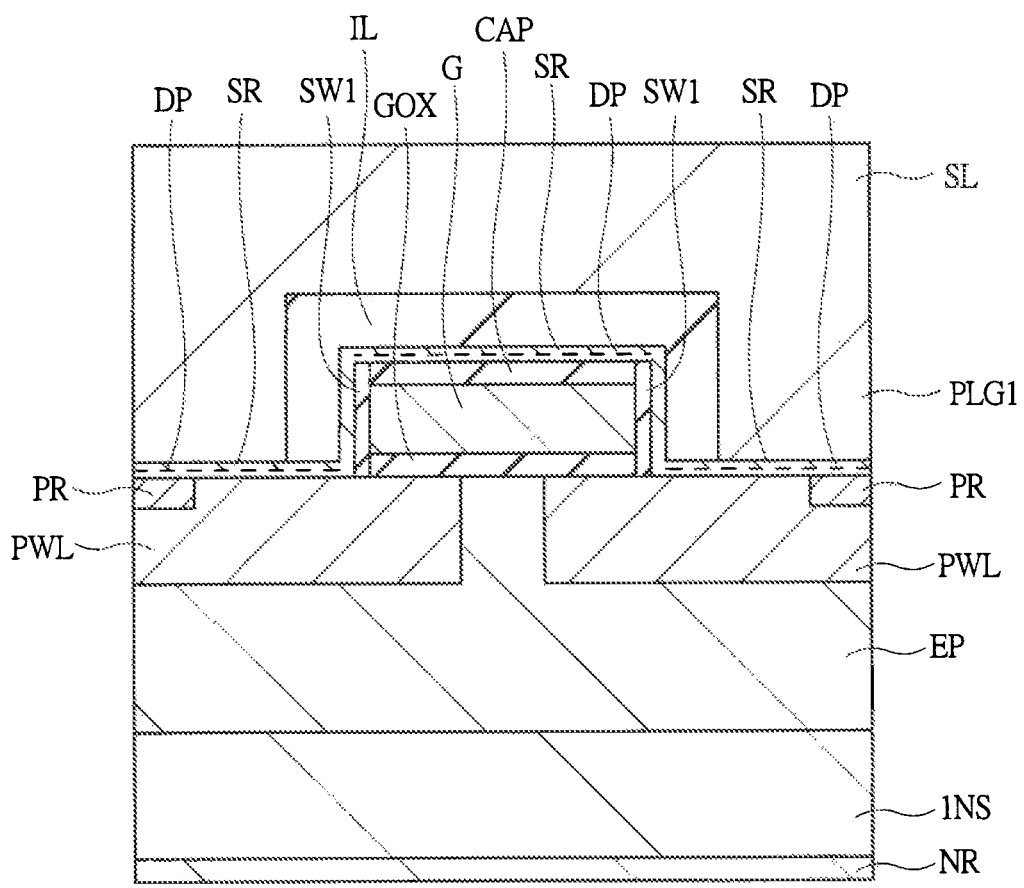
FIG. 39 is a view showing a cross-sectional structure of the semiconductor device according to the fifth embodiment, and is a cross-sectional view taken along the line A-A of FIG. 38.

FIG. 39 is a view showing a cross-sectional structure of the SiC power MOSFET according to this fifth embodiment, and shows a cross-sectional view taken along the line A-A of FIG. 38. In FIG. 39, the structure of the SiC power MOSFET according to this fifth embodiment is substantially the same as that of the SiC power MOSFET according to the above-described fourth embodiment shown in FIG. 33, and therefore, a different point will be mainly described.

As shown in FIG. 39, in the SiC power MOSFET according to this fifth embodiment, the source region SR is formed on the entire surface of the SiC epitaxial substrate having the gate electrode G formed thereon. That is, the source region SR is formed on the side surfaces and upper surface of the gate electrode G. At this time, when the source region SR and the gate electrode G come in direct contact with each other, the gate electrode G and the source region SR are short-circuited, and therefore, in this fifth embodiment, an insulating film is interposed between the source region SR and the gate electrode G. Specifically, as shown in FIG. 39, a side wall SW1 composed of an insulating film is formed on the side surfaces of the gate electrode G, and the side surfaces of the gate electrode G and the source region SR are insulated from each other by this side wall SW1. On the other hand, on the upper surface of the gate electrode G, a cap insulating film CAP is formed, and the upper surface of the gate electrode G and the source region SR are insulated from each other by this cap insulating film CAP. Accordingly, in this fifth embodiment, even in the case where the source region SR is formed on the entire surface of the SiC epitaxial substrate having the gate electrode G formed thereon, the insulation property between the gate electrode G and the source region SR can be ensured.

Further, as shown in FIG. 39, in the SiC power MOSFET according to this fifth embodiment, the source region SR is formed so as to cover the p⁺-type semiconductor region PR formed on a part of the surface of the p-type well PWL. That is, in this fifth embodiment, the source region SR and the p⁺-type semiconductor region PR are formed so as to overlap each other in plan view.

Also in the SiC power MOSFET according to this fifth embodiment configured in this manner, the source region SR is formed from a nickel silicide film which is a metal material film in the same manner as in the above-described fourth embodiment, and therefore, a source region SR having a low resistance and a large carrier density can be formed. Further, also in this fifth embodiment, the conductive impurity DP (phosphorus) is segregated at an interface between the source region SR and the p-type well PWL including the channel forming region, and therefore, the height of a Schottky barrier formed between the source region SR and the channel forming region (p-type well PWL) can be decreased. Due to this, the injection efficiency and injection rate of a carrier (electron) from an edge portion of the source region SR to the channel region can be improved, and as a result, the channel mobility in the SiC power MOSFET can be improved.

<Method for Producing Semiconductor Device According to Fifth Embodiment>

Figure 40:
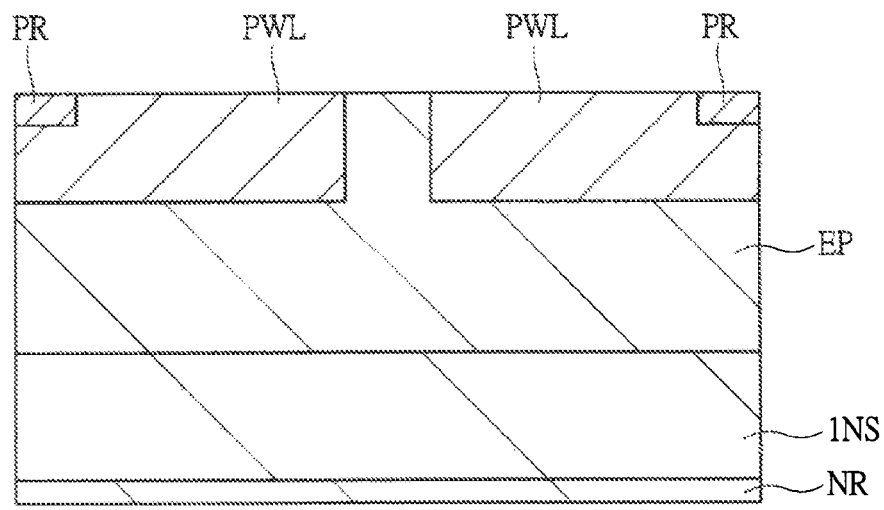
FIG. 40 is a cross-sectional view showing a process for producing the semiconductor device according to the fifth embodiment.

The semiconductor device according to this fifth embodiment is configured as described above, and hereinafter, a production method thereof will be described with reference to the accompanying drawings. Incidentally, the process until the steps shown in FIGS. 8 and 9 in this embodiment is the same as that in the above-described first embodiment, and therefore, the steps thereafter will be described. FIG. 40 is a view showing a cross-sectional structure of the SiC epitaxial substrate after the steps shown in FIGS. 8 and 9. That is, also in this fifth embodiment, all the semiconductor regions required for the SiC epitaxial substrate by the stage shown in FIG. 40 are formed.

Figure 41:
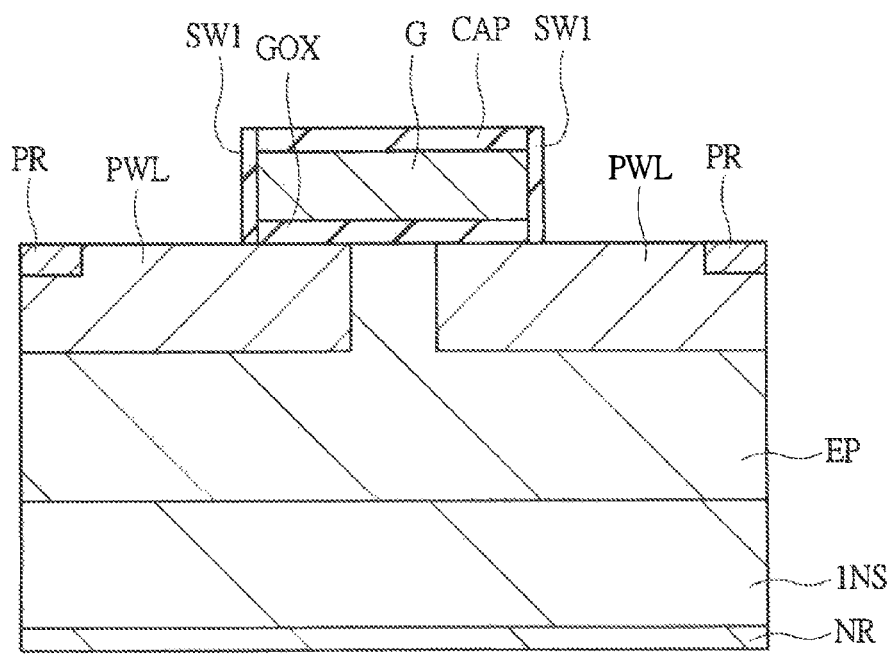
FIG. 41 is a cross-sectional view showing the process for producing the semiconductor device continued from FIG. 40.

Subsequently, as shown in FIG. 41, a gate insulating film GOX is formed on the surface of the SiC epitaxial substrate. This gate insulating film GOX is formed from, for example, a silicon oxide film, and the thickness thereof is, for example, about 55 nm. Specifically, the gate insulating film GOX can be formed by first oxidizing the surface of the SiC epitaxial substrate by a thermal oxidation method to form a silicon oxide film having a thickness of, for example, about 5 nm, and thereafter depositing a silicon oxide film having a thickness of about 50 nm by, for example, a CVD method. Thereafter, on the gate insulating film GOX, a polysilicon film containing a conductive impurity (phosphorus) at a high concentration is formed. This polysilicon film can be formed by, for example, a CVD method, and the thickness thereof is, for example, about 300 nm. Then, on this polysilicon film, for example, a silicon oxide film is formed. This silicon oxide film can be formed by, for example, a CVD method, and the thickness thereof is, for example, about 200 nm.

Subsequently, by using a photolithographic technique and an etching technique, the silicon oxide film and the polysilicon film are processed. Specifically, by patterning the silicon oxide film, the cap insulating film CAP is formed, and subsequently, by patterning the polysilicon film, the gate electrode G is formed. Then, on the SiC epitaxial substrate having the gate electrode G formed thereon, a silicon oxide film covering the gate electrode G is formed. This silicon oxide film can be formed by, for example, a CVD method, and the thickness thereof is, for example, about 10 nm. Thereafter, the deposited silicon oxide film is subjected to anisotropic etching (etching back), whereby the silicon oxide film is left only on both side surfaces of the gate electrode G. By doing this, as shown in FIG. 41, a side wall SW1 composed of the silicon oxide film can be formed on both side surfaces of the gate electrode G.

Figure 42:
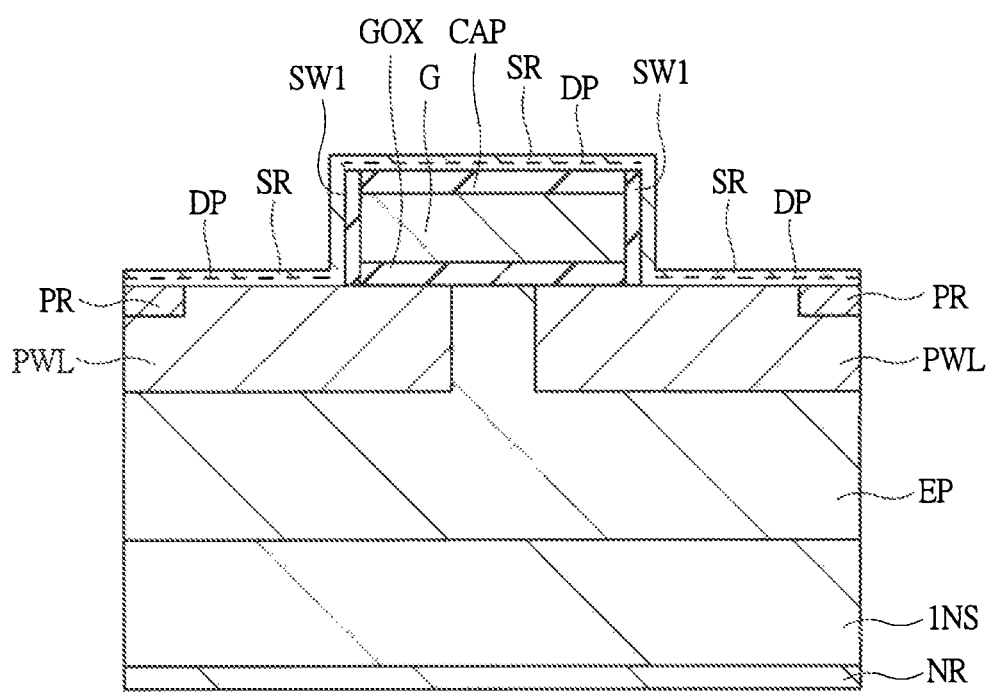
FIG. 42 is a cross-sectional view showing the process for producing the semiconductor device continued from FIG. 41.

Subsequently, as shown in FIG. 42, a polysilicon film containing a conductive impurity (phosphorus) at a high concentration is formed on the entire surface of the SiC epitaxial substrate having the cap insulating film CAP and the gate electrode G formed thereon. This polysilicon film can be formed by using, for example, a CVD method, and the thickness thereof is, for example, about 30 nm.

Subsequently, a metal film is formed on the SiC epitaxial substrate having the polysilicon film formed thereon. Specifically, as the metal film, for example, a nickel film can be formed, and the thickness thereof is, for example, about 50 nm. This nickel film can be formed by using, for example, a sputtering method. Then, by subjecting the polysilicon film and the nickel film to a silicidation reaction, the polysilicon film is completely replaced with a nickel silicide film. During this silicidation reaction, the conductive impurity DP (phosphorus) doped into the polysilicon film PF moves and aggregates at an interface with the SiC epitaxial substrate. In this manner, according to this fifth embodiment, between the nickel silicide film and the SiC epitaxial substrate, an interface at which the conductive impurity DP (phosphorus) is segregated in a self-aligned manner can be provided.

As described above, according to this fifth embodiment, a source region SR composed of a nickel silicide film can be formed, and also the conductive impurity DP (phosphorus) can be segregated at an interface between the source region SR and the p-type well PWL. Here, in this fifth embodiment, a silicidation reaction can be performed on the entire surface of the SiC epitaxial substrate, and therefore, the polysilicon film can be easily replaced with the nickel silicide film.

The steps thereafter are the same as those in the above-described first embodiment, and the SiC power MOSFET (semiconductor device) according to this fifth embodiment can be produced in the end.

<Advantage of Fifth Embodiment>

In the SiC power MOSFET according to this fifth embodiment, the source region SR composed of a metal material (a metal silicide) is formed on the entire surface of the SiC epitaxial substrate. Therefore, the planar area of the source region SR can be sufficiently increased, and due to the synergistic effect thereof with the configuration in which the source region SR is constituted by a metal material having a low resistance, the resistance of the source region SR can be decreased. At this time, in this fifth embodiment, the source region SR is formed so as to cover the gate electrode G, however, for example, as shown in FIG. 39, the side wall SW1 is formed on the side surfaces of the gate electrode G, and the cap insulating film CAP is formed on the upper surface of the gate electrode G. Therefore, according to this fifth embodiment, even in the case where the source region SR is formed on the entire surface of the SiC epitaxial substrate so as to cover the gate electrode G, the insulation property between the gate electrode G and the source region SR can be ensured, and short-circuiting between the gate electrode G and the source region SR can be reliably prevented.

Further, in this fifth embodiment, for example, as shown in FIG. 38, two p⁺-type semiconductor regions PR are formed in one basic cell surrounded by the gate electrodes G, and one of the p⁺-type semiconductor regions PR is electrically connected to the plug PLG1 through the source region SR, and the other p⁺-type semiconductor region PR is electrically connected to the plug PLG2 through the source region SR.

Here, the two p$^+$-type semiconductor regions PR are formed in one p-type well PWL not shown in FIG. 38. Therefore, in the basic cell, the p-type well PWL is electrically connected to the plug PLG1 through the source region SR and one of the p$^+$-type semiconductor regions PR, and also is electrically connected to the plug PLG2 through the source region SR and the other p$^+$-type semiconductor region PR.

As a result, according to this fifth embodiment, for example, even if conduction failure occurs in one plug among the plug PLG1 and the plug PLG2, a reference potential (a GND potential) can be supplied to the p-type well PWL by the other plug which allows electrical connection. Due to this, according to this fifth embodiment, the reliability of the SiC power MOSFET can be improved.

Specifically, in the case where there is only one plug electrically connected to the p-type well PWL, if conduction failure occurs in this plug, a reference potential is not supplied to the p-type well PWL, and the p-type well PWL is brought into a floating state. If the p-type well PWL is brought into a floating state, the potential of the p-type well PWL varies due to thermal carrier generation, or the like, and in particular, this variation in potential eliminates the built-in potential of the pn junction formed between the p-type well PWL and the epitaxial layer EP. As a result, the p-type well PWL and the epitaxial layer EP are electrically connected to each other to cause short-circuiting between the source region SR and the drain region of the SiC power MOSFET.

In view of this, in this fifth embodiment, a reference potential is supplied to the p-type well PWL by two plugs: the plug PLG1 and the plug PLG2. Due to this, even if conduction failure occurs in one of the plugs, a reference potential can be supplied to the p-type well PWL by the other plug. As a result, according to this fifth embodiment, the p-type well PWL can be prevented from being brought into a floating state, whereby the reliability of the SiC power MOSFET can be improved.

Sixth Embodiment

In a sixth embodiment of the invention, an example in which a source region SR is formed inside a ditch formed in the SiC epitaxial substrate will be described.

<Structure of Semiconductor Device According to Sixth Embodiment>

Figure 43:
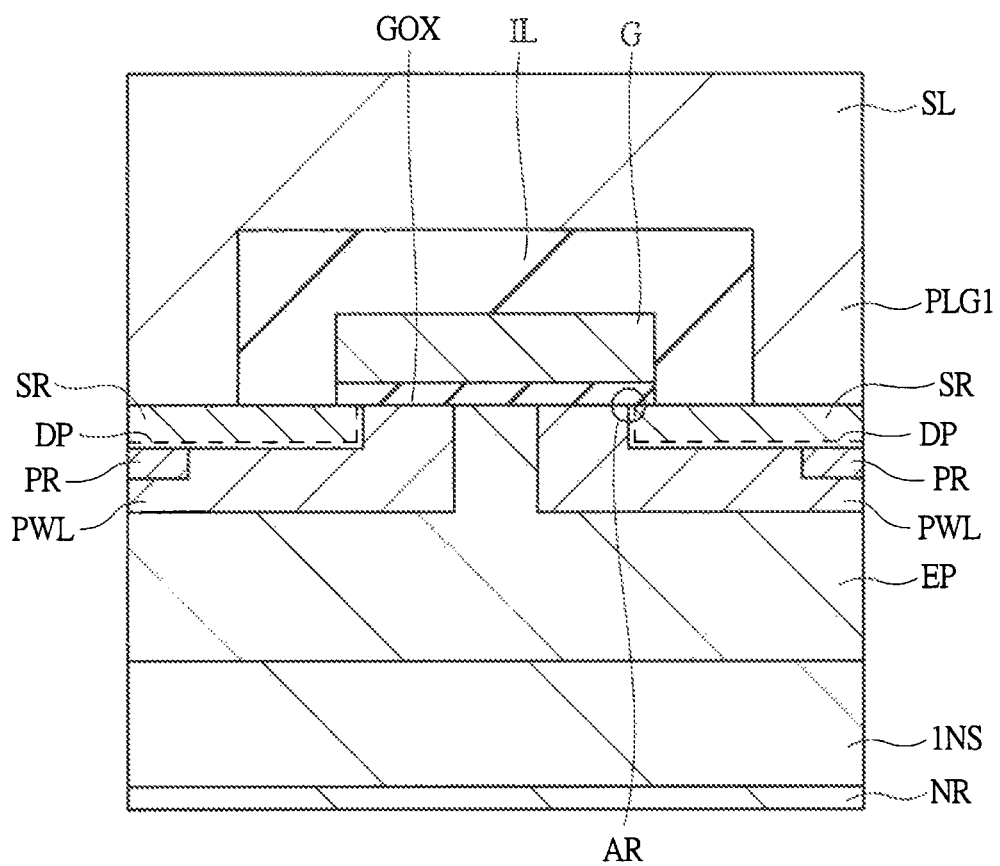
FIG. 43 is a cross-sectional view showing a structure of a semiconductor device according to a sixth embodiment.

FIG. 43 is a cross-sectional view showing a structure of a SiC power MOSFET according to a sixth embodiment of the invention. As shown in FIG. 43, the SiC power MOSFET according to this sixth embodiment has, for example, a semiconductor substrate 1NS composed of SiC doped with an n-type impurity such as nitrogen (N), and on the back surface (lower surface) of this semiconductor substrate, an n$^+$-type semiconductor region NR doped with an n-type impurity at a higher concentration than that of the n-type impurity doped into the semiconductor substrate 1NS is formed.

On the other hand, on the front surface (upper surface) of the semiconductor substrate 1NS, an epitaxial layer EP is formed. This epitaxial layer EP is also called a drift layer and is constituted by SiC doped with an n-type impurity such as nitrogen (N). The impurity concentration of the n-type impurity doped into the epitaxial layer EP is lower than that of the n-type impurity doped into the semiconductor substrate 1NS, and the epitaxial layer EP is formed for ensuring the voltage resistance of the SiC power MOSFET.

Subsequently, on the epitaxial layer EP, for example, a p-type well PWL composed of SiC doped with a p-type impurity such as aluminum (Al) is formed so as to be in contact with the epitaxial layer EP. On the p-type well PWL, a ditch is formed, and a source region SR is buried in this ditch. This source region SR is constituted by a metal material, and for example, formed from a metal silicide represented by nickel silicide.

Further, in the p-type well PWL on the lower layer of the source region SR, a p$^+$-type semiconductor region PR is formed. This p$^+$-type semiconductor region PR is doped with a p-type impurity at a higher concentration than that of the p-type impurity doped into the p-type well PWL. This p$^+$-type semiconductor region PR is provided for stably supplying a potential to the p-type well PWL.

On the transverse direction of the FIG. 43, a surface region of the p-type well PWL sandwiched by the source region SR and the epitaxial layer EP becomes a channel forming region, and a gate insulating film GOX composed of, for example, a silicon oxide film is formed so as to cover the surface region of this channel forming region and the epitaxial layer EP. Further, on the gate insulating film GOX, a gate electrode G composed of, for example, a polysilicon film is formed.

Here, also in this sixth embodiment, the conductive impurity DP is segregated at an interface between the source region SR composed of, for example, nickel silicide and the p-type well PWL. That is, also in this sixth embodiment, as indicated by a dashed line in FIG. 43, the conductive impurity DP is doped at an interface between the source region SR and the p-type well PWL. More specifically, the conductive impurity DP is doped at an interface between the source region SR and the channel forming region in the p-type well PWL. At this time, the conductive impurity DP may be either an n-type impurity or a p-type impurity.

Subsequently, as shown in FIG. 43, an interlayer insulating film IL composed of, for example, a silicon oxide film is formed so as to cover the gate electrode G and a part of the source region SR, and in this interlayer insulating film IL, an opening is formed. From this opening, a part of the source region SR is exposed, and in the opening, for example, an aluminum film is buried, whereby a plug PLG1 is formed. This plug PLG1 is electrically connected to the source region SR, and from a source line SL formed on the plug PLG1, a reference potential (a GND potential) is supplied to the source region SR through the plug PLG1.

Here, also in this sixth embodiment, the source region SR is constituted by a metal material (a metal silicide). Due to this, the source region SR and the p$^+$-type semiconductor region PR can be electrically connected to each other. That is, also in this sixth embodiment, since the source region SR is constituted by a metal material, a pn junction is not formed in a boundary region between the source region SR and the p$^+$-type semiconductor region PR, and a metal-semiconductor contact can be formed. At this time, since the concentration of the conductive impurity doped into the p$^+$-type semiconductor region PR is high, an ohmic contact can be formed between the source region SR and the p$^+$-type semiconductor region PR. As a result, the source region SR and the p$^+$-type semiconductor region PR are electrically connected to each other. Accordingly, the p$^+$-type semiconductor region PR and the plug PLG1 can be electrically connected to each other through the source region SR. Due to this, to the p-type well PWL, a reference potential is stably supplied from the source line SL through the plug PLG1, the source region SR, and the p$^+$-type semiconductor region PR.

Also in the SiC power MOSFET according to this sixth embodiment configured in this manner, the source region SR is formed from a nickel silicide film which is a metal material film in the same manner as in the above-described first embodiment, and therefore, a source region SR having a low resistance and a large carrier density can be formed. Further, also in this sixth embodiment, the conductive impurity DP (phosphorus) is segregated at an interface between the source region SR and the p-type well PWL including the channel forming region, and therefore, the height of a Schottky barrier formed between the source region SR and the channel forming region (p-type well PWL) can be decreased. Due to this, the injection efficiency and injection rate of a carrier (electron) from an edge portion of the source region SR to the channel region can be improved, and as a result, the channel mobility in the SiC power MOSFET can be improved. The SiC power MOSFET according to this sixth embodiment is configured as described above.

<Method for Producing Semiconductor Device According to Sixth Embodiment>

Figure 44:
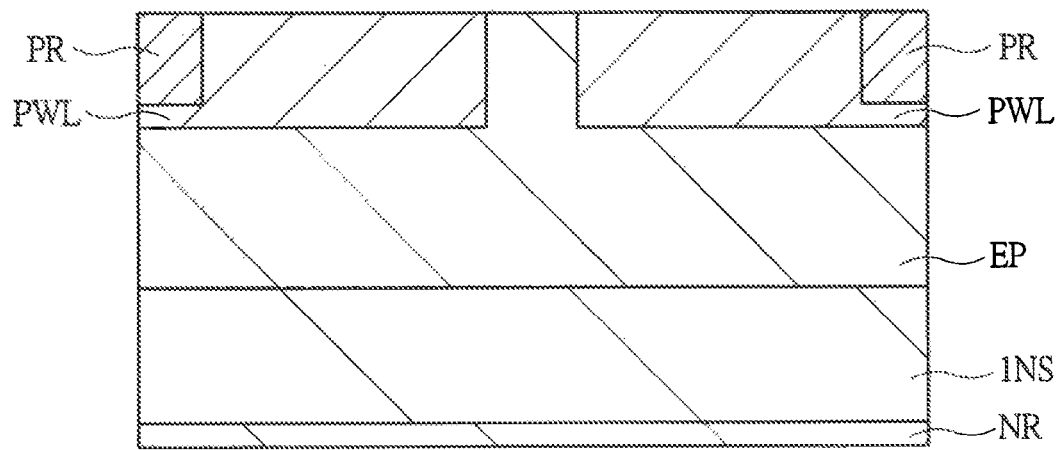
FIG. 44 is a cross-sectional view showing a process for producing the semiconductor device according to the sixth embodiment.

The semiconductor device according to this sixth embodiment is configured as described above, and hereinafter, a production method thereof will be described with reference to the accompanying drawings. Incidentally, the process until the steps shown in FIGS. 8 and 9 in this embodiment is the same as that in the above-described first embodiment, and therefore, the steps thereafter will be described. FIG. 44 is a view showing a cross-sectional structure of the SiC epitaxial substrate after the steps shown in FIGS. 8 and 9. That is, also in this sixth embodiment, all the semiconductor regions required for the SiC epitaxial substrate by the stage shown in FIG. 44 are formed. At this time, in FIG. 44, unlike the case shown in FIG. 9, the p$^+$-type semiconductor region PR is formed deep to a depth of about 300 nm from the surface of the SiC epitaxial substrate.

Figure 45:
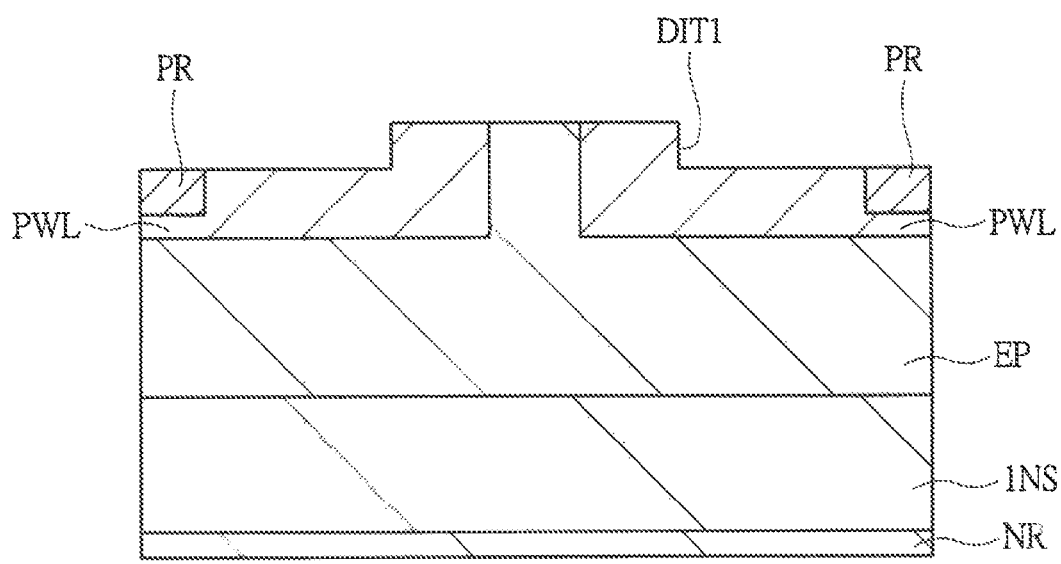
FIG. 45 is a cross-sectional view showing the process for producing the semiconductor device continued from FIG. 44.

Subsequently, as shown in FIG. 45, a silicon oxide film is formed on the SiC epitaxial substrate. This silicon oxide film can be formed by using, for example, a CVD method, and the thickness thereof is, for example, about 1 µm. Then, by using a photolithographic technique and an etching technique, the silicon oxide film is patterned. The patterning of the silicon oxide film is performed such that a source forming region is exposed. Thereafter, by using the patterned silicon oxide film as a hard mask, the surface of the SiC epitaxial substrate is etched, whereby a ditch DIT1 is formed on the surface of the SiC epitaxial substrate. The depth of this ditch DIT1 is, for example, about 50 nm. At this time, in a bottom portion of the ditch DIT1, a part of the p-type well PWL and the p$^+$-type semiconductor region PR are exposed.

Figure 46:
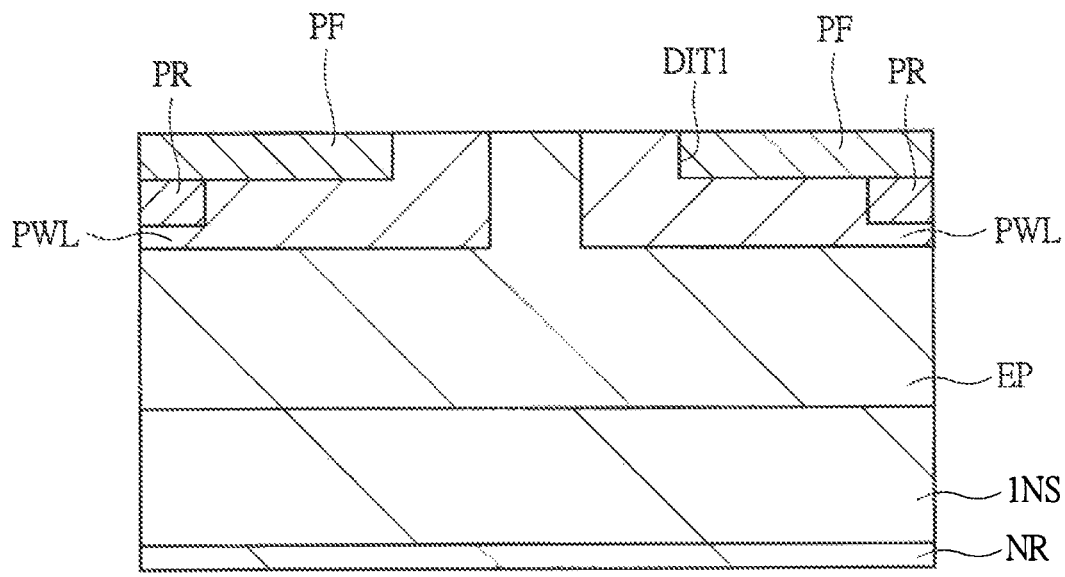
FIG. 46 is a cross-sectional view showing the process for producing the semiconductor device continued from FIG. 45.

Subsequently, as shown in FIG. 46, a polysilicon film PF containing a conductive impurity (phosphorus) is deposited on the SiC epitaxial substrate having the ditch DIT1 formed thereon. At this time, the polysilicon film PF is formed such that it is buried in the ditch DIT1. This polysilicon film PF can be formed by using, for example, a CVD method, and the thickness thereof is, for example, about 50 nm. Thereafter, by using a CMP method, the polysilicon film PF is polished until the surface of the SiC epitaxial substrate is exposed. By doing this, only the polysilicon film PF buried in the ditch DIT1 formed on the SiC epitaxial substrate can be formed.

Figure 47:
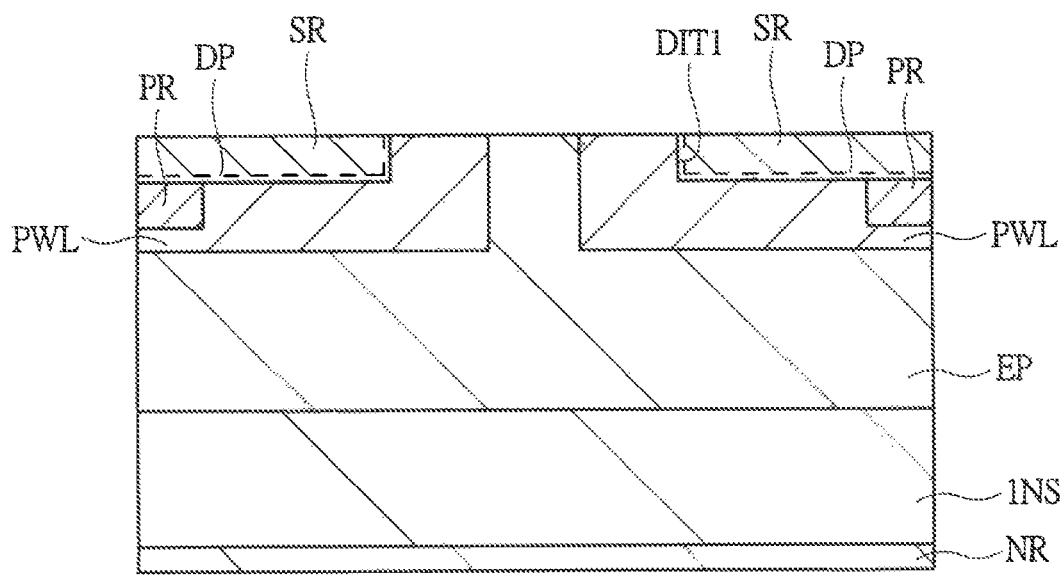
FIG. 47 is a cross-sectional view showing the process for producing the semiconductor device continued from FIG. 46.

Subsequently, as shown in FIG. 47, a metal film is formed on the surface of the SiC epitaxial substrate having the ditch DIT1 in which the polysilicon film PF is buried. Specifically, as the metal film, for example, a nickel film can be formed, and the thickness thereof is, for example, about 50 nm. This nickel film can be formed by using, for example, a sputtering method.

Subsequently, a silicidation reaction between the polysilicon film PF and the nickel film is performed by applying a heat treatment at 320° C. for 60 seconds as first annealing (a first heat treatment) to the SiC epitaxial substrate. In such a low-temperature treatment, the nickel film does not react with SiC, and therefore, only the polysilicon film PF and the nickel film can be reacted with each other. Then, the unreacted nickel film is removed with a mixed liquid of sulfuric acid and hydrogen peroxide, and thereafter as second annealing (a second heat treatment), a heat treatment at 500° C. for 30 seconds is performed. By doing this, a nickel silicide film formed on the surface of the polysilicon film PF is allowed to grow, whereby the polysilicon film PF is completely replaced with a nickel silicide film. In such a low-temperature treatment, the nickel film does not react with SiC, and therefore, a silicidation reaction with the polysilicon film PF proceeds, and when the reaction reaches the SiC epitaxial substrate, the silicidation reaction stops. During this silicidation reaction, the conductive impurity DP (phosphorus) doped into the polysilicon film PF moves and aggregates at an interface with the SiC epitaxial substrate. In this manner, according to this sixth embodiment, in a boundary region between the nickel silicide film and the p-type well PWL, an interface at which the conductive impurity DP (phosphorus) is segregated in a self-aligned manner can be provided. As described above, according to this sixth embodiment, a source region SR composed of a nickel silicide film can be formed, and also the conductive impurity DP (phosphorus) can be segregated at an interface between the source region SR and the p-type well PWL.

Here, also in this sixth embodiment, the source region SR is constituted by a metal material, and into the p$^+$-type semiconductor region PR, a p-type impurity is doped at a high concentration, and therefore, an ohmic contact can be formed between the source region SR and the p$^+$-type semiconductor region PR. As a result, the source region SR and the p$^+$-type semiconductor region PR can be electrically connected to each other.

Subsequently, as shown in FIG. 43, a gate insulating film GOX is formed on the surface of the SiC epitaxial substrate having the source region SR formed, thereon. This gate insulating film GOX is formed from, for example, a silicon oxide film, and can be formed by using, for example, a CVD method. The thickness of the gate insulating film GOX is, for example, about 50 nm. Thereafter, on the gate insulating film GOX, a polysilicon film containing phosphorus at a high concentration is formed. This polysilicon film is formed by using, for example, a CVD method, and the thickness thereof is about 300 nm.

Then, by using a photolithographic technique and an etching technique, the polysilicon film is patterned, whereby a gate electrode G is formed. At this time, when the gate electrode G is formed by processing the polysilicon film, the gate insulating film GOX is exposed in a region where the polysilicon film is removed. This exposed gate insulating film GOX may be removed or, may be left as such at this stage since it can also be processed simultaneously with an interlayer insulating film made of the same material as the gate insulating film in a later step.

Incidentally, in this sixth embodiment, an example in which a silicon oxide film is used as the gate insulating film GOX and a polysilicon film is used as the gate electrode G is described, however, the source region SR composed of a metal material (a nickel silicide film) and the semiconductor region in the SiC epitaxial substrate have already been formed and a large heat load is not applied, and therefore, it is also possible to form the gate insulating film GOX from a high-dielectric constant film having a higher dielectric constant than the silicon oxide film, and to form the gate electrode G from a metal material film made of aluminum (Al) or the like.

Subsequently, an interlayer insulating film IL is formed on the SiC epitaxial substrate having the gate electrode G formed thereon. This interlayer insulating film IL is formed so as to cover a part of the source region SR and the gate electrode G, and is formed from, for example, a silicon oxide film. Thereafter, by using a photolithographic technique and an etching technique, an opening (a contact hole) is formed in the interlayer insulating film IL. This opening is formed so as to expose a part of the source region SR and the p$^+$-type semiconductor region PR. Although not shown in FIG. 43, it is also possible to form an opening reaching the gate electrode G.

Subsequently, for example, by using a sputtering method, an aluminum film is formed on the interlayer insulating film IL having the opening therein. The thickness of this aluminum film is, for example, 2 µm. At this time, by burying the aluminum film in the opening formed in the interlayer insulating film IL, a plug PLG1 is formed. Then, by using a photolithographic technique and an etching technique, this aluminum film is patterned, whereby a source line SL electrically connected to this plug PLG1 is formed.

The steps after this line forming step can be performed by a known semiconductor process, and the SiC power MOSFET (semiconductor device) according to this sixth embodiment can be produced in the end.

<Advantage of Sixth Embodiment>

In this sixth embodiment, a ditch is formed on the surface of the SiC epitaxial substrate, and the source region SR is formed such that it is buried in this ditch. Due to this, in this sixth embodiment, for example, as shown in FIG. 43, the surface of the SIC epitaxial substrate and the surface of the source region SR can be made substantially flush. As a result, even in the case where an overlapping region is formed between the gate electrode G and the source region SR, an angular part is not formed in a region AR in FIG. 43. For example, in a region AR in FIG. 7, an angular part is formed. In this case, at the angular part, an electric field is concentrated, and breakdown may occur in the gate insulating film GOX. On the other hand, in this sixth embodiment, as shown in the region AR in FIG. 43, an angular part is not formed. Therefore, according to this sixth embodiment, electric field concentration at an angular part can be suppressed. Due to this, according to this sixth embodiment, an advantage that a SiC power MOSFET having high reliability can be provided is obtained.

<Modification Example>

Figure 48:
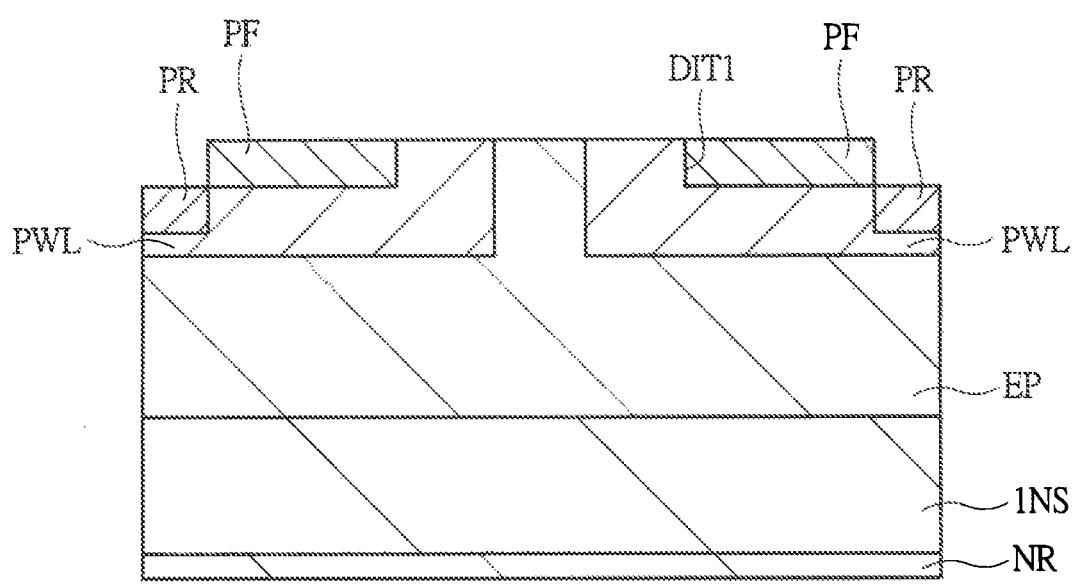
FIG. 48 is a cross-sectional view showing a process for producing a semiconductor device according to a modification example.
Figure 49:
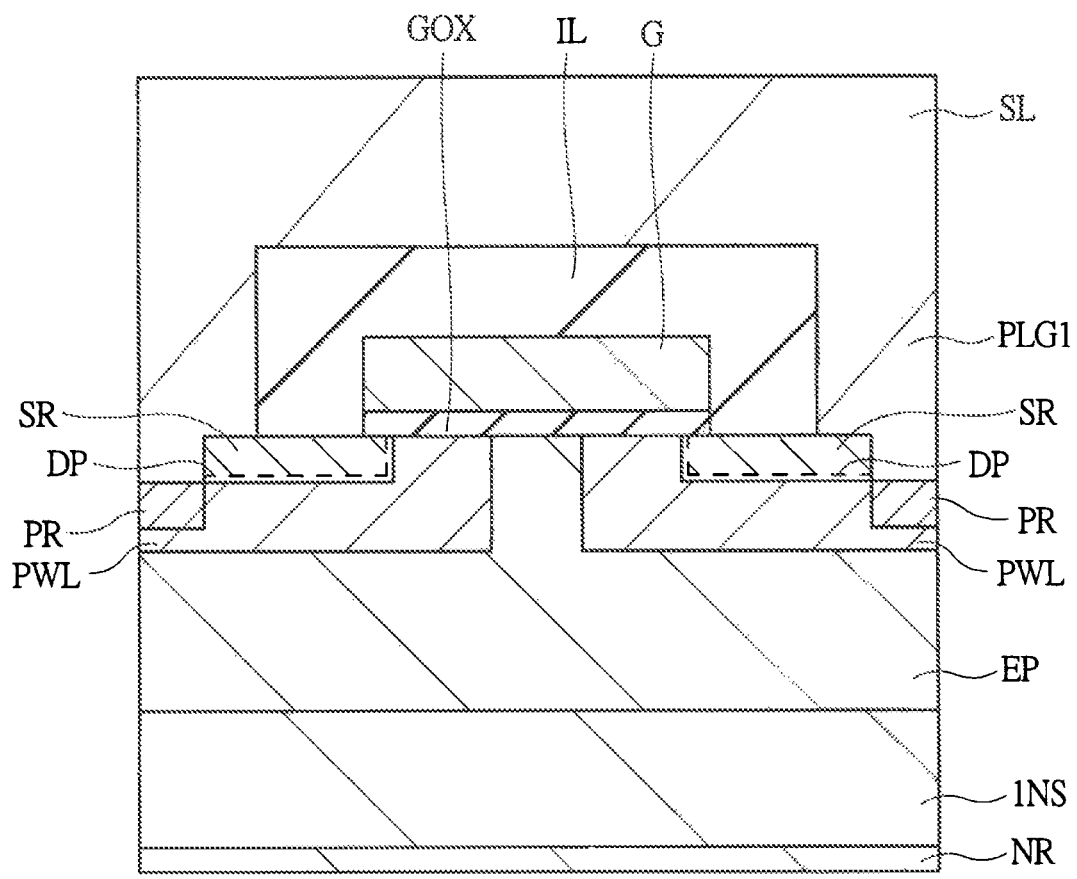
FIG. 49 is a cross-sectional view showing a structure of a semiconductor device according to a modification example.

Incidentally, as shown in FIG. 46, after burying the polysilicon film PF in the ditch DIT1 formed on the SiC epitaxial substrate, the buried polysilicon film PF can be patterned by using a photolithographic technique and an etching technique. The patterning of the polysilicon film PF is performed such that the p$^+$-type semiconductor region PR is exposed as shown in FIG. 48. The steps thereafter are the same as those in the above-described sixth embodiment, and it is also possible to produce a SiC power MOSFET according to this modification example as shown in FIG. 49 in the end. In this case, it is configured such that the plug PLG1 is in direct contact with both of the source region SR and the p$^+$-type semiconductor region PR.

Figure 50:
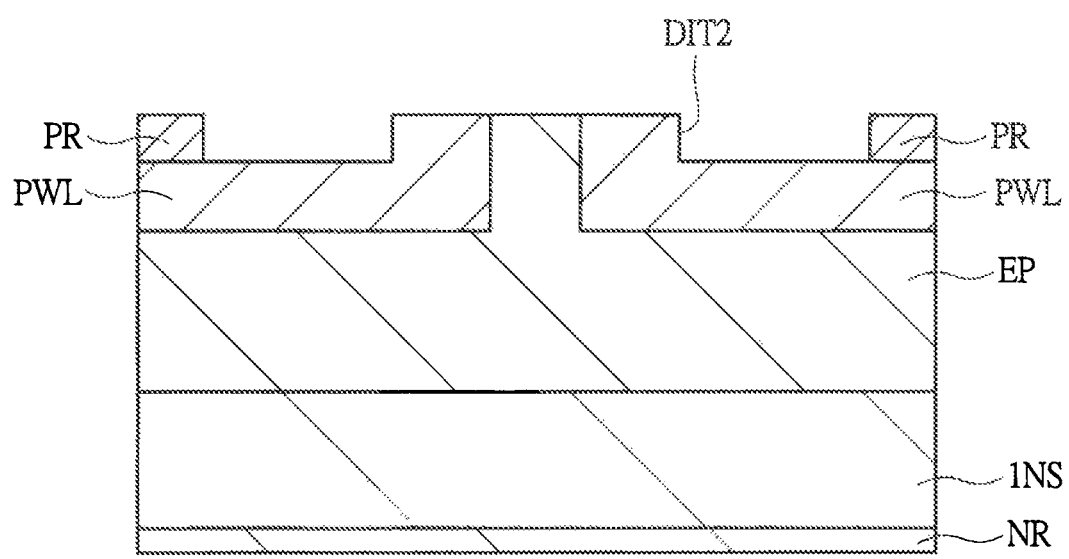
FIG. 50 is a cross-sectional view showing a process for producing a semiconductor device according to a modification example.
Figure 51:
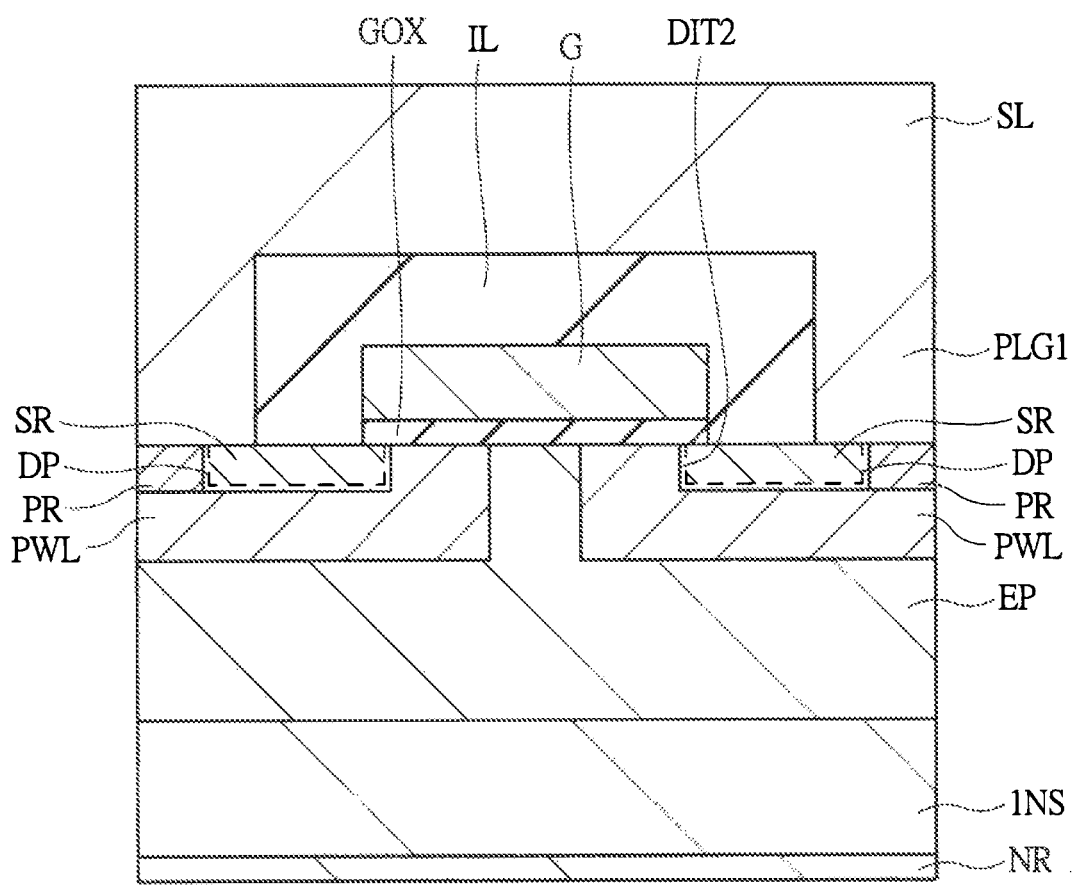
FIG. 51 is a cross-sectional view showing a structure of a semiconductor device according to a modification example.

Further, it is also possible to form a ditch DIT2 as shown in FIG. 50 in place of the ditch DIT1 shown in FIG. 45. In this case, the p$^+$-type semiconductor region PR can be formed on the surface of the SiC epitaxial substrate, and therefore, an advantage that the formation of the p$^+$-type semiconductor region PR is facilitated can be obtained. That is, as shown in FIG. 45, in the case where the p$^+$-type semiconductor region PR is formed so as to be exposed on the bottom surface of the ditch DIT1, it is necessary to form the p$^+$-type semiconductor region PR deep to such an extent as shown in FIG. 44. However, in the case where the structure shown in FIG. 50 is adopted, it is not necessary to form the p$^+$-type semiconductor region PR deep to such an extent as shown in FIG. 44, and therefore, the formation of the p$^+$-type semiconductor region PR is facilitated. The steps thereafter are the same as those in the above-described sixth embodiment, and it is also possible to produce the SiC power MOSFET according to this modification example as shown in FIG. 51 in the end. In this case, it is configured such that the plug PLG1 is in direct contact with both of the source region SR and the p$^+$-type semiconductor region PR.

Seventh Embodiment

In a seventh embodiment of the invention, an example in which a source region SR is formed inside a ditch formed in the SiC epitaxial substrate and the source region SR is formed in a self-aligned manner with a gate electrode G will be described.

<Structure of Semiconductor Device According to Seventh Embodiment>

Figure 52:
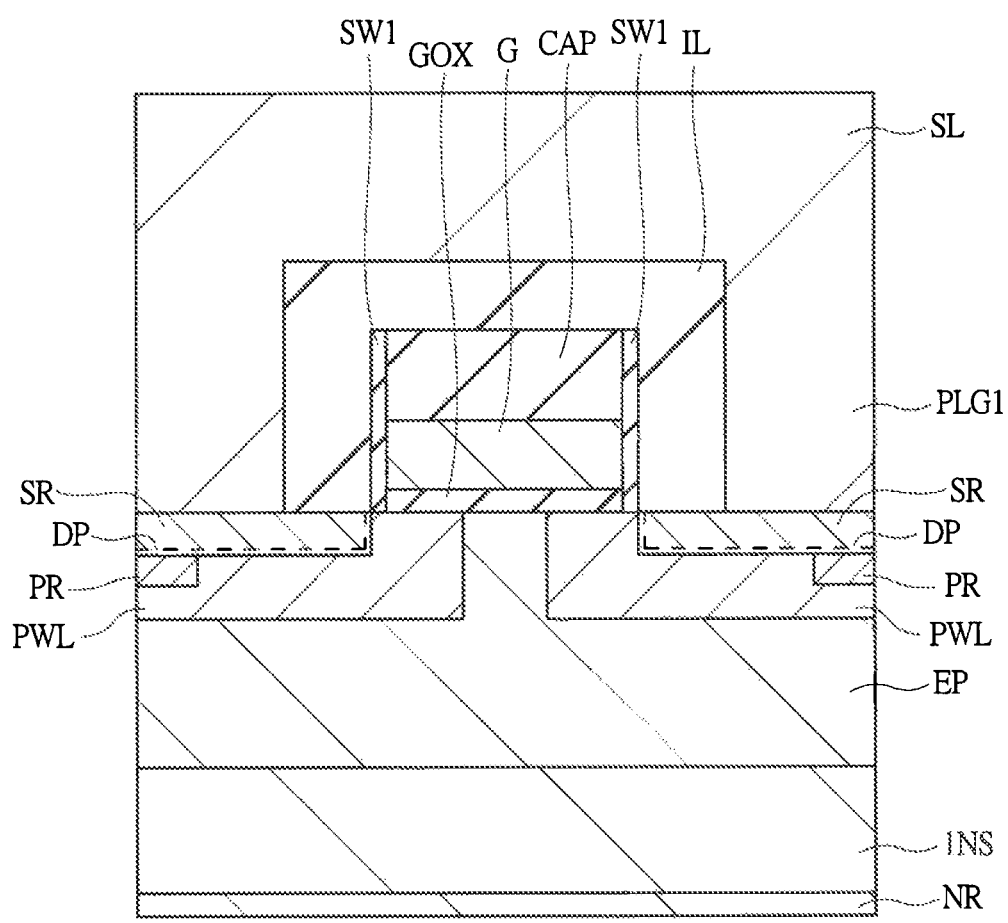
FIG. 52 is a view showing a cross-sectional structure of a semiconductor device according to a seventh embodiment.

FIG. 52 is a view showing a cross-sectional structure of a SiC power MOSFET according to a seventh embodiment of the invention. In FIG. 52, the structure of the SiC power MOSFET according to this seventh embodiment is substantially the same as that of the SiC power MOSFET according to the above-described sixth embodiment shown in FIG. 43, and therefore, a different point will be mainly described.

In FIG. 52, in the SiC power MOSFET according to this seventh embodiment, on a gate electrode G, a cap insulating film CAP composed of, for example, a silicon oxide film is formed, and on both side walls of the gate electrode G and the cap insulating film CAP, for example, a side wall SW1 composed of, for example, a silicon oxide film is formed.

Incidentally, also in this seventh embodiment, in the same manner as in the above-described sixth embodiment, a ditch is formed in a p-type well PWL, and a source region SR is buried in the ditch. This source region SR is constituted by a metal material, and is formed from, for example, a metal silicide represented by nickel silicide.

Also in the SiC power MOSFET according to this seventh embodiment configured in this manner, the source region SR is formed from a nickel silicide film which is a metal material film in the same manner as in the above-described first embodiment, and therefore, a source region SR having a low resistance and a large carrier density can be formed. Further, also in this seventh embodiment, the conductive impurity DP (phosphorus) is segregated at an interface between the source region SR and the p-type well PWL including the channel forming region, and therefore, the height of a Schottky barrier formed between the source region SR and the channel forming region (p-type well PWL) can be decreased. Due to this, the injection efficiency and injection rate of a carrier (electron) from an edge portion of the source region SR to the channel region can be improved, and as a result, the channel mobility in the SiC power MOSFET can be improved. The SiC power MOSFET according to this seventh embodiment is configured as described above.

The SiC power MOSFET according to this seventh embodiment shown in FIG. 52 and the SiC power MOSFET according to the above-described sixth embodiment shown in FIG. 43 are different in terms of the production method. Specifically, the SiC power MOSFET according to the above-described sixth embodiment is produced by a so-called gate-last process in which the gate electrode G is formed after forming the source region SR. On the other hand, the SiC power MOSFET according to this seventh embodiment is produced by a so-called gate-first process in which after forming the gate electrode G, the source region SR is formed in a self-aligned manner with the gate electrode G.

<Method for Producing Semiconductor Device According to Seventh Embodiment>

Hereinafter, the method for producing a semiconductor device (a SiC power MOSFET) according to this seventh embodiment will be described with reference to the accompanying drawings. Incidentally, the process until the step shown in FIG. 44 in this embodiment is the same as that in the above-described sixth embodiment, and therefore, the steps thereafter will be described.

Figure 53:
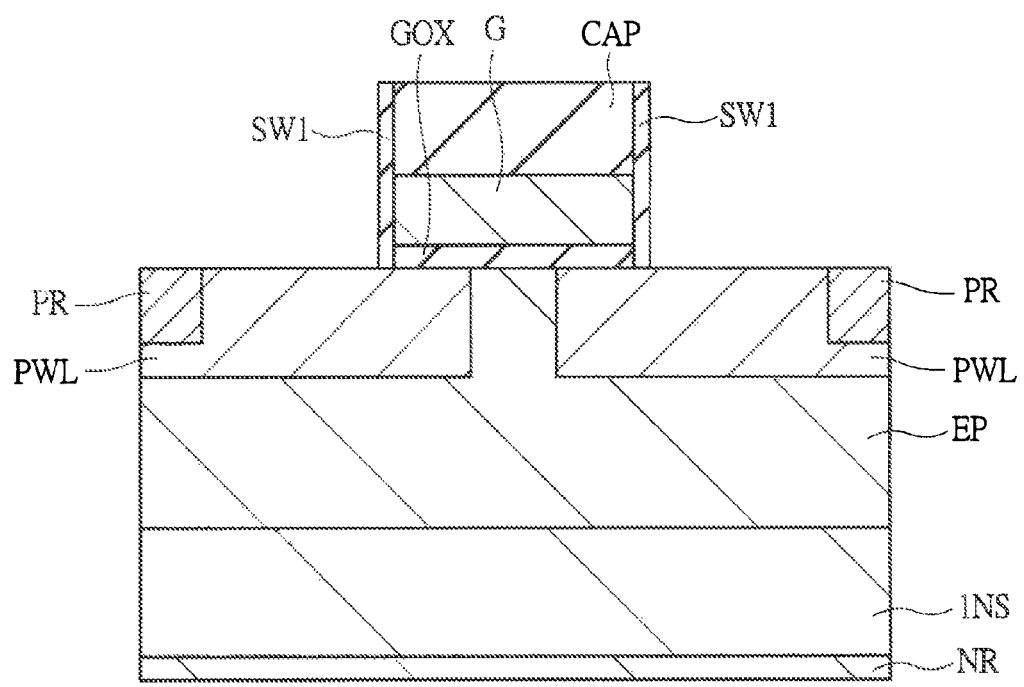
FIG. 53 is a cross-sectional view showing a process for producing the semiconductor device according to the seventh embodiment.

First, as shown in FIG. 53, a gate insulating film GOX is formed on the surface of the SiC epitaxial substrate. This gate insulating film GOX is formed from, for example, a silicon oxide film, and the thickness thereof is, for example, about 55 nm. Specifically, the gate insulating film GOX can be formed by first oxidizing the surface of the SiC epitaxial substrate by a thermal oxidation method to form a silicon oxide film having a thickness of, for example, about 5 nm, and thereafter depositing a silicon oxide film having a thickness of about 50 nm by, for example, a CVD method. Thereafter, on the gate insulating film GOX, a polysilicon film containing a conductive impurity (phosphorus) at a high concentration is formed. This polysilicon film can be formed by, for example, a CVD method, and the thickness thereof is, for example, about 300 nm. Then, on this polysilicon film, for example, a silicon oxide film is formed. This silicon oxide film can be formed by, for example, a CVD method, and the thickness thereof is, for example, about 200 nm.

Subsequently, by using a photolithographic technique and an etching technique, the silicon oxide film and the polysilicon film are processed. Specifically, by patterning the silicon oxide film, a cap insulating film CAP is formed, and subsequently, by patterning the polysilicon film, a gate electrode G is formed. Then, on the SC epitaxial substrate having the gate electrode G formed thereon, a silicon oxide film covering the cap insulating film CAP and the gate electrode G is formed. This silicon oxide film can be formed by, for example, a CVD method, and the thickness thereof is, for example, about 10 nm. Thereafter, the deposited silicon oxide film is subjected to anisotropic etching (etching back), whereby the silicon oxide film is left from both side surfaces of the cap insulating film CAP to both side surfaces of the gate electrode G. By doing this, as shown in FIG. 53, a side wall SW1 composed of the silicon oxide film can be formed from both side surfaces of the cap insulating film CAP to both side surfaces of the gate electrode G.

Figure 54:
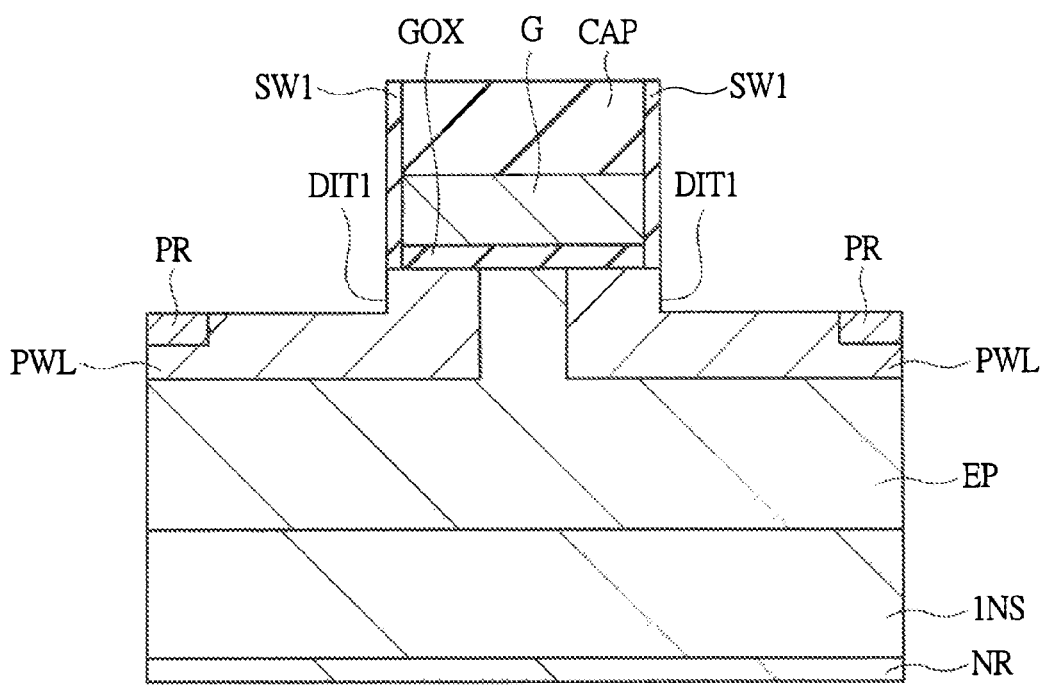
FIG. 54 is a cross-sectional view showing the process for producing the semiconductor device continued from FIG. 53.

Subsequently, as shown in FIG. 54, by using the gate electrode G and the side wall SW1 as a mask, the SiC epitaxial substrate is etched, whereby a ditch DIT1 is formed on the surface of the SiC epitaxial substrate. By doing this, the ditch DIT1 can be formed in a self-aligned manner with the gate electrode G.

Figure 55:
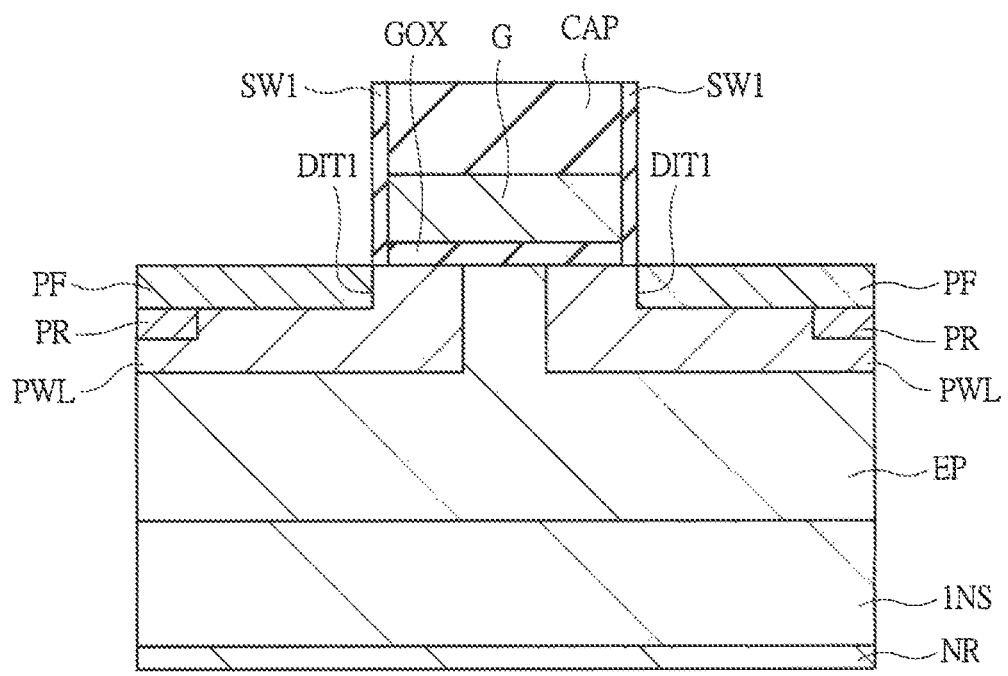
FIG. 55 is a cross-sectional view showing the process for producing the semiconductor device continued from FIG. 54.

Thereafter, as shown in FIG. 55, on the SiC epitaxial substrate having the gate electrode G and the cap insulating film CAP formed thereon, a polysilicon film doped with a conductive impurity (phosphorus) at a high concentration is deposited thick so as to cover the cap insulating film CAP. This polysilicon film can be formed by using, for example, a CVD method. Then, by using a CMP method, the surface of the polysilicon film deposited thick is flattened, followed by etching back, whereby the polysilicon film is buried only in the ditch DIT1 formed on the SiC epitaxial substrate.

Subsequently, a metal film is formed on the surface of the SiC epitaxial substrate having the ditch DIT1 in which the polysilicon film is buried. Specifically, as the metal film, for example, a nickel film can be formed, and the thickness thereof is, for example, about 50 nm. This nickel film can be formed by using, for example, a sputtering method.

Subsequently, a silicidation reaction between the polysilicon film and the nickel film is performed by applying a heat treatment at 320° C. for 60 seconds as first annealing (a first heat treatment) to the SiC epitaxial substrate. In such a low-temperature treatment, the nickel film does not react with SiC, and therefore, only the polysilicon film and the nickel film can be reacted with each other. Then, the unreacted nickel film is removed with a mixed liquid of sulfuric acid and hydrogen peroxide, and thereafter as second annealing (a second heat treatment), a heat treatment at 500° C. for 30 seconds is performed. By doing this, a nickel silicide film formed on the surface of the polysilicon film is allowed to grow, whereby the polysilicon film is completely replaced with a nickel silicide film. In such a low-temperature treatment, the nickel film does not react with SiC, and therefore, a silicidation reaction with the polysilicon film proceeds, and when the reaction reaches the SiC epitaxial substrate, the silicidation reaction stops. During this silicidation reaction, the conductive impurity DP (phosphorus) doped into the polysilicon film moves and aggregates at an interface with the SiC epitaxial substrate. In this manner, according to this seventh embodiment, in a boundary region between the nickel silicide film and the p-type well PWL, an interface at which the conductive impurity DP (phosphorus) is segregated in a self-aligned manner can be provided. As described above, according to this seventh embodiment, a source region SR composed of a nickel silicide film can be formed in a self-aligned manner with the gate electrode G, and also the conductive impurity DP (phosphorus) can be segregated at an interface between the source region SR and the p-type well PWL.

Here, also in this seventh embodiment, the source region SR is constituted by a metal material, and into the $p^+$-type semiconductor region PR, a p-type impurity is doped at a high concentration, and therefore, an ohmic contact can be formed between the source region SR and the $p^+$-type semiconductor region PR. As a result, the source region SR and the $p^+$-type semiconductor region PR can be electrically connected to each other.

The steps thereafter are the same as those in the above-described sixth embodiment, and the SiC power MOSFET (semiconductor device) according to this seventh embodiment as shown in FIG. 52 can be produced in the end by a useful self-alignment process.

<Modification Example>

Figure 56:
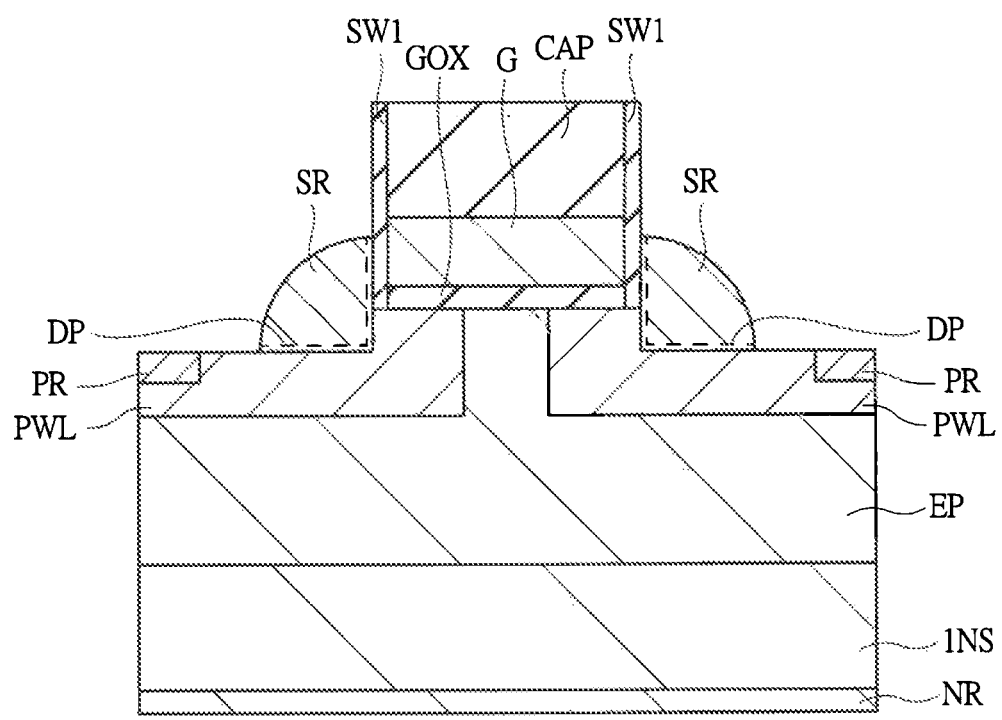
FIG. 56 is a cross-sectional view showing a process for producing a semiconductor device according to a modification example.
Figure 57:
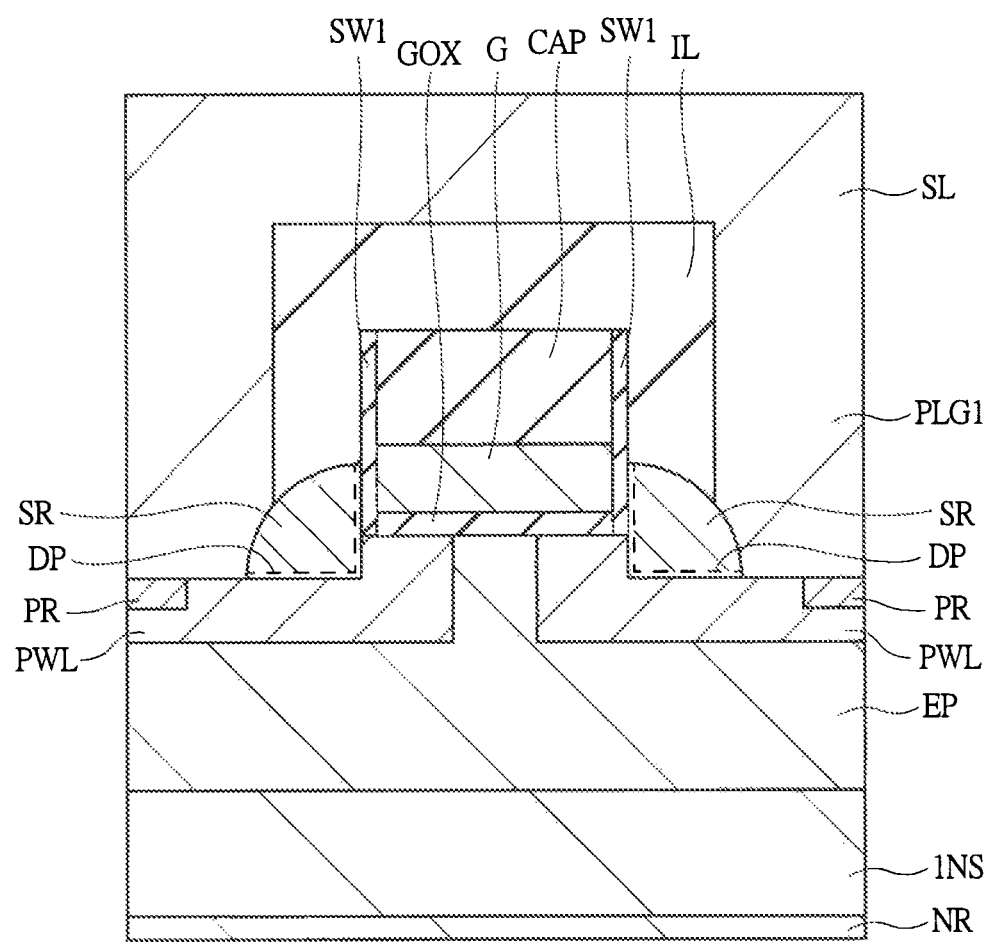
FIG. 57 is a cross-sectional view showing a structure of a semiconductor device according to a modification example.

Incidentally, it is also possible to modify the above process as follows. After forming the ditch DIT1 shown in FIG. 54, on the SiC epitaxial substrate, a polysilicon film is deposited to a thickness of about 100 nm, followed by anisotropic dry etching of the polysilicon film. In this case, as shown in FIG. 56, a polysilicon film in the form of a spacer can be formed from the side surface of the ditch DIT1 to the side surface of the gate electrode G. In this production process, by adjusting the thickness of the polysilicon film to be deposited, it is possible to obtain an advantage that the size of the polysilicon film in the form of a spacer can be controlled. Then, by performing the silicidation step in the same manner as in the above-described seventh embodiment, the source region SR in the form of a spacer can be formed in a self-aligned manner with the gate electrode G. The steps thereafter are the same as those in the above-described seventh embodiment, and the SiC power MOSFET (semiconductor device) according to this modification example as shown in FIG. 57 can be produced in the end.

Eighth Embodiment

In an eighth embodiment of the invention, an example in which a plug PLG1 electrically connected to a source region SR and a plug PLG2 electrically connected to a p-type well PWL are formed in different regions will be described.

<Structure of Semiconductor Device According to Eighth Embodiment>

Figure 58:
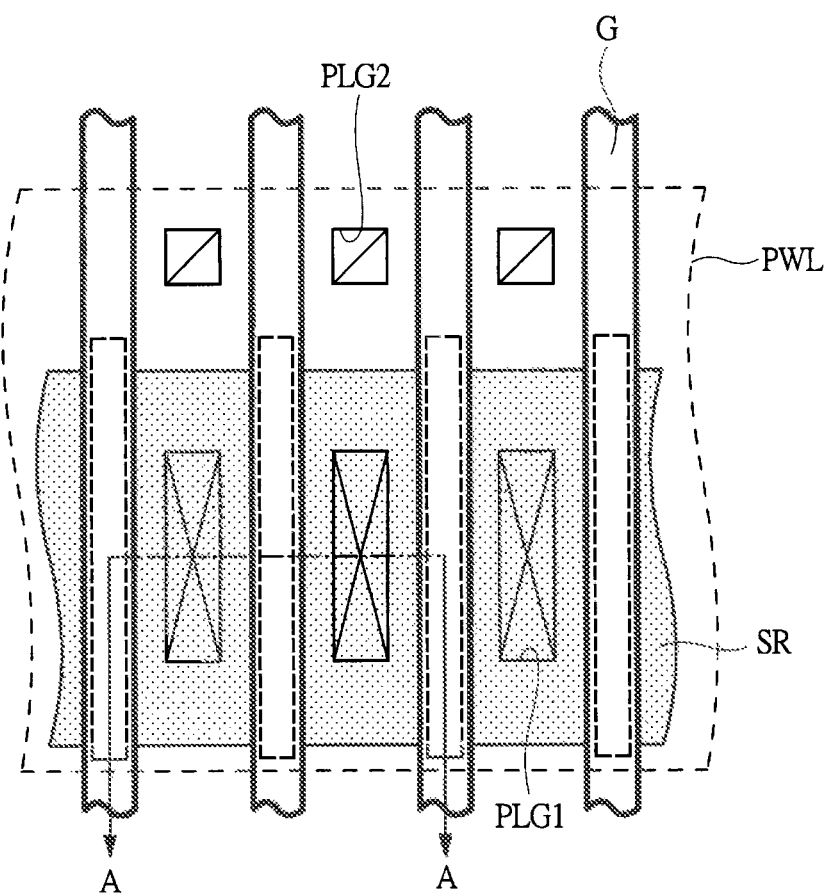
FIG. 58 is a plan view showing a layout structure of a semiconductor device according to an eighth embodiment.

FIG. 58 is a plan view showing a layout structure of a SiC power MOSFET (a semiconductor device) according to the eighth embodiment of the invention. As shown in FIG. 58, in the SiC power MOSFET according to this eighth embodiment, gate electrodes G are arranged in parallel in a stripe form with a small pitch. Further, a source region SR is formed between the gate electrodes G, and to this source region SR, a plug PLG1 is electrically connected. On the other hand, a p-type well PWL is formed in a large region so as to include the source region SR in plan view, and to this p-type well PWL, a plug PLG2 is electrically connected. At this time, the plug PLG1 and the plug PLG2 are formed in different regions. That is, in this eighth embodiment, as shown in FIG. 58, the plug PLG1 electrically connected to the source region SR and the plug PLG2 electrically connected to the p-type well PWL are separated from each other. It is noted that the plug PLG1 and the plug PLG2 are electrically connected to a common source line (not shown), and to the source region SR and the p-type well PWL, the same reference potential (a GND potential) is supplied. In this manner, in this eighth embodiment, by forming the plug PLG1 and the plug PLG2 in different regions, an advantage that the degree of freedom of the layout structure of the SiC power MOSFET can be increased is obtained.

Figure 59:
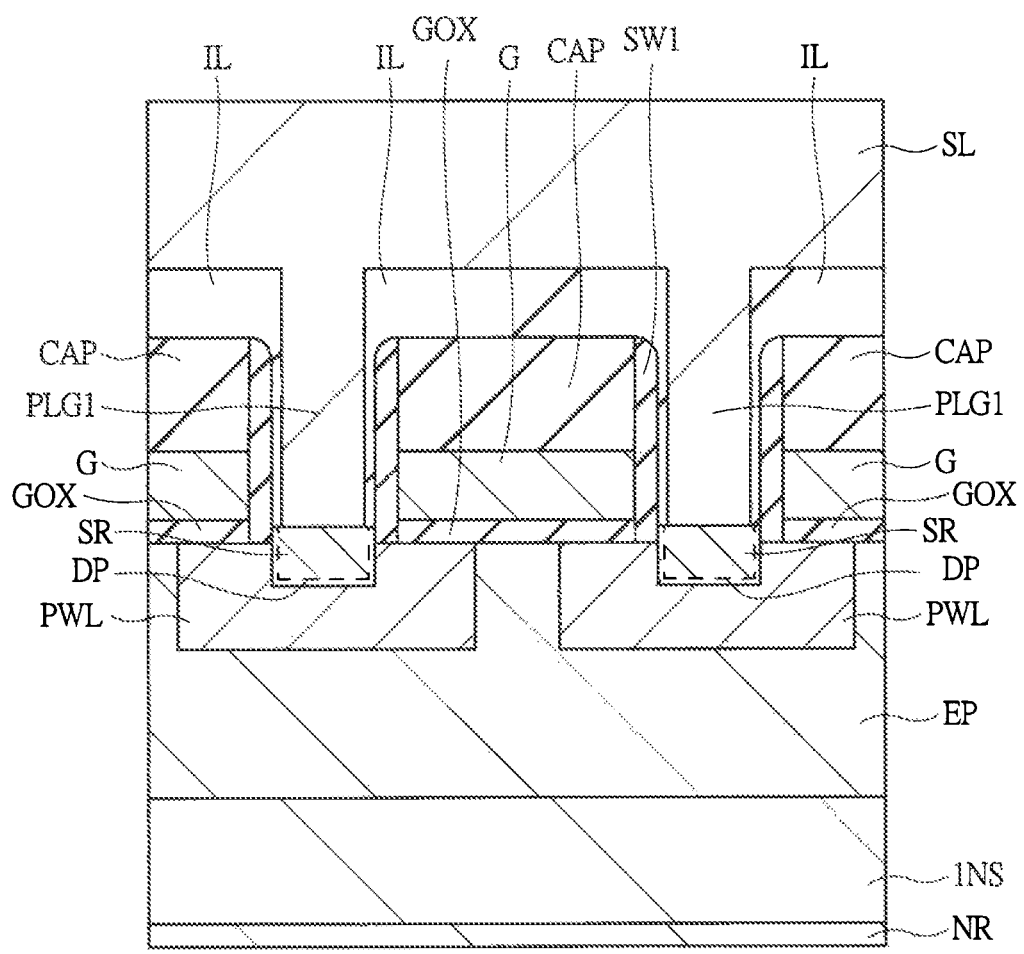
FIG. 59 is a cross-sectional view taken along the line A-A of FIG. 58.

FIG. 59 is a cross-sectional view taken along the line A-A of FIG. 58. FIG. 59 is a cross-sectional view taken along a cross-section including the plug PLG1 electrically connected to the source region SR, and therefore, as shown in FIG. 58, the plug PLG2 formed in a different region from that of the plug PLG1 is not shown, however, in fact, the plug PLG2 is formed in a different region.

As shown in FIG. 59, the SiC power MOSFET according to this eighth embodiment has, for example, a semiconductor substrate 1NS composed of SiC doped with an n-type impurity such as nitrogen (N), and on the back surface (lower surface) of this semiconductor substrate 1NS, an $n^+$-type semiconductor region NR doped with an n-type impurity at a higher concentration than that of the n-type impurity doped into the semiconductor substrate 1NS is formed.

On the other hand, on the front surface (upper surface) of the semiconductor substrate 1NS, an epitaxial layer EP is formed. This epitaxial layer EP is also called a drift layer and is constituted by SiC doped with an n-type impurity such as nitrogen (N). The impurity concentration of the n-type impurity doped into the epitaxial layer EP is lower than that of the n-type impurity doped into the semiconductor substrate 1NS, and the epitaxial layer EP is formed for ensuring the voltage resistance of the SiC power MOSFET.

Subsequently, on the epitaxial layer EP, for example, a p-type well PWL composed of SiC doped with a p-type impurity such as aluminum (Al) is formed so as to be in contact with the epitaxial layer EP, and on this p-type well PWL, a ditch is formed, and in this ditch, a source region SR is buried. This source region SR is constituted by a metal material, and is formed from, for example, a metal silicide represented by nickel silicide.

On the transverse direction of the FIG. 59, a surface region of the p-type well PWL sandwiched by the source region SR and the epitaxial layer EP becomes a channel forming region, and a gate insulating film GOX composed of, for example, a silicon oxide film is formed so as to cover the surface region of this channel forming region and the epitaxial layer EP. Further, on the gate insulating film GOX, a gate electrode G composed of, for example, a polysilicon film is formed. Further, on the gate electrode G, for example, a cap insulating film CAP composed of a silicon oxide film is formed, and from the side surface of this cap insulating film CAP to the side surface of the gate electrode G, a side wall SW1 composed of a silicon oxide film is formed.

Here, also in this eighth embodiment, the conductive impurity DP is segregated at an interface between the source region SR constituted by, for example, nickel silicide and the p-type well PWL. That is, also in this eighth embodiment, as indicated by a dashed line in FIG. 59, the conductive impurity DP is doped at an interface between the source region SR and the p-type well PWL. More specifically, the conductive impurity DP is doped at an interface between the source region SR and the channel forming region in the p-type well PWL. At this time, the conductive impurity DP may be either an n-type impurity or a p-type impurity.

Subsequently, as shown in FIG. 59, an interlayer insulating film IL composed of, for example, a silicon oxide film is formed so as to cover the cap insulating film CAP and a part of the source region SR, and in this interlayer insulating film IL, an opening is formed. From this opening, a part of the source region SR is exposed, and in this opening, for example, an aluminum film is buried, whereby the plug PLG1 is formed. This plug PLG1 is electrically connected to the source region SR, and a reference potential (a GND potential) is supplied to the source region SR from a source ling SL formed on the plug PLG1 through the plug PLG1.

Also in the SiC power MOSFET according to this eighth embodiment configured in this manner, the source region SR is formed from a nickel silicide film which is a metal material film in the same manner as in the above-described first embodiment, and therefore, a source region SR having a low resistance and a large carrier density can be formed. Further, also in this eighth embodiment, the conductive impurity DP (phosphorus) is segregated at an interface between the source region SR and the p-type well PWL including the channel forming region, and therefore, the height of a Schottky barrier formed between the source region SR and the channel forming region (p-type well PWL) can be decreased. Due to this, the injection efficiency and injection rate of a carrier (electron) from an edge portion of the source region SR to the channel region can be improved, and as a result, the channel mobility in the SiC power MOSFET can be improved. The SiC power MOSFET according to this eighth embodiment is configured as described above.

<Method for Producing Semiconductor Device According to Eighth Embodiment>

Figure 60:
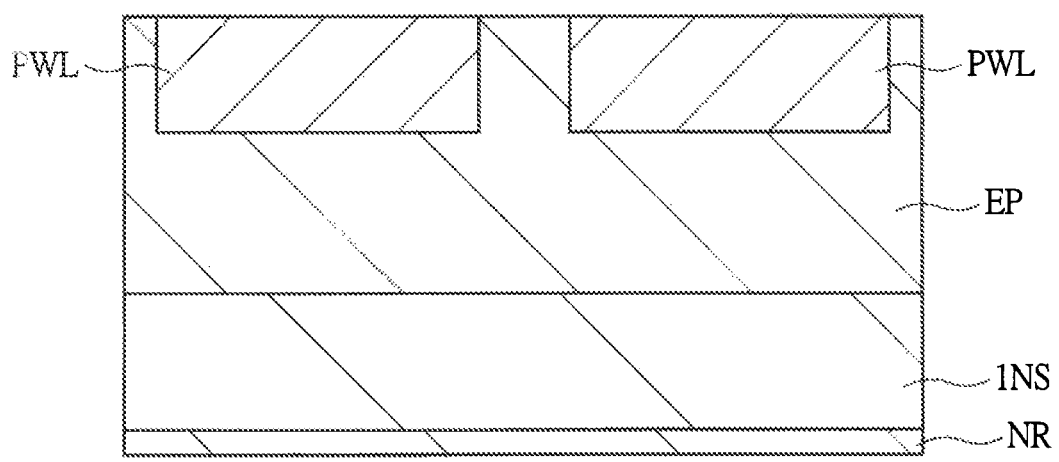
FIG. 60 is a cross-sectional view showing a process for producing the semiconductor device according to the eighth embodiment.

The semiconductor device according to this eighth embodiment is configured as described above, and hereinafter, a production method thereof will be described with reference to the accompanying drawings. Incidentally, the process until the steps shown in FIGS. 8 and 9 in this embodiment is the same as that in the above-described first embodiment, and therefore, the steps thereafter will be described. FIG. 60 is a view showing a cross-sectional structure of the SiC epitaxial substrate after the steps shown in FIGS. 8 and 9. That is, also in this eighth embodiment, all the semiconductor regions required for the SiC epitaxial substrate by the stage shown in FIG. 60 are formed. Here, a description will be made of the method for producing a semiconductor device according to this eighth embodiment by using the cross-sectional views taken along the line A-A of FIG. 58 as the drawings after FIG. 60, and therefore, the $p^+$-type semiconductor region PR formed in the p-type well PWL is not shown.

Figure 61:
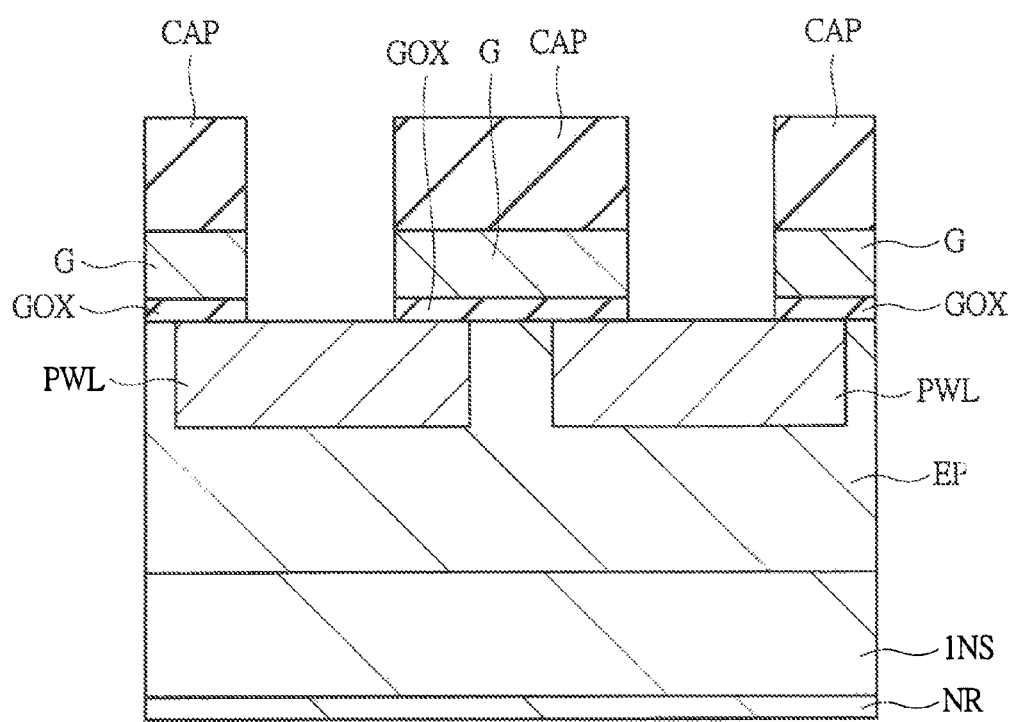
FIG. 61 is a cross-sectional view showing the process for producing the semiconductor device continued from FIG. 60.

First, as shown in FIG. 61, a gate insulating film GOX is formed on the surface of the SiC epitaxial substrate. This gate insulating film GOX is formed from, for example, a silicon oxide film, and the thickness thereof is, for example, about 55 nm. Specifically, the gate insulating film GOX can be formed by first oxidizing the surface of the SC epitaxial substrate by a thermal oxidation method to form a silicon oxide film having a thickness of, for example, about 5 nm, and thereafter depositing a silicon oxide film having a thickness of about 50 nm by, for example, a CVD method. Thereafter, on the gate insulating film GOX, a polysilicon film containing a conductive impurity (phosphorus) at a high concentration is formed. This polysilicon film can be formed by, for example, a CVD method, and the thickness thereof is, for example, about 300 nm. Then, on this polysilicon film, for example, a silicon oxide film is formed. This silicon oxide film can be formed by, for example, a CVD method, and the thickness thereof is, for example, about 200 nm.

Figure 62:
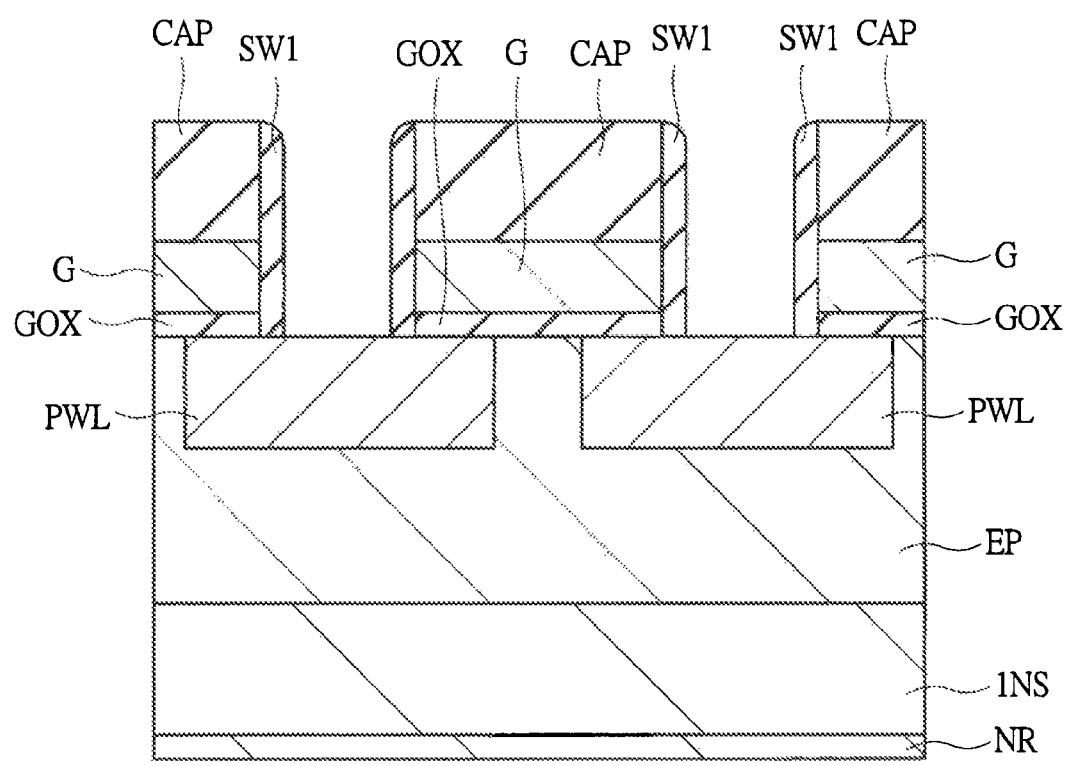
FIG. 62 is a cross-sectional view showing the process for producing the semiconductor device continued from FIG. 61.

Subsequently, by using a photolithographic technique and an etching technique, the silicon oxide film and the polysilicon film are processed. Specifically, by patterning the silicon oxide film, a cap insulating film CAP is formed, and subsequently, by patterning the polysilicon film, a gate electrode G is formed. Then, on the SiC epitaxial substrate having the gate electrode G formed thereon, a silicon oxide film covering the cap insulating film CAP and the gate electrode G is formed. This silicon oxide film can be formed by, for example, a CVD method, and the thickness thereof is, for example, about 10 nm. Thereafter, the deposited silicon oxide film is subjected to anisotropic etching (etching back), whereby the silicon oxide film is left from both side surfaces of the cap insulating film CAP to both side surfaces of the gate electrode G. By doing this, as shown in FIG. 62, a side wall SW1 composed of the silicon oxide film can be formed from both side surfaces of the cap insulating film CAP to both side surfaces of the gate electrode G.

Figure 63:
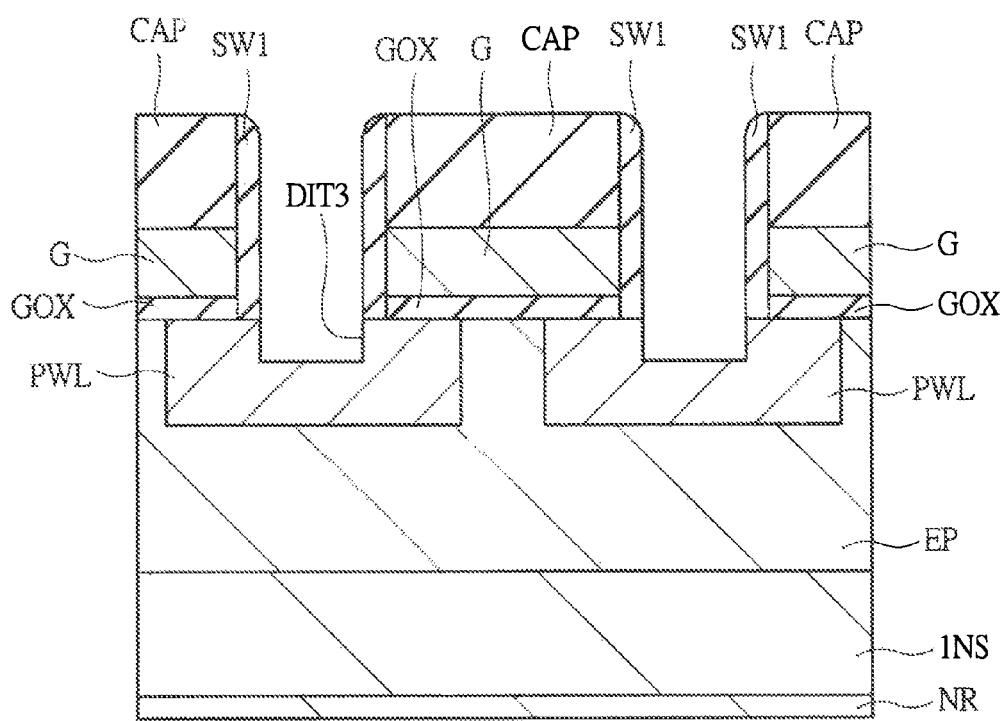
FIG. 63 is a cross-sectional view showing the process for producing the semiconductor device continued from FIG. 62.

Subsequently, as shown in FIG. 63, by using the gate electrode G and the side wall SW1 as a mask, the SiC epitaxial substrate is etched, whereby a ditch DIT3 is formed on the surface of the SiC epitaxial substrate. By doing this, the ditch DIT3 can be formed in a self-aligned manner with the gate electrode G.

Figure 64:
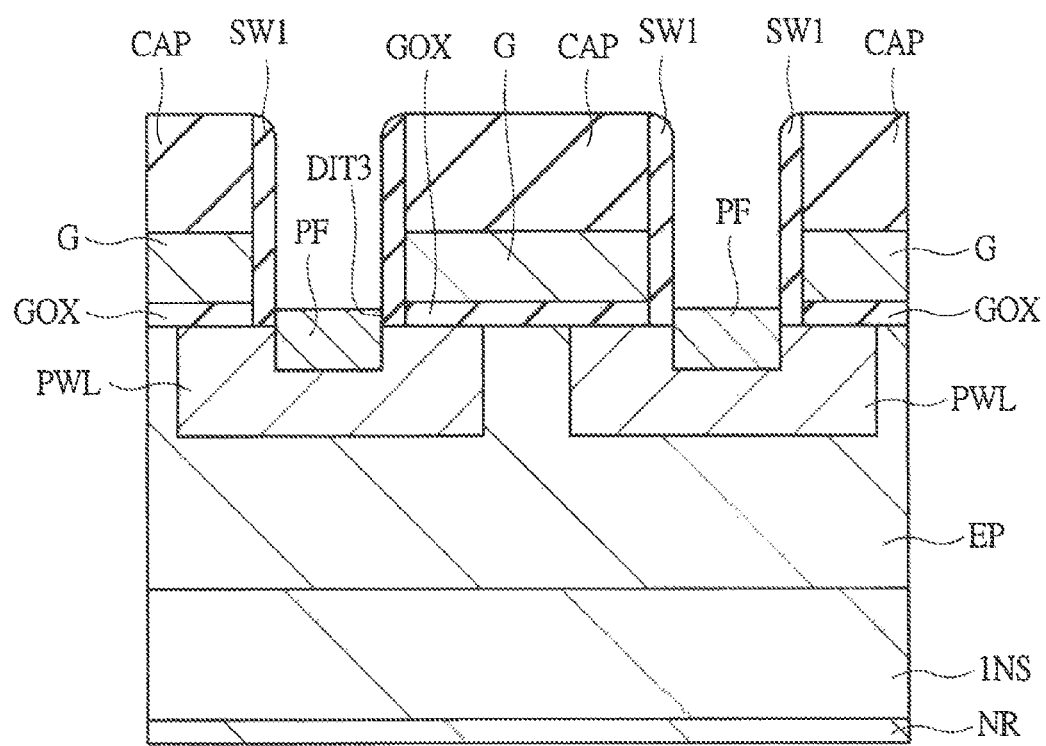
FIG. 64 is a cross-sectional view showing the process for producing the semiconductor device continued from FIG. 63.

Thereafter, as shown in FIG. 64, on the SiC epitaxial substrate having the gate electrode G and the cap insulating film CAP formed thereon, a polysilicon film PF doped with a conductive impurity (phosphorus) at a high concentration is deposited so as to be buried in at least half of the space between the gate electrodes G. This polysilicon film PF can be formed by using, for example, a CVD method. Then, the deposited polysilicon film PF is etched back, whereby the polysilicon film is buried only in the ditch DIT3 formed on the SiC epitaxial substrate.

Figure 65:
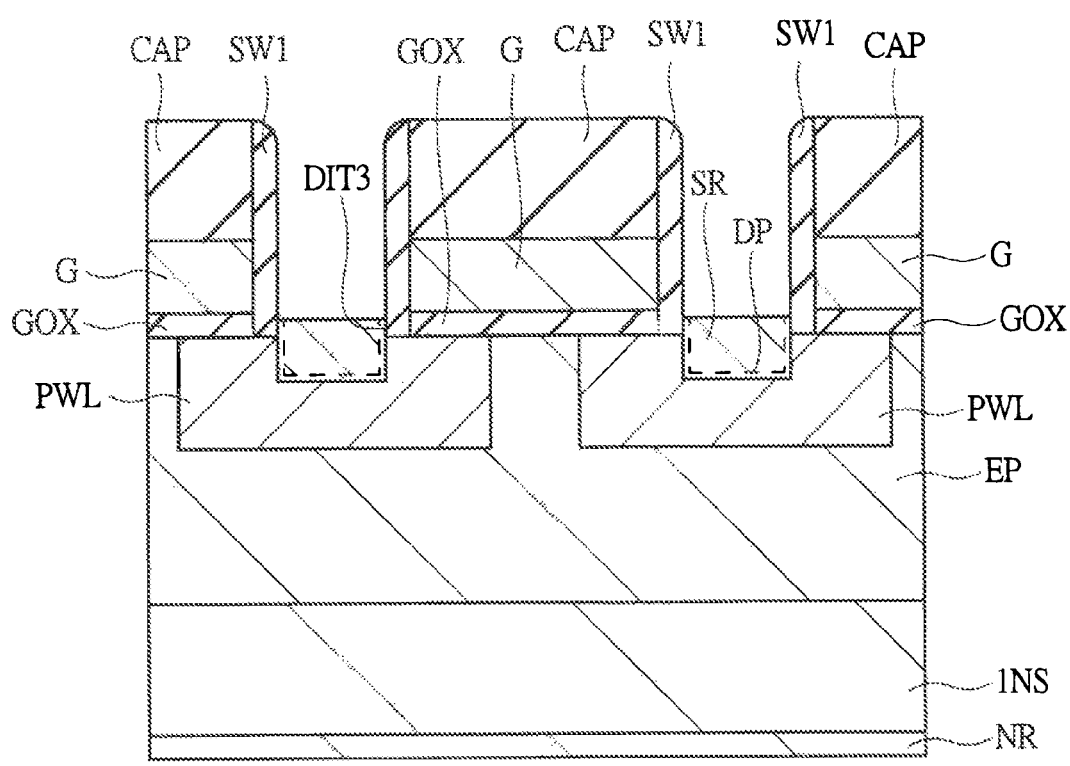
FIG. 65 is a cross-sectional view showing the process for producing the semiconductor device continued from FIG. 64.

Subsequently, as shown in FIG. 65, a metal film is formed on the surface of the SiC epitaxial substrate having the ditch DIT3 in which the polysilicon film PF is buried. Specifically, as the metal film, for example, a nickel film can be formed. This nickel film can be formed by using, for example, a sputtering method. Then, by subjecting the SiC epitaxial substrate to a heat treatment, the polysilicon film PF buried in the ditch DIT3 is silicided. By doing this, the polysilicon film PF buried in the ditch DIT3 is replaced with a nickel silicide film, whereby the source region SR composed of nickel silicide is formed.

Subsequently, as shown in FIG. 59, an interlayer insulating film IL is formed on the SiC epitaxial substrate having the gate electrode G formed thereon. This interlayer insulating film IL is formed so as to cover a part of the source region SR and the cap insulating film CAP, and is formed from, for example, a silicon oxide film. Thereafter, by using a photolithographic technique and an etching technique, an opening (a contact hole) is formed in the interlayer insulating film IL. This opening is formed so as to expose a part of the source region SR. Although not shown in FIG. 59, it is also possible to form an opening reaching the p$^+$-type semiconductor region PR or the gate electrode G.

Subsequently, for example, by using a sputtering method, an aluminum film is formed on the interlayer insulating film IL having the opening therein. The thickness of this aluminum film is, for example, 2 μm. At this time, by burying the aluminum film in the opening formed in the interlayer insulating film IL, a plug PLG1 is formed. Then, by using a photolithographic technique and an etching technique, this aluminum film is patterned, whereby a source line SL electrically connected to this plug PLG1 is formed.

The steps after this line forming step can be performed by a known semiconductor process, and the SiC power MOSFET (semiconductor device) according to this eighth embodiment can be produced in the end by a useful self-aligning process.

<Modification Example>

Figure 66:
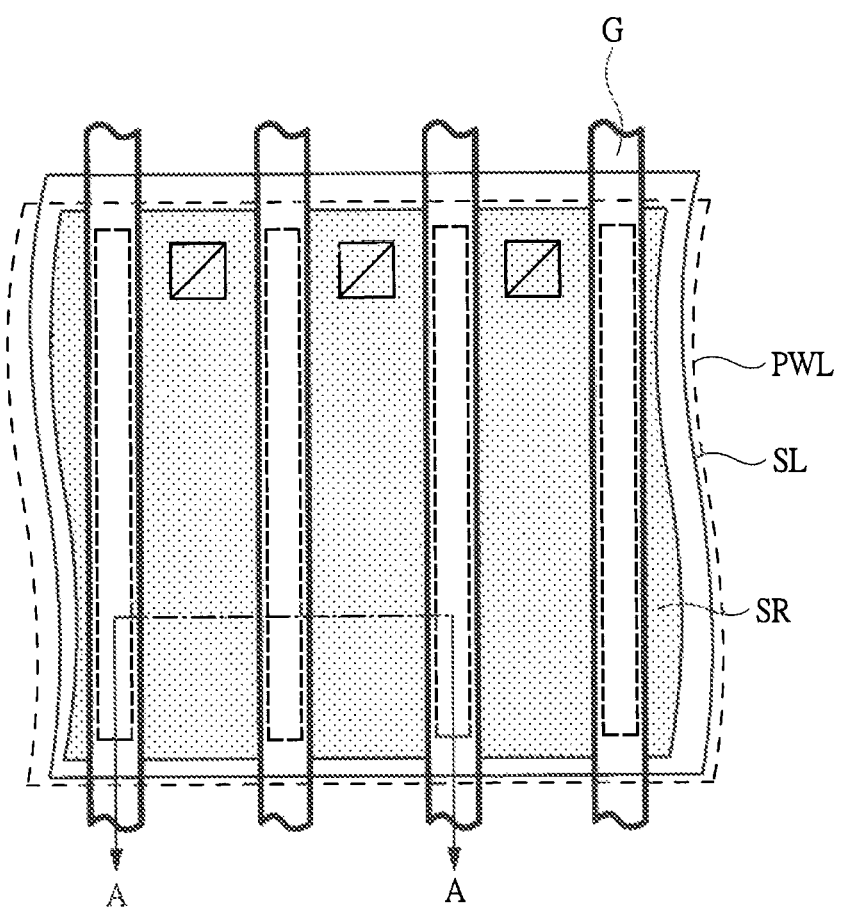
FIG. 66 is a plan view showing a layout structure of a semiconductor device according to a modification example.
Figure 67:
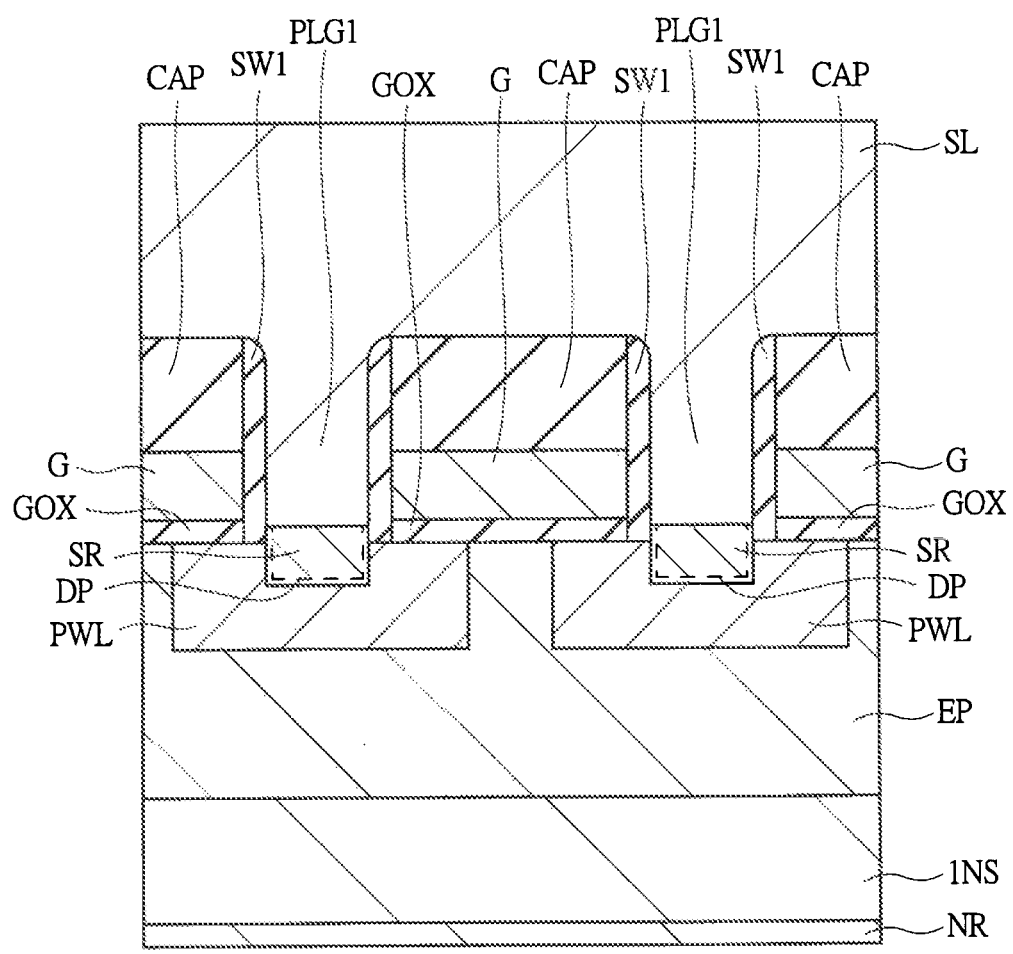
FIG. 67 is a cross-sectional view taken along the line A-A of FIG. 66.

FIG. 66 is a plan view showing a layout structure of a SiC power MOSFET according to a modification example, and FIG. 67 is a cross-sectional view taken along the line A-A of FIG. 66. FIGS. 66 and 67 shows a state in which after forming a source region SR composed of a metal material (a metal silicide), a source line SL (a metal line) is deposited in a space formed between gate electrodes G without forming a plug. As shown in the modification example, even if the process for forming a plug is not performed, by forming a source ling SL such that it is buried in the space between the gate electrodes G, the source line SL electrically connected to the source region SR can be formed in a self-aligned manner.

Figure 68:
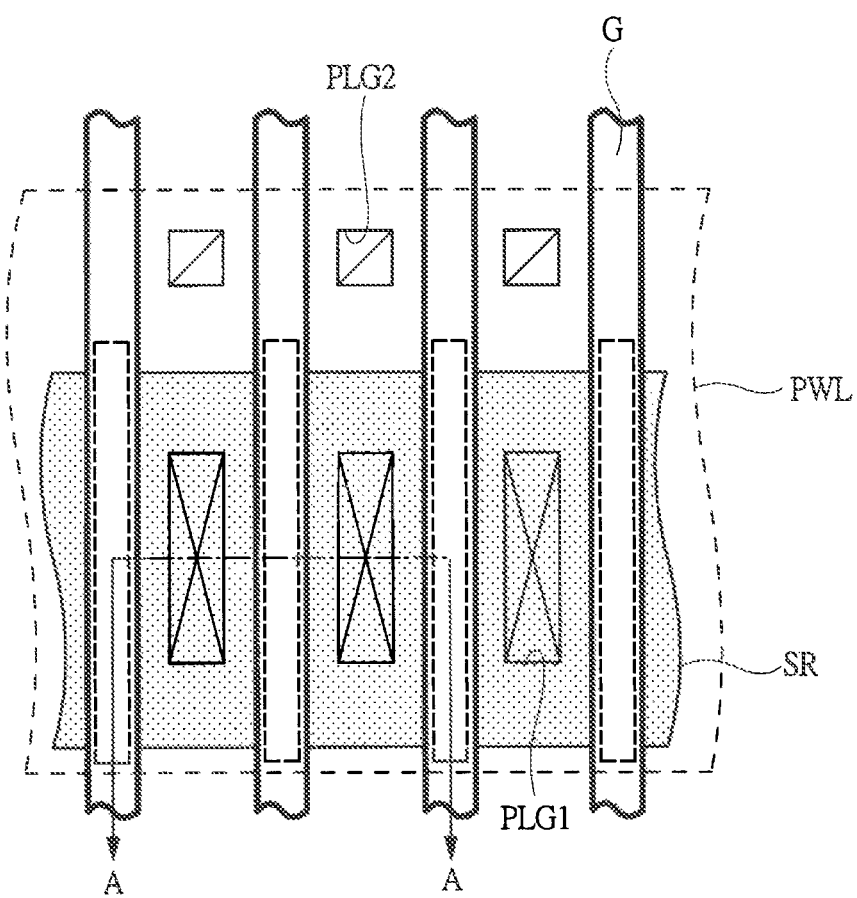
FIG. 68 is a plan view showing a layout structure of a semiconductor device according to a modification example.
Figure 69:
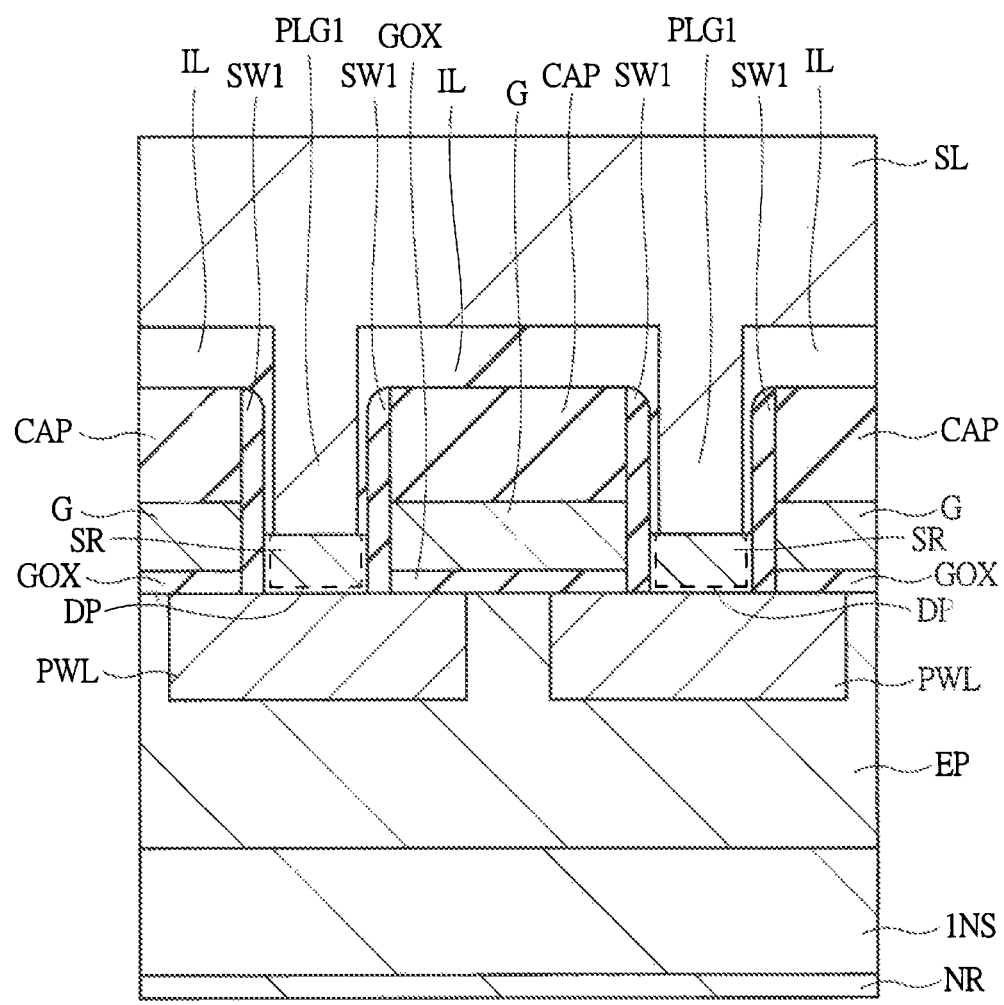
FIG. 69 is a cross-sectional view taken along the line A-A of FIG. 68.

FIG. 68 is a plan view showing a layout structure of a SiC power MOSFET according to another modification example, and FIG. 69 is a cross-sectional view taken along the line A-A of FIG. 68. As shown in FIG. 69, it is also possible to form the SiC power MOSFET by stacking a source region SR in a deposited form on the SiC epitaxial substrate without forming a ditch on the SiC epitaxial substrate. In this case, it is not necessary to perform a process for forming a ditch on the SiC epitaxial substrate, and therefore, an advantage that the source region SR can be easily formed is obtained. Also in this case, a plug PLG1 can be formed on the source region SR.

Figure 70:
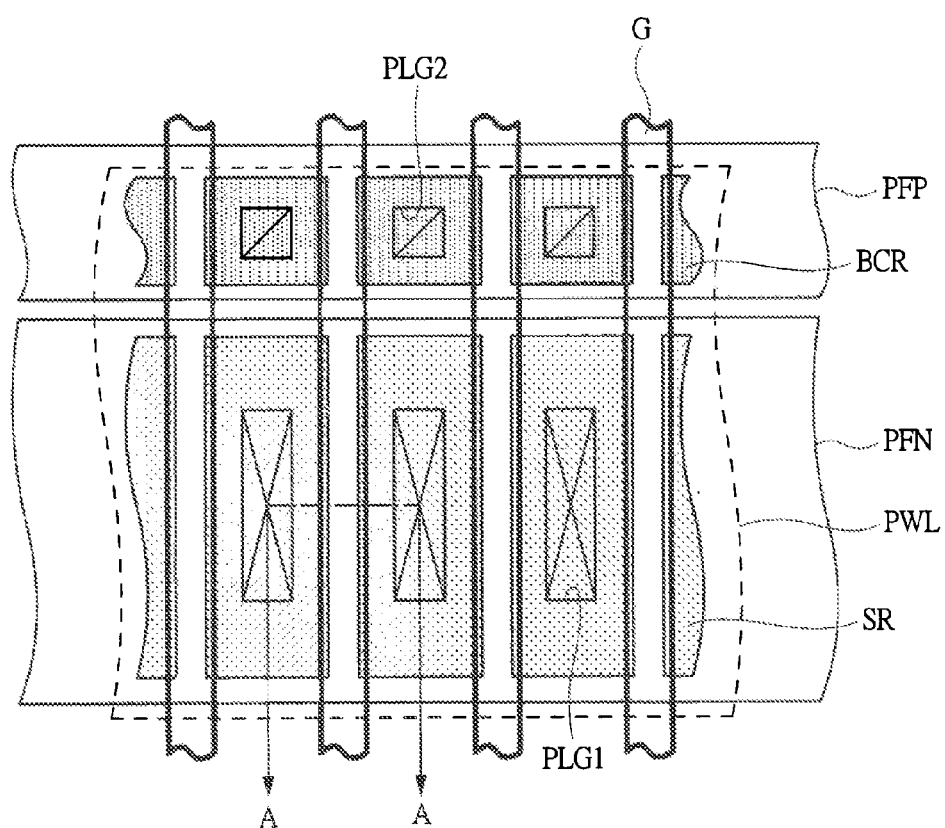
FIG. 70 is a plan view showing a layout structure of a semiconductor device according to a modification example.
Figure 71:
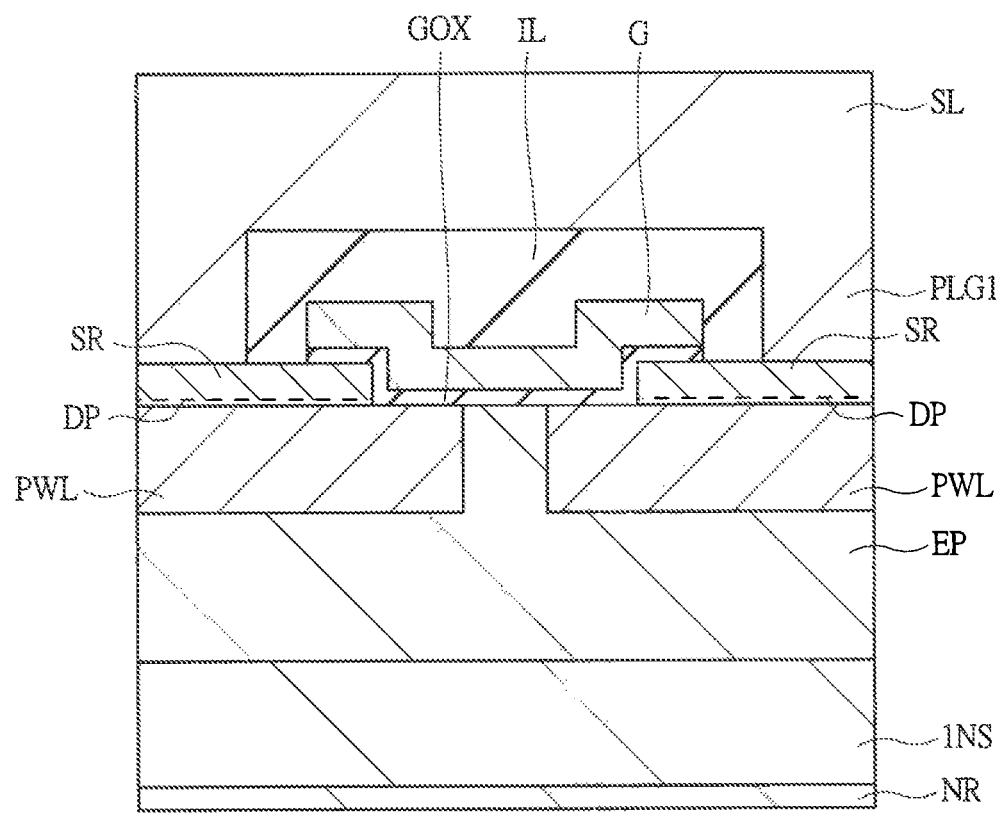
FIG. 71 is a cross-sectional view taken along the line A-A of FIG. 70.

FIG. 70 is a plan view showing a layout structure of a SiC power MOSFET according to still another modification example, and FIG. 71 is a cross-sectional view taken along the line A-A of FIG. 70. The modification example shown in FIG. 70 is an example in which a contact with a p-type well PWL is achieved by a contact region BCR, which is constituted by a metal material (a metal silicide) in the same manner as a source region SR and is provided separately from the source region SR.

In FIG. 70, for example, by siliciding a part of a polysilicon film PFN doped with an n-type impurity such as phosphorus (S) or arsenic (As), the source region SR is formed. This source region SR is electrically connected to a plug PLG1. On the other hand, for example, a polysilicon film PFP doped with a p-type impurity such as boron (B) is formed so as to be adjacent to the polysilicon film PFN, and by siliciding a part of the polysilicon film PFP, the contact region BCR is formed. This contact region BCR is electrically connected to a plug PLG2.

In this manner, in this modification example, a part of the polysilicon film is silicided to form the source region SR and the contact region BCR from a metal silicide. At this time, in this modification example, the source region SR and the contact region BCR are separately formed, and also the source region SR is formed by siliciding the polysilicon film PFN doped with an n-type impurity, and the contact region BCR is formed by siliciding the polysilicon film PFP doped with a p-type impurity. Due to this, according to this modification example, a contact between the contact region BCR and the p-type well PWL can be made favorable, and as a result, a reference potential (a GND potential) can be supplied to the p-type well PWL from the plug PLG2 through the contact region BCR.

The SiC power MOSFET shown in FIGS. 70 and 71 can be produced by, for example, applying the production method shown in FIGS. 23 to 27. For example, in the step of flattening the polysilicon film PF shown in FIG. 24, a polysilicon film PF undoped with a conductive impurity is deposited and then flattened, and thereafter, a source forming region is doped with phosphorus or arsenic, and also a contact forming region is doped with boron. By doing this, the SiC power MOSFET shown in FIGS. 70 and 71 can be produced.

Ninth Embodiment

Figure 72:
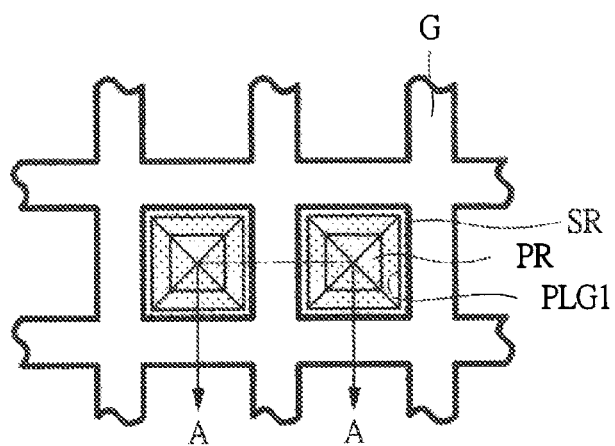
FIG. 72 is a plan view showing a layout structure of a semiconductor device according to a ninth embodiment.

In a ninth embodiment of the invention, an example in which a SiC power MOSFET is produced by a so-called damascene gate process will be described.
<Structure of Semiconductor Device According to Ninth Embodiment>
FIG. 72 is a plan view showing an example of a layout structure of a SiC power MOSFET according to the ninth embodiment of the invention. In FIG. 72, in the SiC power MOSFET according to this ninth embodiment, gate electrodes G are arranged in the form of a lattice, and a source region SR is formed in each basic cell surrounded by the gate electrodes G.

Here, in FIG. 72, the source region SR is formed in the entire area inside the basic cell surrounded by the gate electrodes G in plan view. Further, a $p^+$-type semiconductor region PR is formed on a lower layer overlapping the source region SR in plan view. That is, in FIG. 72, the source region SR is formed also in a region covering the $p^+$-type semiconductor region PR. At this time, as shown in FIG. 72, the source region SR and a plug PLG1 are electrically connected to each other. Incidentally, in this ninth embodiment, an edge portion of the source region SR does not protrude from the gate electrode G. That is, in this ninth embodiment, the source region SR is formed in a self-aligned manner with the gate electrode G.

Figure 73:
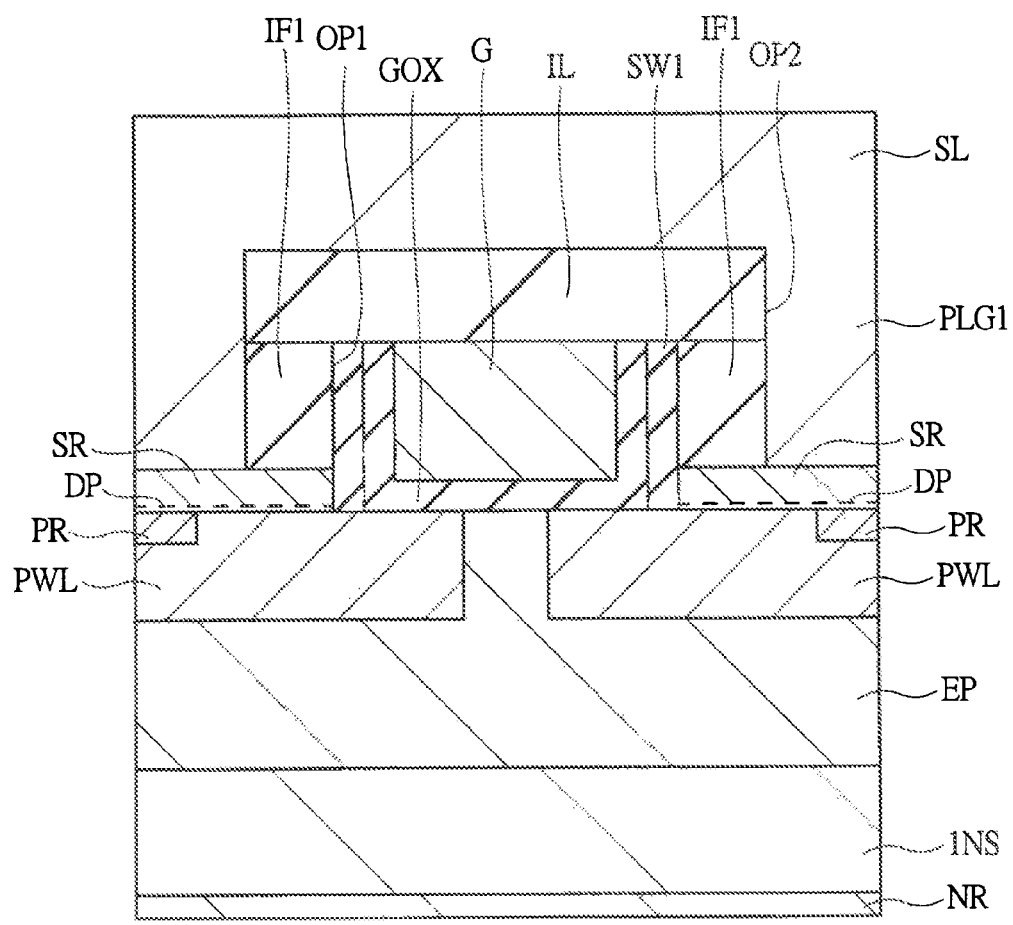
FIG. 73 is a view showing a cross-sectional structure of the semiconductor device according to the ninth embodiment, and is a cross-sectional view taken along the line A-A of FIG. 72.

FIG. 73 is a view showing a cross-sectional structure of the SiC power MOSFET according to this ninth embodiment, and shows a cross-sectional view taken along the line A-A of FIG. 72.

In FIG. 73, the SiC power MOSFET according to this ninth embodiment has, for example, a semiconductor substrate 1NS composed of SiC doped with an n-type impurity such as nitrogen (N), and on the back surface (lower surface) of this semiconductor substrate 1NS, an $n^+$-type semiconductor region NR doped with an n-type impurity at a higher concentration than that of the n-type impurity doped into the semiconductor substrate 1NS is formed.

On the other hand, on the front surface (upper surface) of the semiconductor substrate 1NS, an epitaxial layer EP is formed. This epitaxial layer EP is also called a drift layer and is constituted by SiC doped with an n-type impurity such as nitrogen (N). The impurity concentration of the n-type impurity doped into the epitaxial layer EP is lower than that of the n-type impurity doped into the semiconductor substrate 1NS, and the epitaxial layer EP is formed for ensuring the voltage resistance of the SiC power MOSFET.

Subsequently, on the epitaxial layer EP, for example, a p-type well PWL composed of SiC doped with a p-type impurity such as aluminum (Al) is formed so as to be in contact with the epitaxial layer EP, and on this p-type well PWL, a source region SR is formed. This source region SR is constituted by a metal material, and is formed from, for example, a metal silicide represented by nickel silicide.

Further, in FIG. 73, a $p^+$-type semiconductor region PR is formed in a surface region of the p-type well PWL in contact with the source region SR in plan view. This $p^+$-type semiconductor region PR is doped with a p-type impurity at a higher concentration than that of the p-type impurity doped into the p-type well PWL. This $p^+$-type semiconductor region PR is provided for stably supplying a potential to the p-type well PWL.

Here, also in this ninth embodiment, the conductive impurity DP is segregated at an interface between the source region SR constituted by, for example, nickel silicide and the p-type well PWL. That is, also in this ninth embodiment, as indicated by a dashed line in FIG. 73, the conductive impurity DP is doped at an interface between the source region SR and the p-type well PWL. More specifically, the conductive impurity DP is doped at an interface between the source region SR and the channel forming region in the p-type well PWL. At this time, the conductive impurity DP may be either an n-type impurity or a p-type impurity.

Subsequently, on the source region SR, an insulating film IF1 composed of, for example, a silicon oxide film is formed, and in this insulating film IF1, an opening OP1 reaching the SiC epitaxial substrate is formed. On a side surface of this opening OP1, a side wall SW1 is formed, and a gate insulating film GOX is formed from the inner side of the side wall SW1 to the bottom surface of the opening OP1. Further, inside the gate insulating film GOX, a gate electrode G is formed such that it is buried in the opening OP1. Further, on the insulating film IF1 including the upper portion of the opening OP1 filled with the gate electrode G, an interlayer insulating film IL is formed, and an opening OP2 is formed from this interlayer insulating film IL to the insulating film IF1. From this opening OP2, a part of the source region SR is exposed, and in this opening OP2, for example, an aluminum film is buried, whereby a plug PLG1 is formed. This plug PLG1 is electrically connected to the source region SR, and a reference potential (a GND potential) is supplied to the source region SR from a source ling SL formed on the plug PLG1 through the plug PLG1.

Also in the SiC power MOSFET according to this ninth embodiment configured in this manner, the source region SR is formed from a nickel silicide film which is a metal material film in the same manner as in the above-described first embodiment, and therefore, a source region SR having a low resistance and a large carrier density can be formed. Further, also in this ninth embodiment, the conductive impurity DP (phosphorus) is segregated at an interface between the source region SR and the p-type well PWL including the channel forming region, and therefore, the height of a Schottky barrier formed between the source region SR and the channel forming region (p-type well PWL) can be decreased. Due to this, the injection efficiency and injection rate of a carrier (electron) from an edge portion of the source region SR to the channel region can be improved, and as a result, the channel mobility in the SiC power MOSFET can be improved.

<Method for Producing Semiconductor Device According to Ninth Embodiment>

Figure 74:
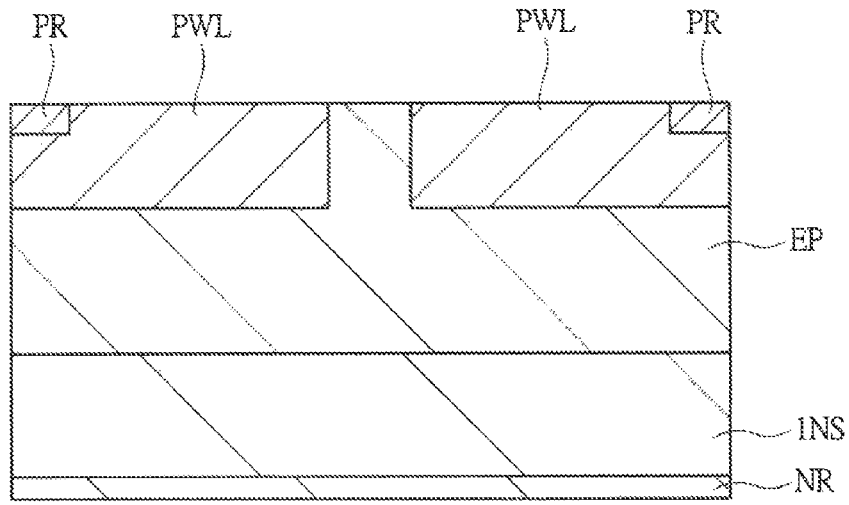
FIG. 74 is a cross-sectional view showing a process for producing the semiconductor device according to the ninth embodiment.

The semiconductor device according to this ninth embodiment is configured as described above, and hereinafter, a production method thereof will be described with reference to the accompanying drawings. Incidentally, the process until the steps shown in FIGS. 8 and 9 in this embodiment is the same as that in the above-described first embodiment, and therefore, the steps thereafter will be described. FIG. 74 is a view showing a cross-sectional structure of the SiC epitaxial substrate after the steps shown in FIGS. 8 and 9. That is, also in this ninth embodiment, all the semiconductor regions required for the SiC epitaxial substrate by the stage shown in FIG. 74 are formed.

Figure 75:
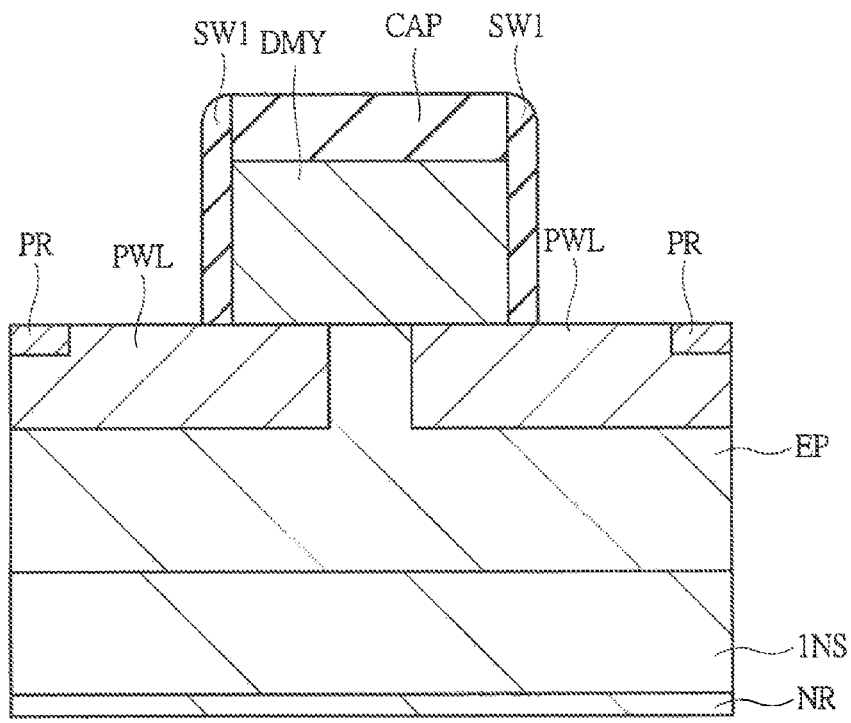
FIG. 75 is a cross-sectional view showing the process for producing the semiconductor device continued from FIG. 74.

Subsequently, as shown in FIG. 75, on the SiC epitaxial substrate, a polysilicon film is formed, and on this polysilicon film, a silicon oxide film is formed. The polysilicon film can be formed by, for example, a CVD method, and the thickness thereof is, for example, about 300 nm. Also, the silicon oxide film can be formed by, for example, a CVD method, and the thickness thereof is, for example, about 100 nm. Thereafter, by using a photolithographic technique and an etching technique, the polysilicon film and the silicon oxide film are processed. By doing this, as shown in FIG. 75, a dummy electrode DMY composed of the polysilicon film and a cap insulating film CAP composed of the silicon oxide film on the dummy electrode DMY are formed.

Then, a silicon oxide film is formed on the SiC epitaxial substrate having the dummy electrode DMY and the cap insulating film CAP formed thereon. This silicon oxide film can be formed by, for example, a CVD method, and the thickness thereof is, for example, about 20 nm. Thereafter, the deposited silicon oxide film is subjected to anisotropic etching to a thickness equal to the film thickness, whereby a side wall SW1 is formed on both side surfaces of the dummy electrode DMY and the cap insulating film CAP.

Figure 76:
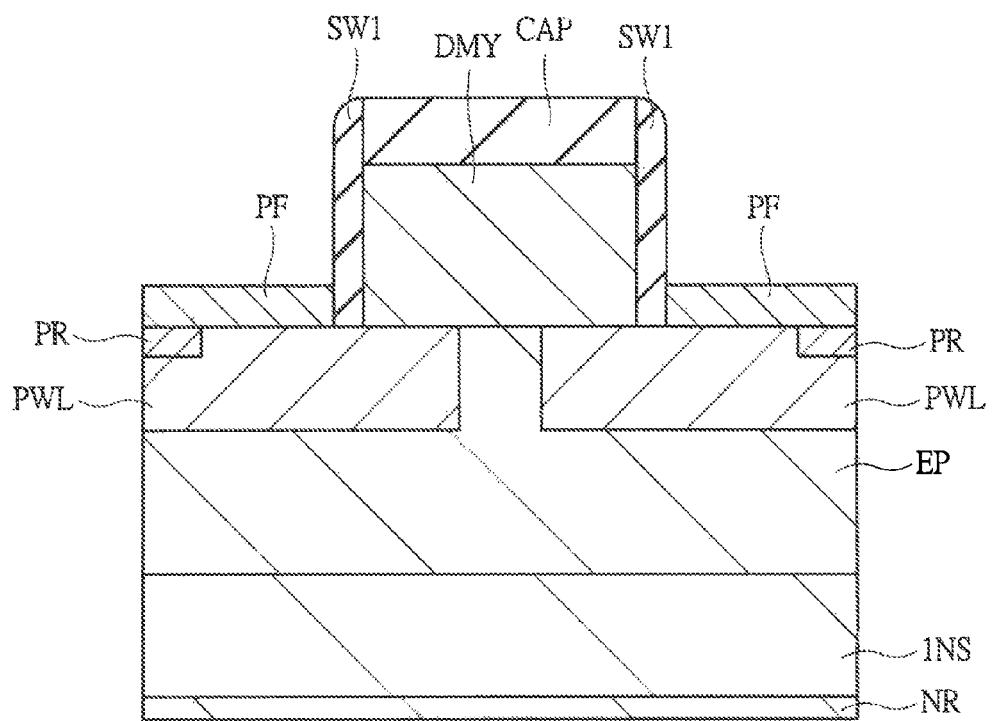
FIG. 76 is a cross-sectional view showing the process for producing the semiconductor device continued from FIG. 75.

Subsequently, as shown in FIG. 76, a polysilicon film containing a conductive impurity (phosphorus) at a high concentration is deposited thick on the SiC epitaxial substrate having the dummy electrode DMY and the cap insulating film CAP formed thereon. Then, for example, by using a CMP method, the surface of the deposited polysilicon film is flattened, followed by etching back, whereby a polysilicon film PF aligned with the dummy electrode DMY and the side wall SW1 is formed.

Figure 77:
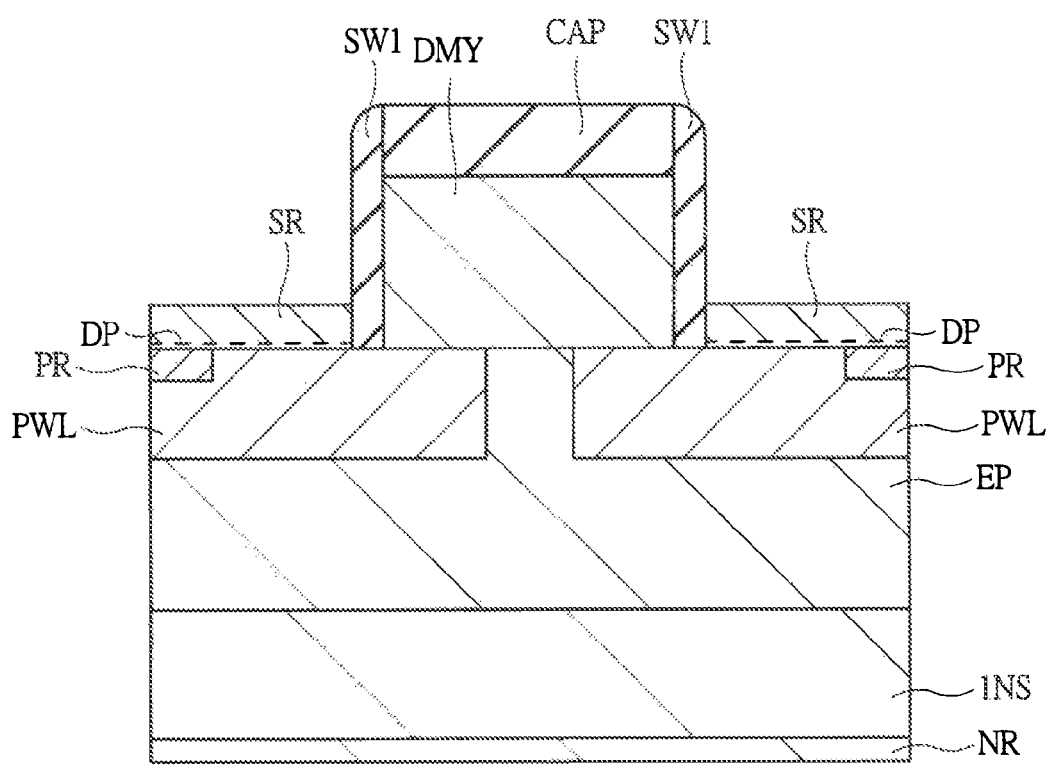
FIG. 77 is a cross-sectional view showing the process for producing the semiconductor device continued from FIG. 76.

Subsequently, as shown in FIG. 77, a metal film is formed on the surface of the SiC epitaxial substrate having the polysilicon film PF formed thereon. Specifically, as the metal film, for example, a nickel film can be formed, and the thickness thereof is, for example about 50 nm. This nickel film can be formed by using, for example, a sputtering method.

Subsequently, a silicidation reaction between the polysilicon film and the nickel film is performed by applying a heat treatment at 320° C. for 60 seconds as first annealing (a first heat treatment) to the SiC epitaxial substrate. In such a low-temperature treatment, the nickel film does not react with SiC, and therefore, only the polysilicon film and the nickel film can be reacted with each other. Then, the unreacted nickel film is removed with a mixed liquid of sulfuric acid and hydrogen peroxide, and thereafter as second annealing (a second heat treatment), a heat treatment at 500° C. for 30 seconds is performed. By doing this, a nickel silicide film formed on the surface of the polysilicon film is allowed to grow, whereby the polysilicon film is completely replaced with a nickel silicide film. In such a low-temperature treatment, the nickel film does not react with SiC, and therefore, a silicidation reaction with the polysilicon film proceeds, and when the reaction reaches the SiC epitaxial substrate, the silicidation reaction stops. During this silicidation reaction, the conductive impurity DP (phosphorus) doped into the polysilicon film moves and aggregates at an interface with the SiC epitaxial substrate. In this manner, according to this ninth embodiment, in a boundary region between the nickel silicide film and the p-type well PWL, an interface at which the conductive impurity DP (phosphorus) is segregated in a self-aligned manner can be provided. As described above, according to this ninth embodiment, a source region SR composed of a nickel silicide film can be formed in a self-aligned manner with the dummy electrode DMY, and also the conductive impurity DP (phosphorus) can be segregated at an interface between the source region SR and the p-type well PWL.

Here, also in this ninth embodiment, the source region SR is constituted by a metal material, and into the $p^+$-type semiconductor region PR, a p-type impurity is doped at a high concentration, and therefore, an ohmic contact can be formed between the source region SR and the $p^+$-type semiconductor region PR. As a result, the source region SR and the $p^+$-type semiconductor region PR can be electrically connected to each other.

Figure 78:
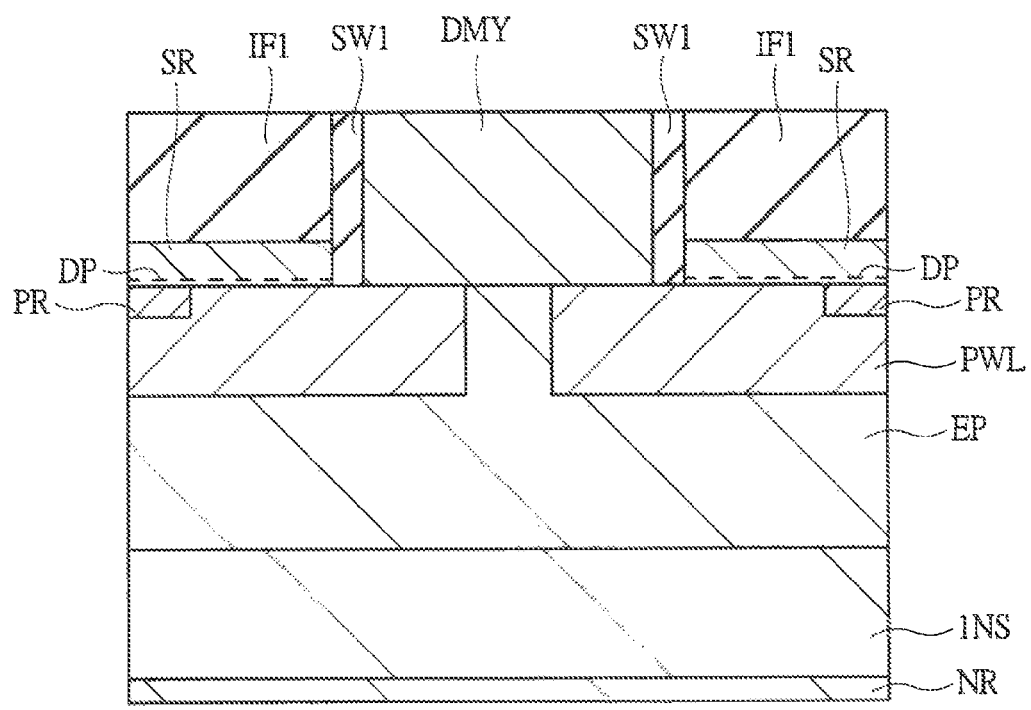
FIG. 78 is a cross-sectional view showing the process for producing the semiconductor device continued from FIG. 77.

Subsequently, as shown in FIG. 78, an insulating film IF1 is formed on the SiC epitaxial substrate. This insulating film IF1 can be formed from, for example, a silicon oxide film, and can be formed by using, for example, a CVD method. Further, the thickness of the insulating film IF1 is, for example, about 500 nm. Thereafter, by using, for example, a CMP method, the insulating film IF1 is polished. By doing this, the cap insulating film CAP formed on the dummy electrode DMY is exposed, however, the polishing by the CMP method is allowed to further proceed until the upper surface of the dummy electrode DMY is exposed by removing the cap insulating film CAP.

Figure 79:
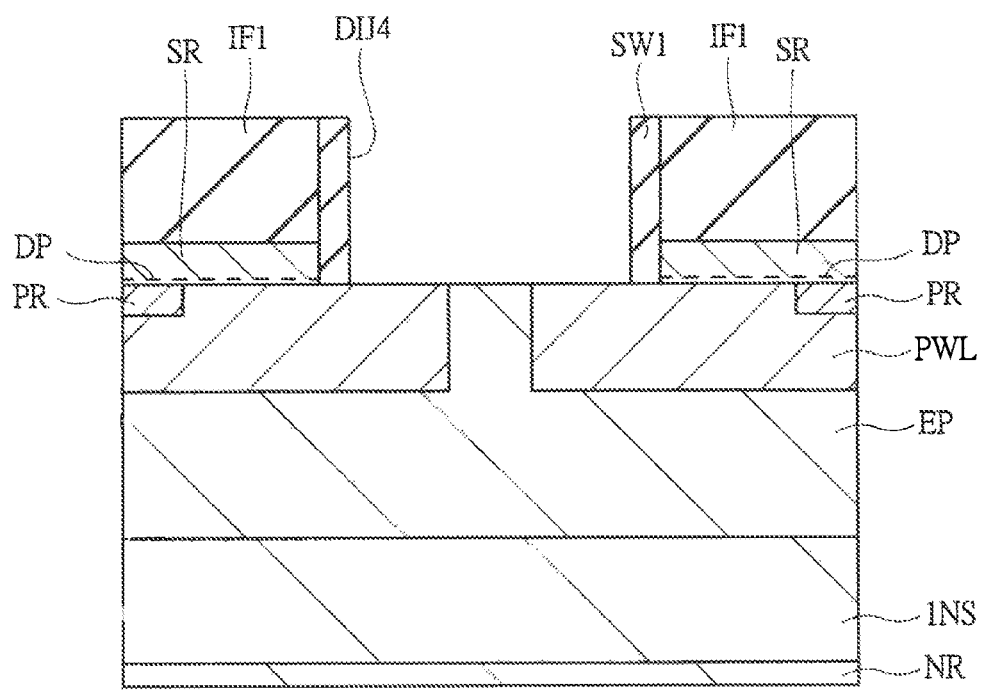
FIG. 79 is a cross-sectional view showing the process for producing the semiconductor device continued from FIG. 78.
Figure 80:
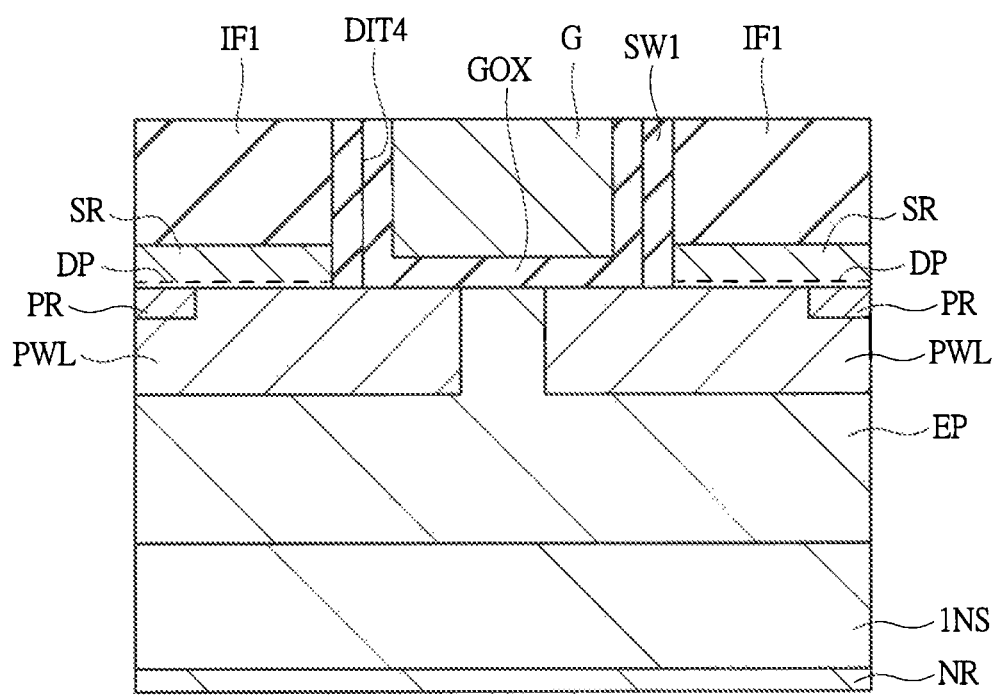
FIG. 80 is a cross-sectional view showing the process for producing the semiconductor device continued from FIG. 79.

Thereafter, as shown in FIG. 79, the exposed dummy electrode DMY is removed. Specifically, the polysilicon film constituting the dummy electrode DMY is removed by wet etching, whereby a ditch DIT4 is formed. Then, as shown in FIG. 80, a gate insulating film GOX is formed on the SiC epitaxial substrate including the ditch DIT4, and on this gate insulating film GOX, a conductive film is formed. At this time, the gate insulating film GOX is formed on the side surfaces and the bottom surface of the ditch DIT4, and the conductive film is formed on the gate insulating film GOX such that it is buried in the ditch DIT4. Then, an unnecessary portion of the conductive film and the gate insulating film GOX formed on the insulating film IF1 is removed by, for example, a CMP method, whereby the gate insulating film GOX and the conductive film are left only in the ditch DIT4. By doing this, in the ditch DIT4, the gate insulating film GOX and a gate electrode G composed of the conductive film buried in the ditch DIT4 through the gate insulating film GOX can be formed. In this manner, according to this ninth embodiment, the gate electrode G arranged in a self-aligned manner with the source region SR can be formed.

The steps thereafter are the same as those in the above-described first embodiment, and the SiC power MOSFET (semiconductor device) according to this ninth embodiment as shown in FIG. 73 can be produced in the end by a damascene gate process.

<Advantage of Ninth Embodiment>

Heretofore, from the viewpoint that the insulation resistance is high and electrical/physical stability at an interface between silicon and silicon oxide is excellent, etc., a silicon oxide film is used as the gate insulating film GOX. However, accompanying the miniaturization of elements, it has been demanded that the gate insulating film should be ultrathin. If such a thin silicon oxide film is used as the gate insulating film GOX, electrons flowing through the channel of a MOSFET tunnel a barrier formed by the silicon oxide film and flow into the gate electrode, and thus a so-called tunneling current occurs.

In view of this, a high-dielectric constant film which is composed of a material having a higher dielectric constant than the silicon oxide film, and therefore can increase the physical film thickness without changing the capacitance has come to be used. By using the high-dielectric constant film, the physical film thickness can be increased without changing the capacitance, and therefore, a leakage current can be decreased. Due to this, a study has been carried out on the use of such a high-dielectric constant film having a higher dielectric constant than the silicon oxide film as, for example, the gate insulating film of a MOSFET.

As the material of the high-dielectric constant film, for example, hafnium oxide, hafnium oxide silicate, hafnium oxynitride silicate, or the like is used.

Here, for example, in the case where a silicon oxide film is used as the gate insulating film GOX, the gate electrode G to be formed on the gate insulating film GOX is formed from a polysilicon film. Further, in an n-channel MOSFET, an n-type impurity (such as phosphorus or arsenic) is doped into the polysilicon film constituting the gate electrode G. By doing this, the work function (Fermi level) of the gate electrode is set to be near the conduction band of silicon, whereby the threshold voltage of the n-channel MOSFET can be decreased. On the other hand, although not described in the specification of this application, in a p-channel MOSFET, a p-type impurity (such as boron) is doped into the polysilicon film constituting the gate electrode G. By doing this, the work function of the gate electrode is set to be near the valence band of silicon, whereby the threshold voltage of the p-channel MOSFET can be decreased. That is, in the case where a silicon oxide film is used as the gate insulating film GOX, by doping an n-type impurity or a p-type impurity into the gate electrode, the work function of the gate electrode can be set to be near the conduction band or the valance band.

On the other hand, if a high-dielectric constant film is used as the gate insulating film GOX, even if an n-type impurity or a p-type impurity is doped into the gate electrode G composed of a polysilicon film, a phenomenon occurs that the work function of the gate electrode G is not near the conduction band or the valance band. That is, in the case where a high-dielectric constant film is used as the gate insulating film GOX, in an n-channel MOSFET, the work function of the gate electrode G is increased and drifts away from the value near the conduction band. Due to this, the threshold voltage of the n-channel MOSFET is increased. On the other hand, in a p-channel MOSFET, the work function of the gate electrode G is decreased and drifts away from the valence band, and therefore, in the same manner as in the case of the n-channel MOSFET, the threshold voltage of the p-channel MOSFET is increased. A phenomenon that the work function of the gate electrode G shifts to increase the threshold voltage in this manner is construed as Fermi level pinning. Accordingly, it is found that in the case where a high-dielectric constant film is used as the gate insulating film GOX, when the gate electrode G is constituted by a polysilicon film, the threshold voltage cannot be well adjusted.

Further, if a polysilicon film is used as the gate electrode G, a phenomenon occurs that the polysilicon film is depleted at an interface between the gate insulating film GOX and the gate electrode G. The depleted polysilicon film functions as a capacitor insulating film, and therefore, not only the gate insulating film GOX becomes the capacitor insulating film between the gate electrode G and the semiconductor substrate, but also the depleted polysilicon film becomes a part of the capacitor insulating film. In the case where the gate insulating film GOX is thick, the effect of the depleted polysilicon film can be ignored, however, accompanying the reduction in thickness of the gate insulating film GOX, the effect of the depleted polysilicon film cannot be ignored. That is, even if the thickness of the gate insulating film GOX is reduced, when a polysilicon film is used as the gate electrode G, the thickness of the gate insulating film GOX is substantially increased by the thickness of the depleted polysilicon film. Due to this, the capacitance between the gate electrode G and the semiconductor substrate is decreased, and therefore, it becomes difficult to ensure a sufficient on-current.

In view of this, a study has been carried out on the formation of the gate electrode G arranged on the gate insulating film GOX from a metal film in place of a polysilicon film in the case where a high-dielectric constant film having a higher dielectric constant than a silicon oxide film is used as the gate insulating film GOX. If the gate electrode G is formed from a metal film, the threshold voltage can be adjusted by selecting the type of the metal film without adjusting the threshold voltage by doping an impurity as in the case of a polysilicon film. Therefore, by using a metal film as the gate electrode G, the above-described problem of Fermi level pinning can be avoided. Further, since a polysilicon film is not used as the gate electrode G, the problem of depletion of the gate electrode can also be avoided.

On the other hand, in the case where the metal film is used as the gate electrode G, the processing accuracy of a metal film is problematic. That is, accompanying the miniaturization of a MOSFET, it has been demanded that the processing accuracy of the gate electrode G should also be increased. However, it becomes difficult to process a metal film by a common etching technique. Therefore, in the case where the gate electrode G is formed from a metal film, the thickness of the metal film is increased, and it becomes difficult to improve the processing accuracy of the gate electrode G. That is, when the gate electrode G is formed from a metal film, it is difficult to improve the processing accuracy, and it becomes difficult to form the gate electrode having a gate length as designed. In this case, it becomes difficult to obtain predetermined electrical characteristics, and also a variation in gate length among a plurality of MOSFETs is increased.

In view of this, in the case where a metal film is used as the gate electrode G, as described in this ninth embodiment, a so-called damascene gate process is useful. This is because in a damascene gate process, it is not necessary to process a metal film constituting the gate electrode G by etching, but the formation can be achieved by burying a metal film in a ditch and removing an unnecessary portion of the metal film through polishing using a CMP method. Therefore, according to this ninth embodiment, even in the case where the gate electrode G is formed from a metal film, the processing accuracy of the gate electrode G can be improved. As a result, according to the method for producing a semiconductor device described in this ninth embodiment, in particular, it is effective in a method for producing a MOSFET in which a high-dielectric constant film is used as the gate insulating film GOX and a metal film is used as the gate electrode G, but it can also be effectively applied to the case where the gate insulating film GOX or the gate electrode G is constituted by another material. Accordingly, the method for producing a semiconductor device of this ninth embodiment can be considered as a process having a high degree of freedom of selection of a material constituting the gate insulating film GOX or the gate electrode G, and as a result, it is possible to obtain an advantage that the degree of freedom of selection of the gate insulating film GOX or the gate electrode G can be improved.

Tenth Embodiment

Figure 81:
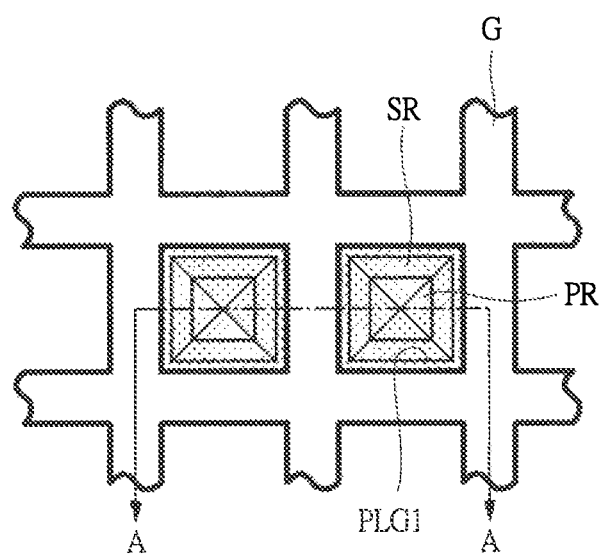
FIG. 81 is a plan view showing an example of a layout structure of a semiconductor device according to a tenth embodiment.

In a tenth embodiment of the invention, a case where the technical idea of the invention is applied to a so-called trench gate MOSFET will be described.
<Structure of Semiconductor Device According to Tenth Embodiment>
FIG. 81 is a plan view showing an example of a layout structure of a SiC power MOSFET according to the tenth embodiment of the invention. In FIG. 81, in the SiC power MOSFET according to this tenth embodiment, gate electrodes G are arranged in the form of a lattice, and a source region SR is formed in each basic cell surrounded by the gate electrodes G.

Here, in FIG. 81, the source region SR is formed in the entire area inside the basic cell surrounded by the gate electrodes G in plan view. Further, a $p^+$-type semiconductor region PR is formed on a lower layer overlapping the source region SR in plan view. That is, in FIG. 81, the source region SR is formed also in a region covering the $p^+$-type semiconductor region PR. At this time, as shown in FIG. 81, the source region SR and a plug PLG1 are electrically connected to each other. Incidentally, in this tenth embodiment, an edge portion of the source region SR does not protrude from the gate electrode G. That is, in this tenth embodiment, the source region SR is formed in a self-aligned manner with the gate electrode G.

Figure 82:
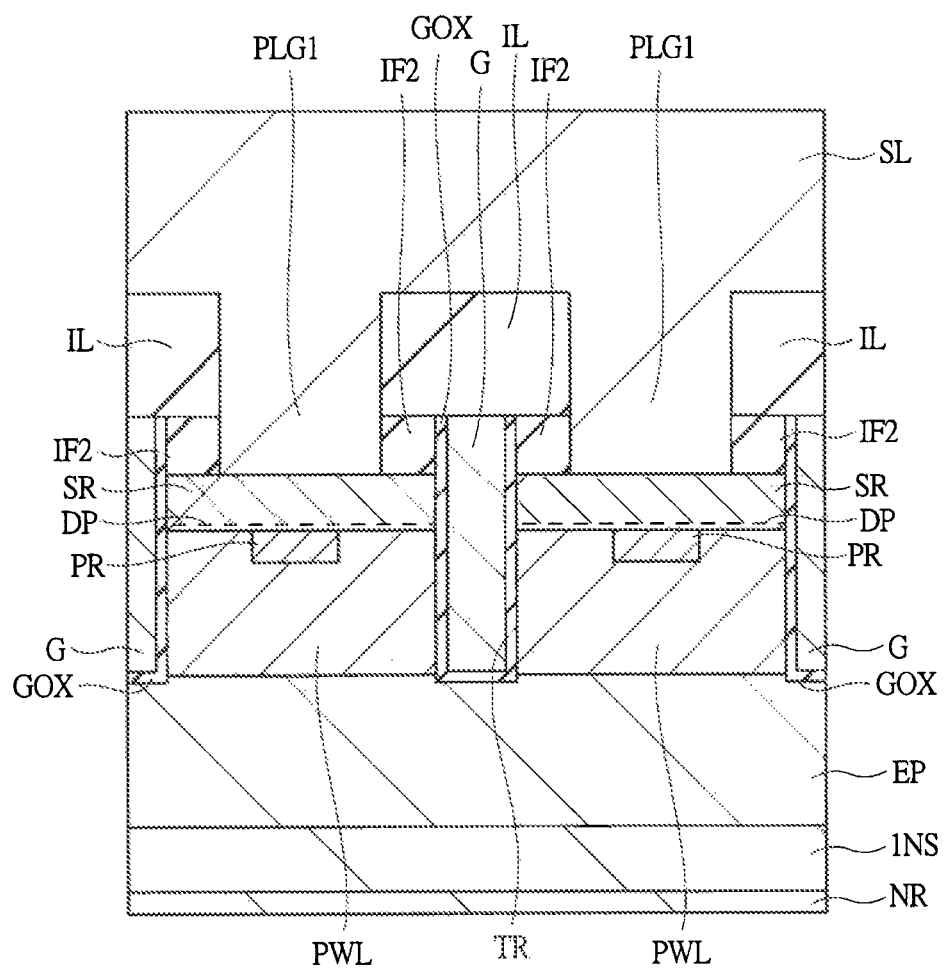
FIG. 82 is a view showing a cross-sectional structure of the semiconductor device according to the tenth embodiment, and is a cross-sectional view taken along the line A-A of FIG. 81.

FIG. 82 is a view showing a cross-sectional structure of the SiC power MOSFET according to this tenth embodiment, and shows a cross-sectional view taken along the line A-A of FIG. 81.

In FIG. 82, the SiC power MOSFET according to this tenth embodiment has, for example, a semiconductor substrate 1NS composed of SiC doped with an n-type impurity such as nitrogen (N), and on the back surface (lower surface) of this semiconductor substrate 1NS, an $n^+$-type semiconductor region NR doped with an n-type impurity at a higher concentration than that of the n-type impurity doped into the semiconductor substrate 1NS is formed.

On the other hand, on the front surface (upper surface) of the semiconductor substrate 1NS, an epitaxial layer EP is formed. This epitaxial layer EP is also called a drift layer and is constituted by SiC doped with an n-type impurity such as nitrogen (N). The impurity concentration of the n-type impurity doped into the epitaxial layer EP is lower than that of the n-type impurity doped into the semiconductor substrate 1NS, and the epitaxial layer EP is formed for ensuring the voltage resistance of the SiC power MOSFET.

Subsequently, on the epitaxial layer EP, for example, a p-type well PWL composed of SiC doped with a p-type impurity such as aluminum (Al) is formed so as to be in contact with the epitaxial layer EP, and on this p-type well PWL, a source region SR is formed. This source region SR is constituted by a metal material, and is formed from, for example, a metal silicide represented by nickel silicide.

Further, in FIG. 82, a $p^+$-type semiconductor region PR is formed in a surface region of the p-type well PWL in contact with the source region SR in plan view. This $p^+$-type semiconductor region PR is doped with a p-type impurity at a higher concentration than that of the p-type impurity doped into the p-type well PWL. This $p^+$-type semiconductor region PR is provided for stably supplying a potential to the p-type well PWL.

Here, also in this tenth embodiment, the conductive impurity DP is segregated at an interface between the source region SR constituted by, for example, nickel silicide and the p-type well PWL. That is, also in this tenth embodiment, as indicated by a dashed line in FIG. 82, the conductive impurity DP is doped at an interface between the source region SR and the p-type well PWL. At this time, the conductive impurity DP may be either an n-type impurity or a p-type impurity.

Subsequently, on the source region SR, an insulating film IF2 composed of, for example, a silicon oxide film is formed, and in this insulating film IF2 a trench TR is formed. Specifically, the trench TR is formed such that it passes through the insulating film IF2, the source region SR, and the p-type well PWL and reaches the epitaxial layer EP. Then, a gate insulating film GOX is formed on the side surfaces and the bottom surface of the trench TR, and on this gate insulating film GOX, a gate electrode G is formed such that it is buried in the trench TR. The gate insulating film GOX is formed from, for example, a silicon oxide film, and the gate electrode G can be formed from, for example, a polysilicon film containing a conductive impurity (phosphorus) at a high concentration.

On the insulating film IF2 having the trench TR formed thereon, an interlayer insulating film IL is formed, and an opening is formed from this interlayer insulating film IL to the insulating film IF2. From the bottom surface of this opening, a part of the source region SR is exposed, and in this opening, for example, an aluminum film is buried, whereby a plug PLG1 is formed. This plug PLG1 is electrically connected to the source region SR, and a reference potential (a GND potential) is supplied to the source region SR from a source ling SL formed on the plug PLG1 through the plug PLG1.

Figure 83:
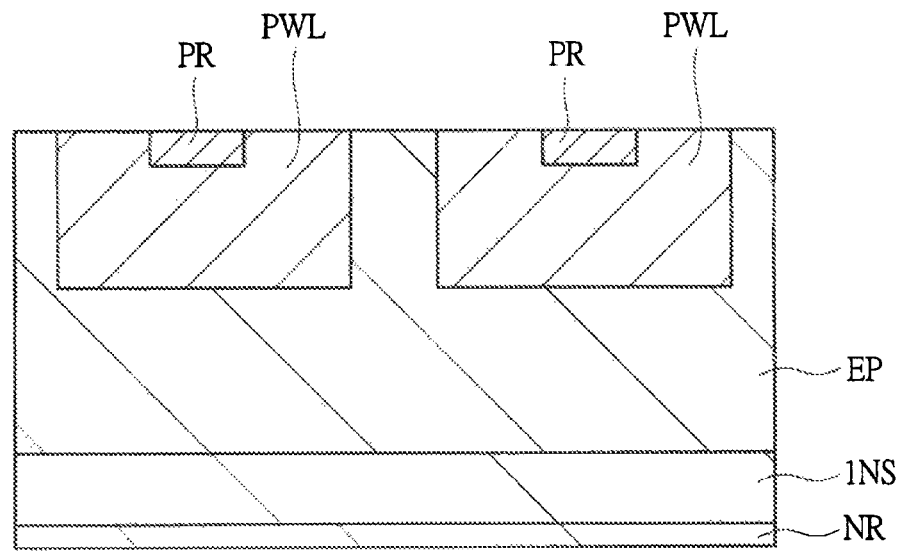
FIG. 83 is a cross-sectional view showing a process for producing the semiconductor device according to the tenth embodiment.

Also in the SiC power MOSFET according to this tenth embodiment configured in this manner, the source region SR is formed from a nickel silicide film which is a metal material film in the same manner as in the above-described first embodiment, and therefore, a source region SR having a low resistance and a large carrier density can be formed. Further, also in this tenth embodiment, the conductive impurity DP (phosphorus) is segregated at an interface between the source region SR and the p-type well PWL including the channel forming region, and therefore, the height of a Schottky barrier formed between the source region SR and the channel forming region (p-type well PWL) can be decreased. Due to this, the injection efficiency and injection rate of a carrier (electron) from an edge portion of the source region SR to the channel region can be improved, and as a result, the channel mobility in the SiC power MOSFET can be improved.
<Method for Producing Semiconductor Device According to Tenth Embodiment>
The semiconductor device according to this tenth embodiment is configured as described above, and hereinafter, a production method thereof will be described with reference to the accompanying drawings. Incidentally, the process until the steps shown in FIGS. 8 and 9 in this embodiment is the same as that in the above-described first embodiment, and therefore, the steps thereafter will be described. FIG. 83 is a view showing a cross-sectional structure of the SiC epitaxial substrate after the steps shown in FIGS. 8 and 9. That is, also in this tenth embodiment, all the semiconductor regions required for the SiC epitaxial substrate by the stage shown in FIG. 83 are formed.

Figure 84:
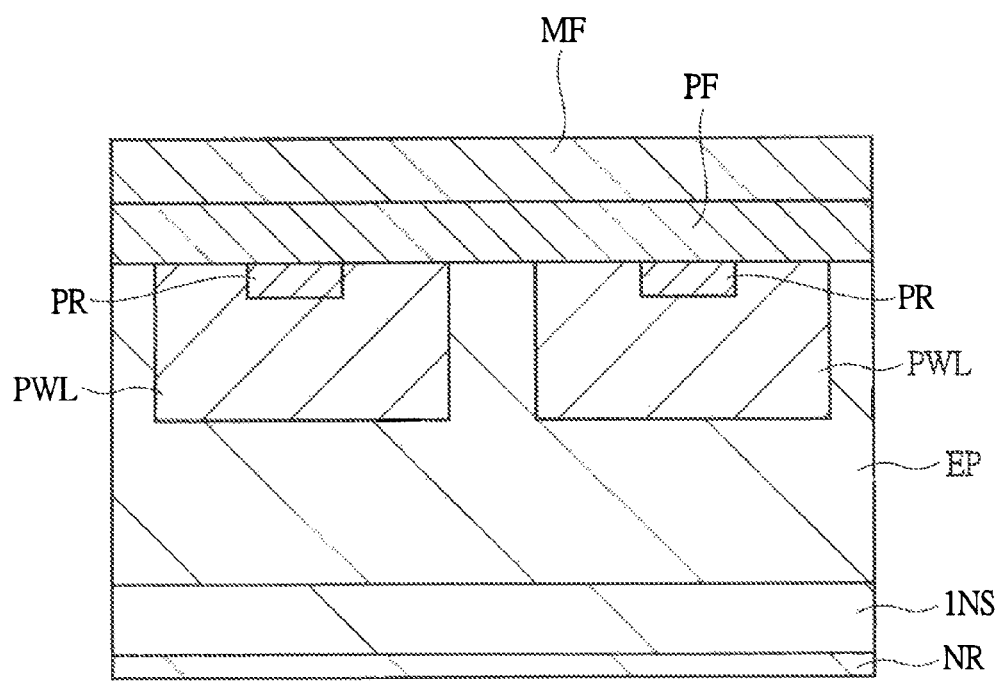
FIG. 84 is a cross-sectional view showing the process for producing the semiconductor device continued from FIG. 83.

Subsequently, as shown in FIG. 84, on the SiC epitaxial substrate, a polysilicon film PF is formed. This polysilicon film PF can be formed by using, for example, a CVD method, and the thickness thereof is, for example, about 50 nm. Into this polysilicon film PF, a conductive impurity (phosphorus) is doped. Thereafter, on the polysilicon film PF, a metal film MF is formed. The metal film MF is constituted by, for example, a nickel film, and can be formed by using, for example, a sputtering method. The thickness of this metal film MF is, for example, about 50 nm.

Figure 85:
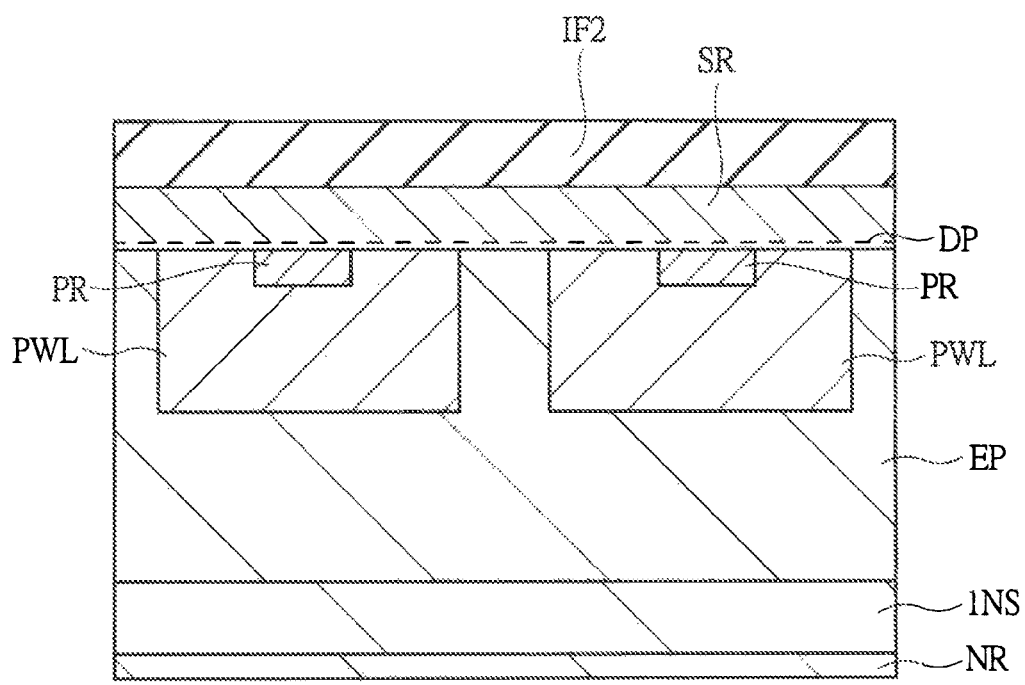
FIG. 85 is a cross-sectional view showing the process for producing the semiconductor device continued from FIG. 84.

Thereafter, the SiC epitaxial substrate having the polysilicon film PF and the metal film MF formed thereon as shown in FIG. 85 is subjected to a heat treatment. By doing this, a silicidation reaction between the polysilicon film PF and the metal film MF (nickel film) is allowed to proceed, whereby a nickel silicide film is formed. During this silicidation reaction, the conductive impurity DP (phosphorus) doped into the polysilicon film PF moves and aggregates at an interface with the SiC epitaxial substrate. In this manner, according to this tenth embodiment, in a boundary region between the nickel silicide film and the p-type well PWL, an interface at which the conductive impurity DP (phosphorus) is segregated in a self-aligned manner can be provided. As described above, according to this tenth embodiment, a source region SR composed of a nickel silicide film can be formed, and also the conductive impurity DP (phosphorus) can be segregated at an interface between the source region SR and the p-type well PWL. Then, on the source region SR composed of nickel silicide, an insulating film IF2 composed of, for example, a silicon oxide film is formed. This insulating film 1F2 can be formed by using, for example, a CVD method.

Figure 86:
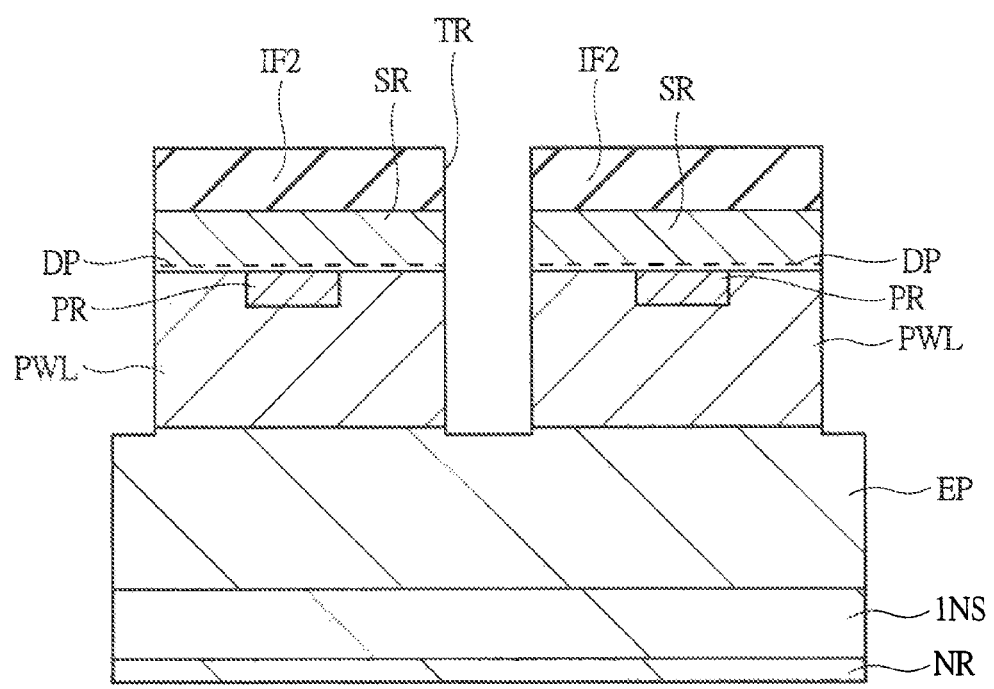
FIG. 86 is a cross-sectional view showing the process for producing the semiconductor device continued from FIG. 85.

Subsequently, as shown in FIG. 86, by using a photolithographic technique and an etching technique, a trench TR which passes through the insulating film IF2, the source region SR, and the p-type well PWL, and reaches the epitaxial layer EP is formed.

Figure 87:
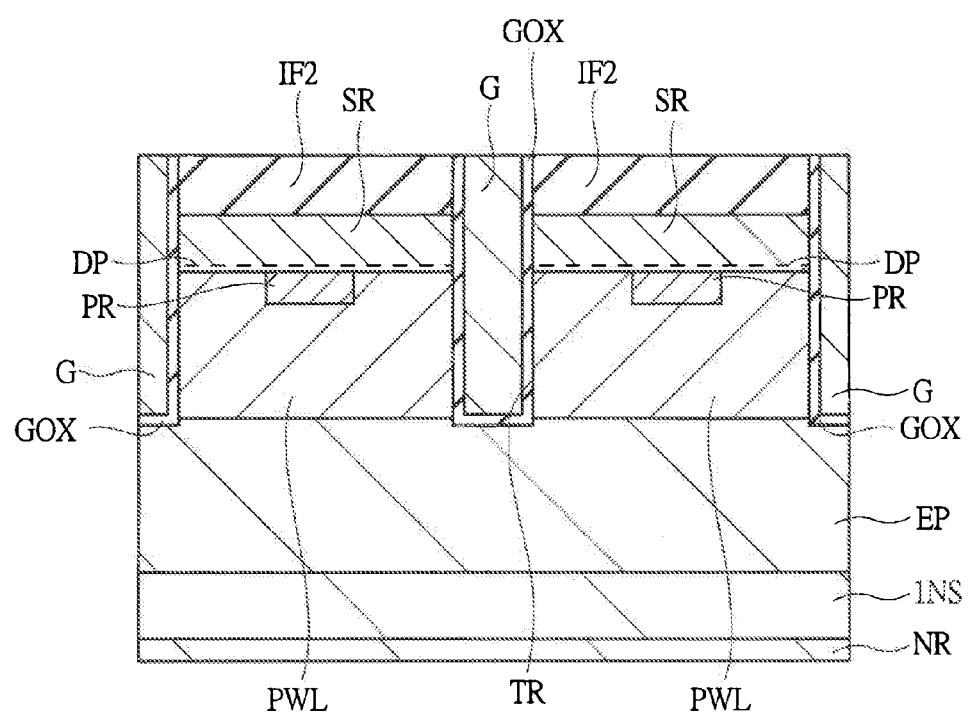
FIG. 87 is a cross-sectional view showing the process for producing the semiconductor device continued from FIG. 86.

Subsequently, as shown in FIG. 87, on the SiC epitaxial substrate including the trench TR, a gate insulating film GOX is formed, and on this gate insulating film GOX, a polysilicon film is formed. At this time, the gate insulating film GOX is formed on the side surfaces and the bottom surface of the trench TR, and on this gate insulating film GOX, a polysilicon film is formed such that it is buried in the trench TR. Then, an unnecessary portion of the polysilicon film and the gate insulating film GOX formed on the insulating film IF2 is removed by, for example, a CMP method, whereby the gate insulating film GOX and the polysilicon film are left only in the trench TR. By doing this, in the trench TR, the gate insulating film GOX and a gate electrode G composed of the polysilicon film buried in the trench TR through the gate insulating film GOX can be formed. In this manner, according to this tenth embodiment, the gate electrode G arranged in a self-aligned manner with the source region SR can be formed.

Figure 88:
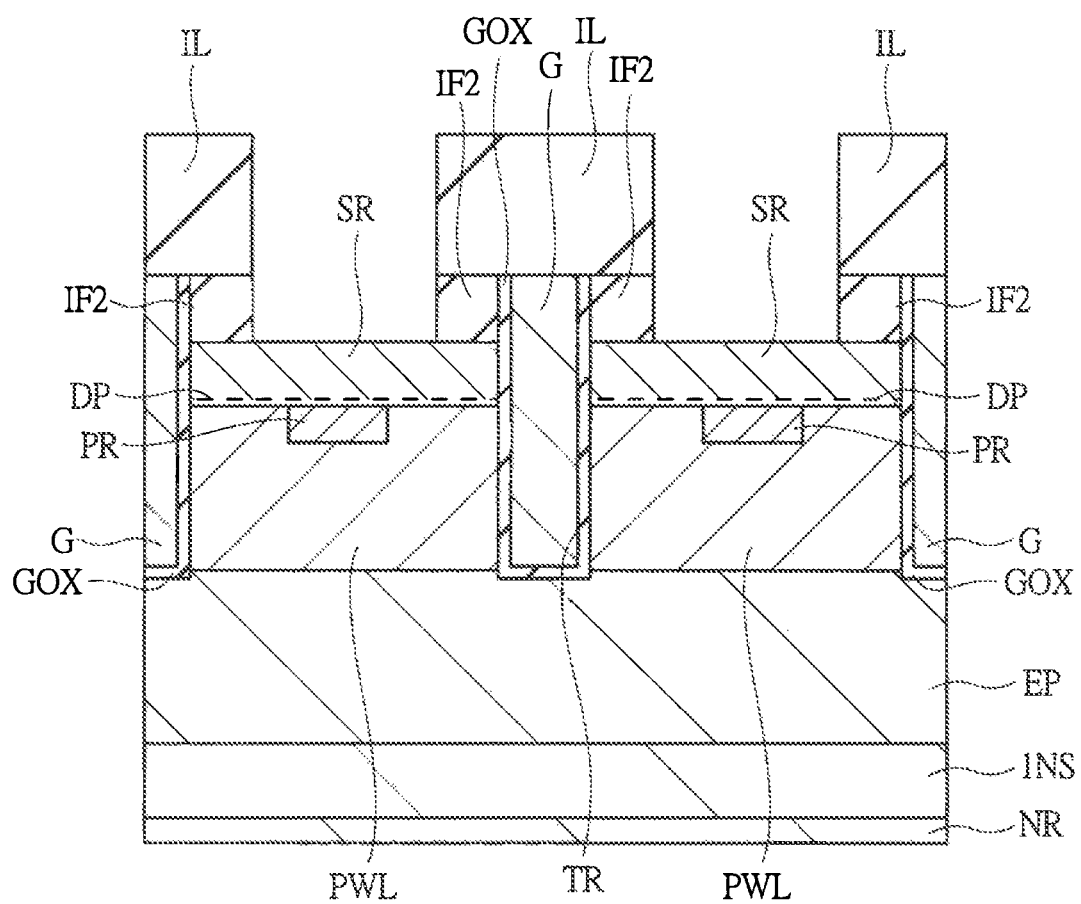
FIG. 88 is a cross-sectional view showing the process for producing the semiconductor device continued from FIG. 87.

Subsequently, as shown in FIG. 88, on the SiC epitaxial substrate having the gate electrode G formed thereon, an interlayer insulating film IL is formed. This interlayer insulating film IL is formed so as to cover the insulating film IF2 having the gate electrode G formed thereon, and is formed from, for example, a silicon oxide film. Thereafter, by using a photolithographic technique and an etching technique, an opening (a contact hole) is formed in the interlayer insulating film IL. This opening is formed so as to expose a part of the source region SR. Although not shown in FIG. 88, it is also possible to form an opening reaching the gate electrode G.

Subsequently, as shown in FIG. 82, on the interlayer insulating film IL having the opening therein, an aluminum film is formed by using, for example a sputtering method. The thickness of this aluminum film is, for example, 2 μm. At this time, by burying the aluminum film in the opening formed in the interlayer insulating film IL, a plug PLG1 is formed. Then, by using a photolithographic technique and an etching technique, this aluminum film is patterned, whereby a source line SL electrically connected to this plug PLG1 is formed.

The steps after this line forming step can be performed by a known semiconductor process, and the SiC power MOSFET (semiconductor device) according to this tenth embodiment can be produced in the end by a useful self-aligning process.

<Modification Example>

Figure 89:
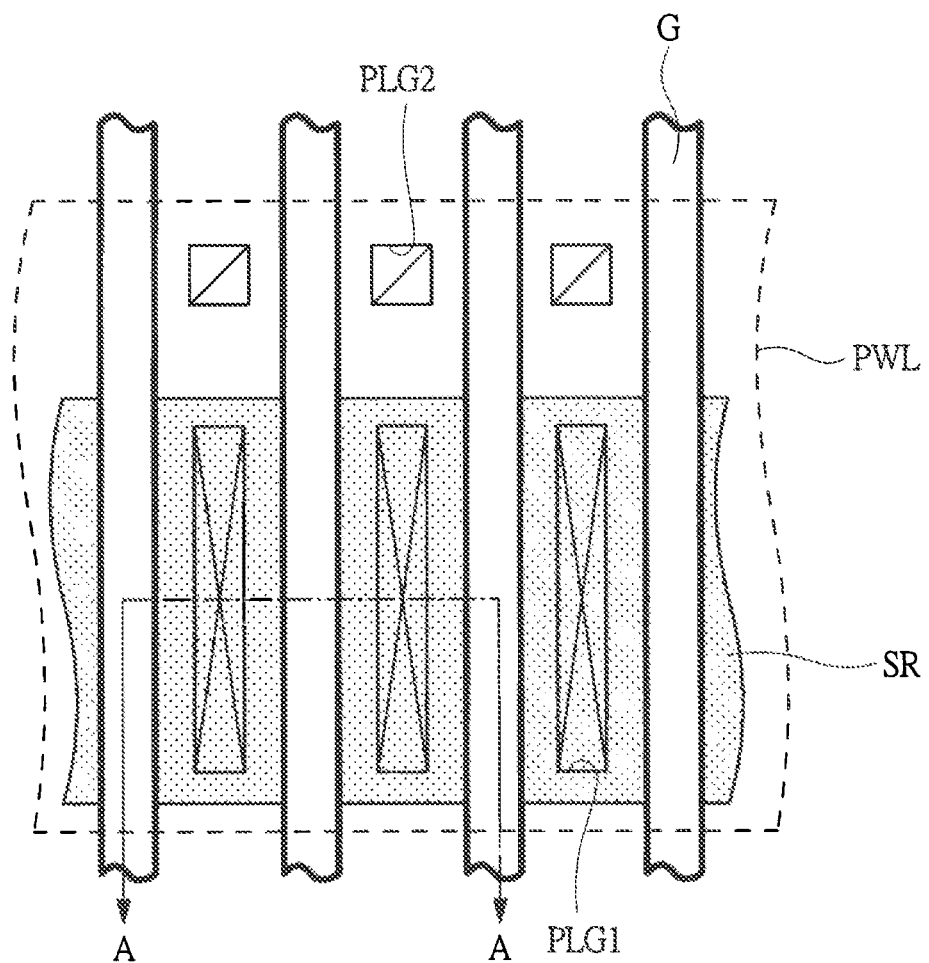
FIG. 89 is a plan view showing a layout structure of a semiconductor device according to a modification example.

FIG. 89 is a plan view showing a layout structure of a SiC power MOSFET (a semiconductor device) according to a modification example. As shown in FIG. 89, in the SiC power MOSFET according to this modification example, gate electrodes G are arranged in parallel in a stripe form with a small pitch. Further, a source region SR is formed between the gate electrodes G, and to this source region SR, a plug PLG1 is electrically connected. On the other hand, a p-type well PWL is formed in a large region so as to include the source region SR in plan view, and to this p-type well PWL, a plug PLG2 is electrically connected. At this time, the plug PLG1 and the plug PLG2 are formed in different regions. That is, in this modification example, as shown in FIG. 89, the plug PLG1 electrically connected to the source region SR and the plug PLG2 electrically connected to the p-type well PWL are separated from each other. It is noted that the plug PLG1 and the plug PLG2 are electrically connected to a common source line (not shown), and to the source region SR and the p-type well PWL, the same reference potential (GND potential) is supplied. In this manner, in this modification example, by forming the plug PLG1 and the plug PLG2 in different regions, an advantage that the degree of freedom of the layout structure of the SC power MOSFET can be increased is obtained.

Figure 90:
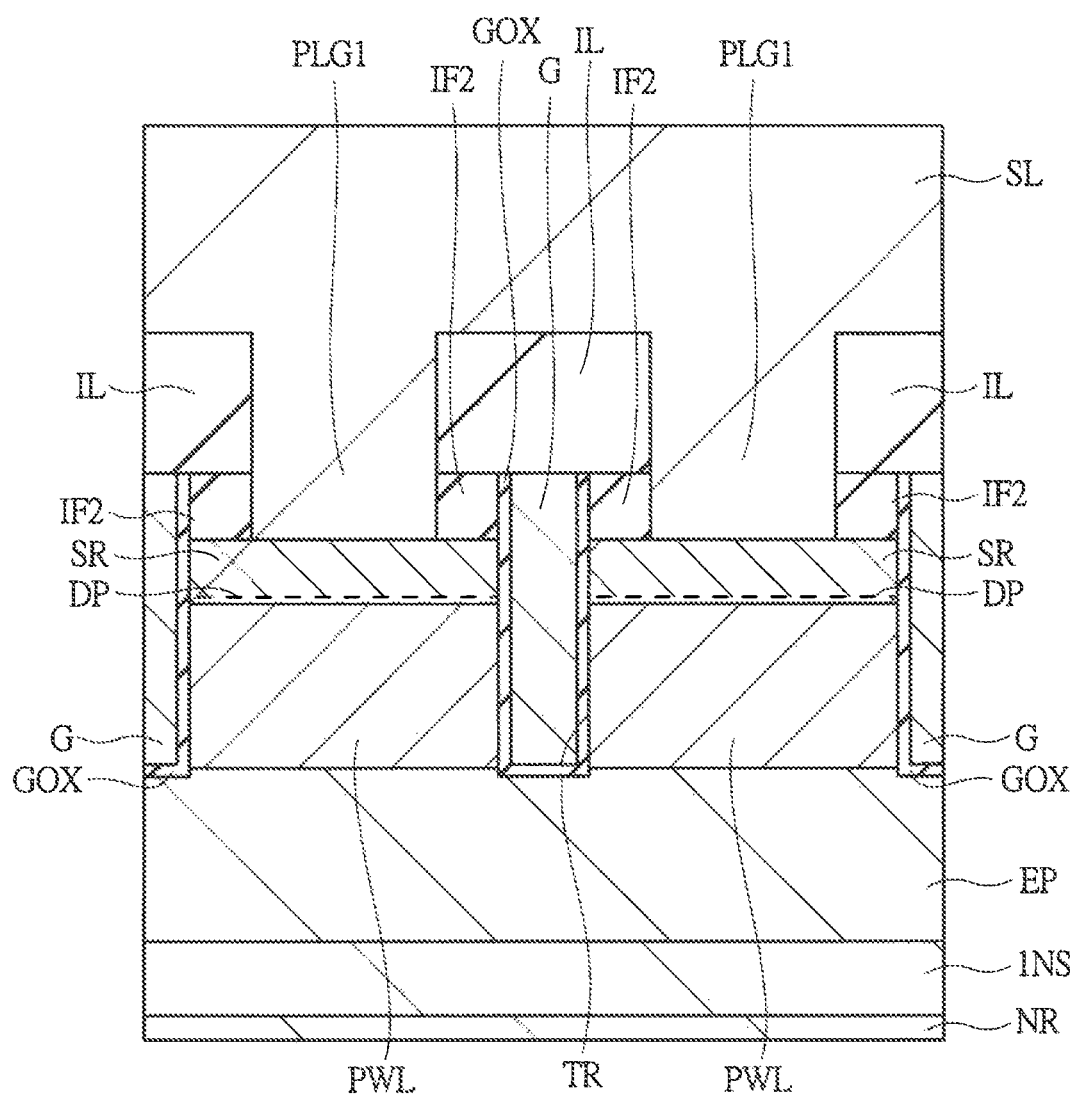
FIG. 90 is a cross-sectional view taken along the line A-A of FIG. 89.

FIG. 90 is a cross-sectional view taken along the line A-A of FIG. 89. FIG. 90 is a cross-sectional view taken along a cross-section including the plug PLG1 electrically connected to the source region SR, and therefore, as shown in FIG. 90, the plug PLG2 formed in a different region from that of the plug PLG1 is not shown. However, in fact, the plug PLG2 is formed in a different region. The structure of the SiC power MOSFET according to this modification example shown in FIG. 90 is substantially the same as that of the SiC power MOSFET according to the above-described tenth embodiment shown in FIG. 82. A different point is that, in this modification example, since the plug PLG1 electrically connected to the source region SR and the plug PLG2 electrically connected to the p-type well PWL are formed such that they are separated from each other, and therefore, in FIG. 90, the $p^+$-type semiconductor region PR is not shown in the p-type well PWL. The other structures in this modification example are the same as those in the above-described tenth embodiment.

<Advantage of Tenth Embodiment>

For example, in a planar vertical MOSFET, for example, as shown in FIG. 4, electrons flowing out from the source region SR flow in the horizontal direction to the surface of the epitaxial layer EP by passing through a channel formed on the surface of the p-type PWL sandwiched by the source region SR and the epitaxial layer EP, and thereafter, flow in the vertical direction to a drain electrode (not shown) formed on the back surface side of the semiconductor substrate 1NS from the surface of the epitaxial layer EP sandwiched by a pair of p-type wells PWL. Due to this, the pathway through which electrons flow from the source region SR to the drain electrode is long, and therefore, a large parasitic resistance (on-resistance) may be caused.

On the other hand, in a so-called trench gate MOSFET described in this tenth embodiment, for example, as shown in FIG. 82, electrons flowing out from the source region SR flow in the vertical direction through a channel formed in the p-type well PWL in contact with the side wall of the trench TR, and thereafter, flow to a drain electrode (not shown) formed on the back surface of the semiconductor substrate 1NS bypassing through the epitaxial layer EP. That is, in the trench gate MOSFET, electrons flow only in the vertical direction from the source region to the drain electrode, and therefore, an advantage that the parasitic resistance (on-resistance) can be decreased is obtained.

Further, in the trench gate MOSFET, the plane area of the gate electrode G can be reduced, and therefore, an advantage that the layout area of the SiC power MOSFET formed in a semiconductor chip can be reduced is obtained. In other words, the trench gate MOSFET has an advantage that the integration degree of the SiC power MOSFET can be improved.

Eleventh Embodiment

In an eleventh embodiment of the invention, an example in which the technical idea of the invention is applied to an IGBT (Insulated Gate Bipolar Transistor) will be described. That is, the SiC power MOSFET of the invention can be used as an IGBT by using a bipolar transistor in combination. This is because an IGBT is generally combined with a vertical MOSFET (DMOSFET), and therefore, the structure of the SiC power MOSFET of the invention can be easily applied. In particular, this IGBT is used in the application in which a high current is used.

Figure 91:
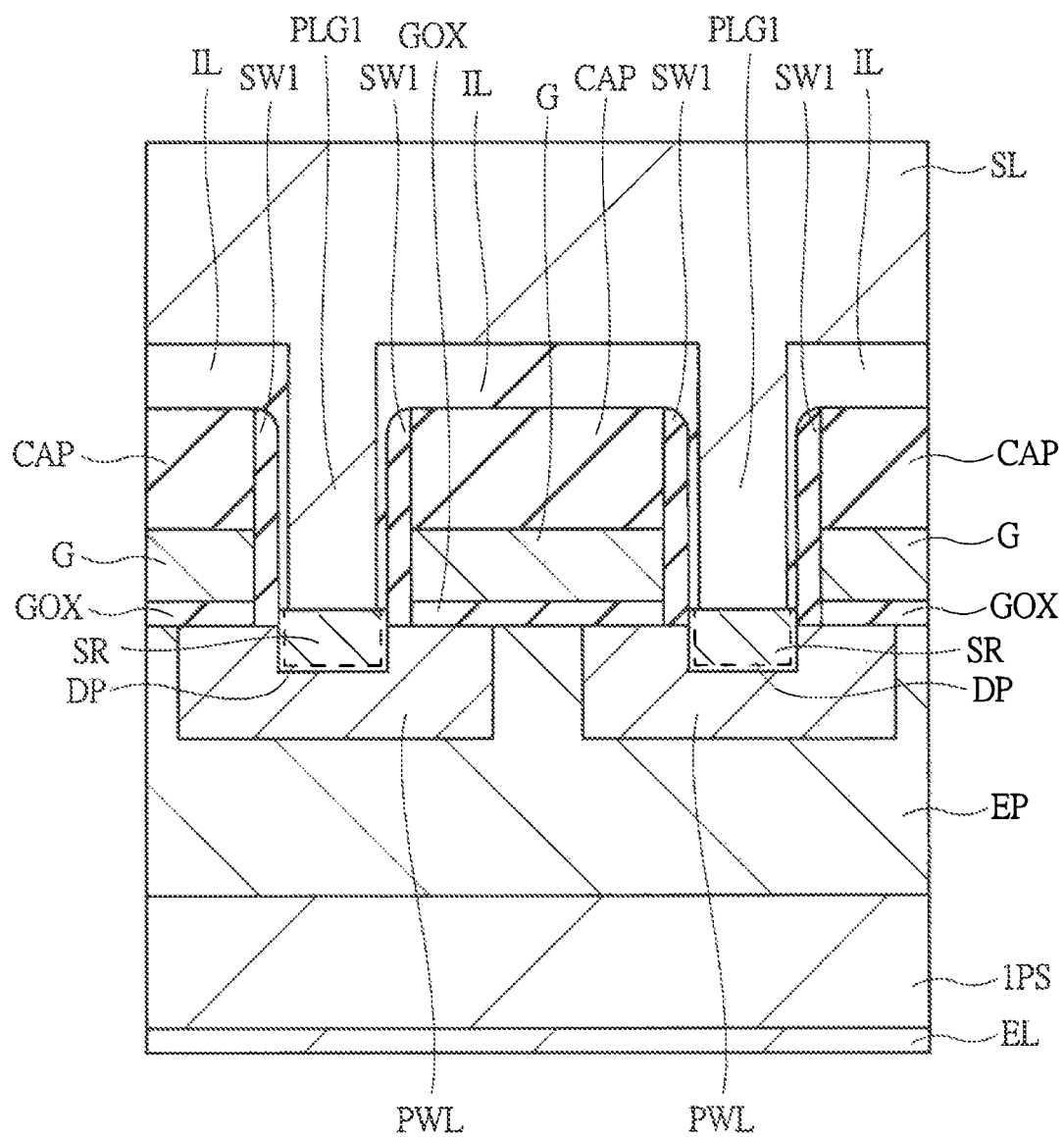
FIG. 91 is a cross-sectional view showing a structure of a semiconductor device according to an eleventh embodiment.

FIG. 91 is a cross-sectional view showing a structure of an IGBT according to this eleventh embodiment. In the IGBT according to this eleventh embodiment, for example, the structure of the SiC power MOSFET according to the above-described eighth embodiment shown in FIG. 59 is applied as it is. That is, in the IGBT shown in FIG. 91, the structure of the upper layer than the epitaxial layer EP is the same as that shown in FIG. 59. Further, in the IGBT shown in FIG. 91, on the lower layer of the epitaxial layer EP, a semiconductor substrate 1PS composed of SiC doped with a p-type impurity is formed, and on the back surface of this semiconductor substrate 1PS, a collector electrode EL is formed. In the IGBT configured in this manner, a MOSFET formed on the upper layer than the epitaxial layer EP and a PNP structure (a PNP bipolar transistor) composed of the p-type well, the epitaxial layer EP, and the semiconductor substrate 1PS are combined, and according to this configuration, the IGBT operation can be realized.

Also in the IGBT according to this eleventh embodiment configured in this manner, the source region SR (which is called an emitter region in the IGBT) is formed from a nickel silicide film which is a metal material film, and therefore, a source region SR (an emitter region) having a low resistance and a large carrier density can be formed. Further, also in this eleventh embodiment, the conductive impurity DP (phosphorus) is segregated at an interface between the source region SR (emitter region) and the p-type well PWL including the channel forming region, and therefore, the height of a Schottky barrier formed between the source region SR (emitter region) and the channel forming region (p-type well PWL) can be decreased. Due to this, the injection efficiency and injection rate of a carrier (electron) from an edge portion of the source region SR (emitter region) to the channel region can be improved, and as a result, the channel mobility in the IGBT can be improved.

Twelfth Embodiment

In a twelfth embodiment of the invention, an example in which the technical idea of the invention is applied to an inverter circuit having a SiC power MOSFET and a diode mounted thereon will be described.

<Inverter Circuit Example>

Figure 92:
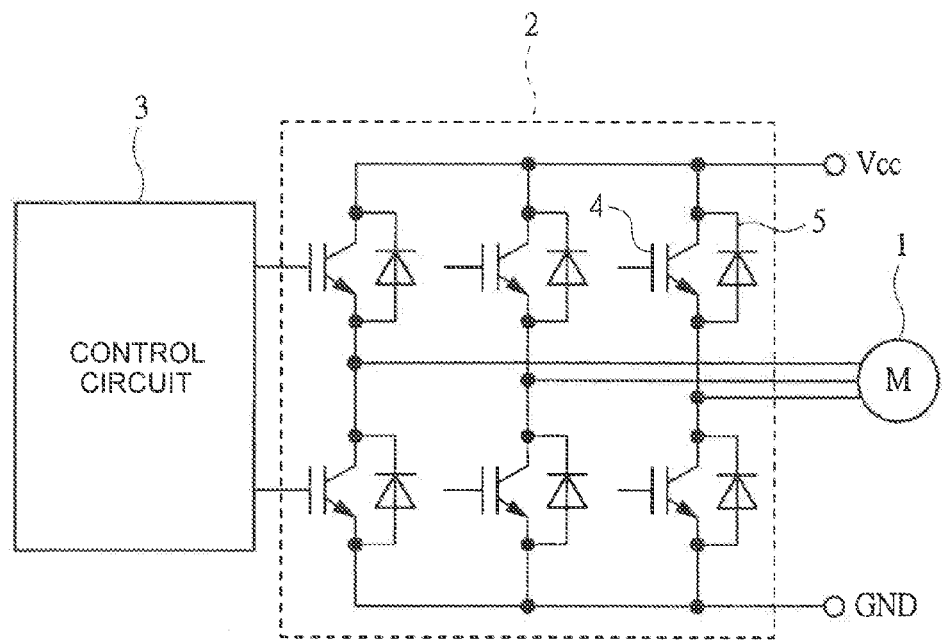
FIG. 92 is a view showing a circuit diagram of a three-phase motor according to a twelfth embodiment.

A semiconductor device according to the twelfth embodiment of the invention is used in a three-phase motor driving circuit which is used in, for example, hybrid cars, and so on. FIG. 92 is a view showing a circuit diagram of a three-phase motor according to this twelfth embodiment. In FIG. 92, a three-phase motor circuit has a three-phase motor 1, a power semiconductor device 2, and a control circuit 3. The three-phase motor 1 is configured to be driven by a three-phase voltage with different phases. The power semiconductor device 2 is constituted by a switching element that controls the three-phase motor 1, and is provided with, for example, SiC power MOSFETs 4 and diodes 5 corresponding to three phases. That is, for each single phase, between a power source potential (Vcc) and an input potential of the three-phase motor, the SiC power MOSFETs 4 and the diodes 5 are connected in an anti-parallel configuration, and also between the input potential of the three-phase motor and a ground potential (GND), the SiC power MOSFETs 4 and the diodes 5 are connected in an anti-parallel configuration. That is, in the three-phase motor 1, for each single phase (each phase), two SiC power MOSFETs 4 and two diodes 5 are provided, and for three phases, six SiC power MOSFETs 4 and six diodes 5 are provided. Further, to a gate electrode of each SiC power MOSFET 4, a control circuit 3 (illustration of a part thereof is omitted) is connected. By this control circuit 3, the SiC power MOSFETs 4 are controlled. In the three-phase motor driving circuit configured in this manner, by controlling a current flowing through the SiC power MOSFETs 4 (switching elements) constituting the power semiconductor device 2 by the control circuit 3, the three-phase motor 1 is rotated. That is, the SiC power MOSFETs 4 function as switching elements that supply a power source potential (Vcc) or a ground potential (GND) to the three-phase motor 1, and by controlling the on/off timing of the SiC power MOSFETs 4 by the control circuit 3, it becomes possible to drive the three-phase motor 1.

As shown in FIG. 92, the SiC power MOSFETs 4 and the diodes 5 are connected in an anti-parallel configuration, and the function of the diodes in this configuration will be described.

In the case where the load is a pure resistance with no inductance, the diode 5 is not needed because there is no energy to flow back. However, in the case where a circuit containing an inductance such as a motor (e.g., a three-phase motor) is connected to the load, there is a mode in which a load current flows in a direction opposite to the switch (SiC power MOSFET 4) which is turned on. Therefore, it is necessary to connect a diode to a switching element such as a SiC power MOSFET 4 in an anti-parallel configuration. That is, in the inverter circuit, in the case where an inductance is contained in the load such as controlling of a motor, when a switching element such as a SiC power MOSFET 4 is turned off, energy stored in the inductance ($\frac{1}{2}LI^2$) has to be discharged. Therefore, in order to flow back the electrical energy stored in this inductance, the diode 5 is connected to the SiC power MOSFET 4 in an anti-parallel configuration. That is, the diode 5 has a function of causing a current to flow in an opposite direction for discharging the electrical energy stored in the inductance.

<Structure of Semiconductor Device According to Twelfth Embodiment>

The SiC power MOSFET according to the invention has a characteristic feature that a stable Schottky barrier junction can be formed for SiC. Therefore, in this twelfth embodiment, an example in which a diode to be combined with the SiC power MOSFET is formed simultaneously when the above-described inverter circuit is formed will be described.

Figure 93:
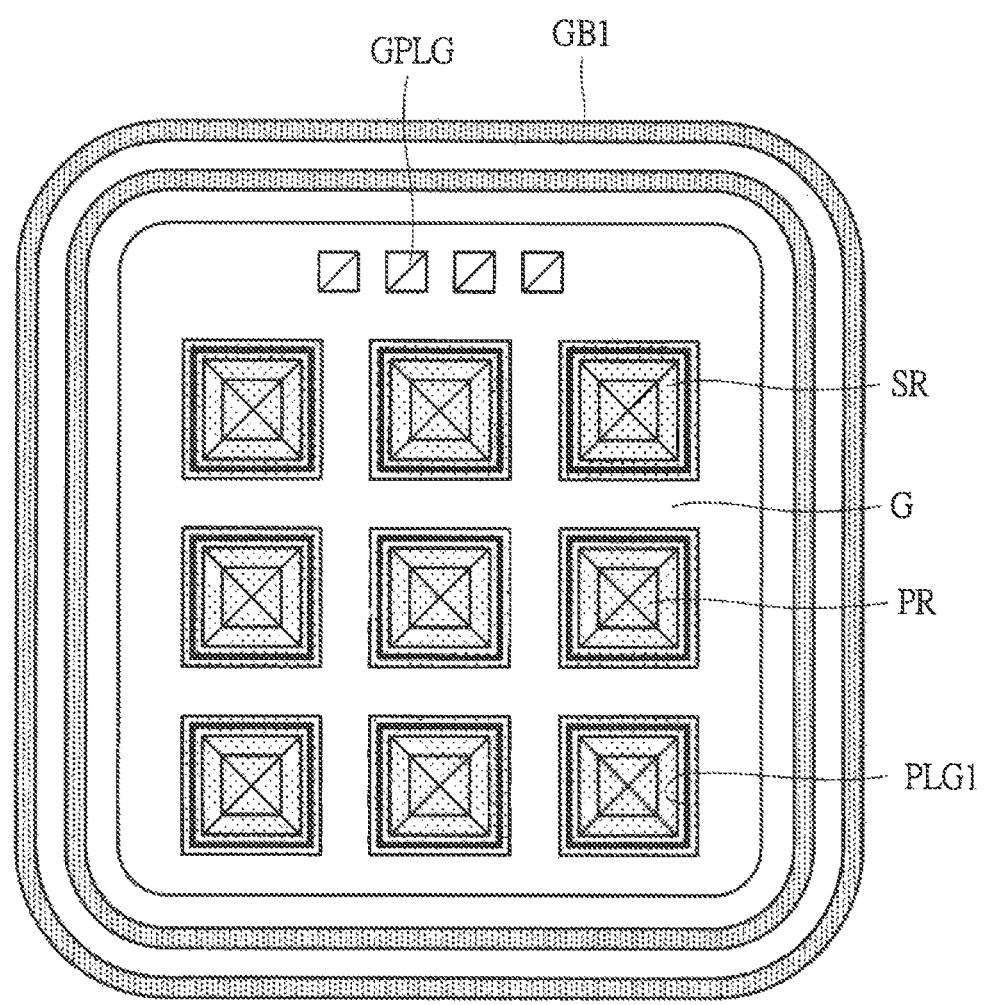
FIG. 93 is a plan view showing a layout structure of the semiconductor device according to the twelfth embodiment.

FIG. 93 is a plan view showing a layout structure of the SiC power MOSFET according to this twelfth embodiment. In FIG. 93, a MOSFET forming region in which the SiC power MOSFET is formed and a first guard band region surrounding the MOSFET forming region are shown. As shown in FIG. 93, in the MOSFET forming region, gate electrodes G of the SiC power MOSFET are arranged in the form of a lattice, and in regions surrounded by the gate electrodes G, a plurality of basic cells are formed in the form of an array. A source region SR of the SiC power MOSFET is formed inside each of the basic cells, and a $p^+$-type semiconductor region PR is formed on a lower layer overlapping the source region SR in plan view. The source region SR is electrically connected to a plug PLG1. On an outer peripheral portion of the MOSFET forming region, a gate plug GPLG electrically connected to a gate electrode G is formed. On the other hand, in the first guard band region, a double guard band GB1 is disposed. By this guard band GB1, the electric field in a terminal end portion of the MOSFET forming region can be relaxed.

Figure 94:
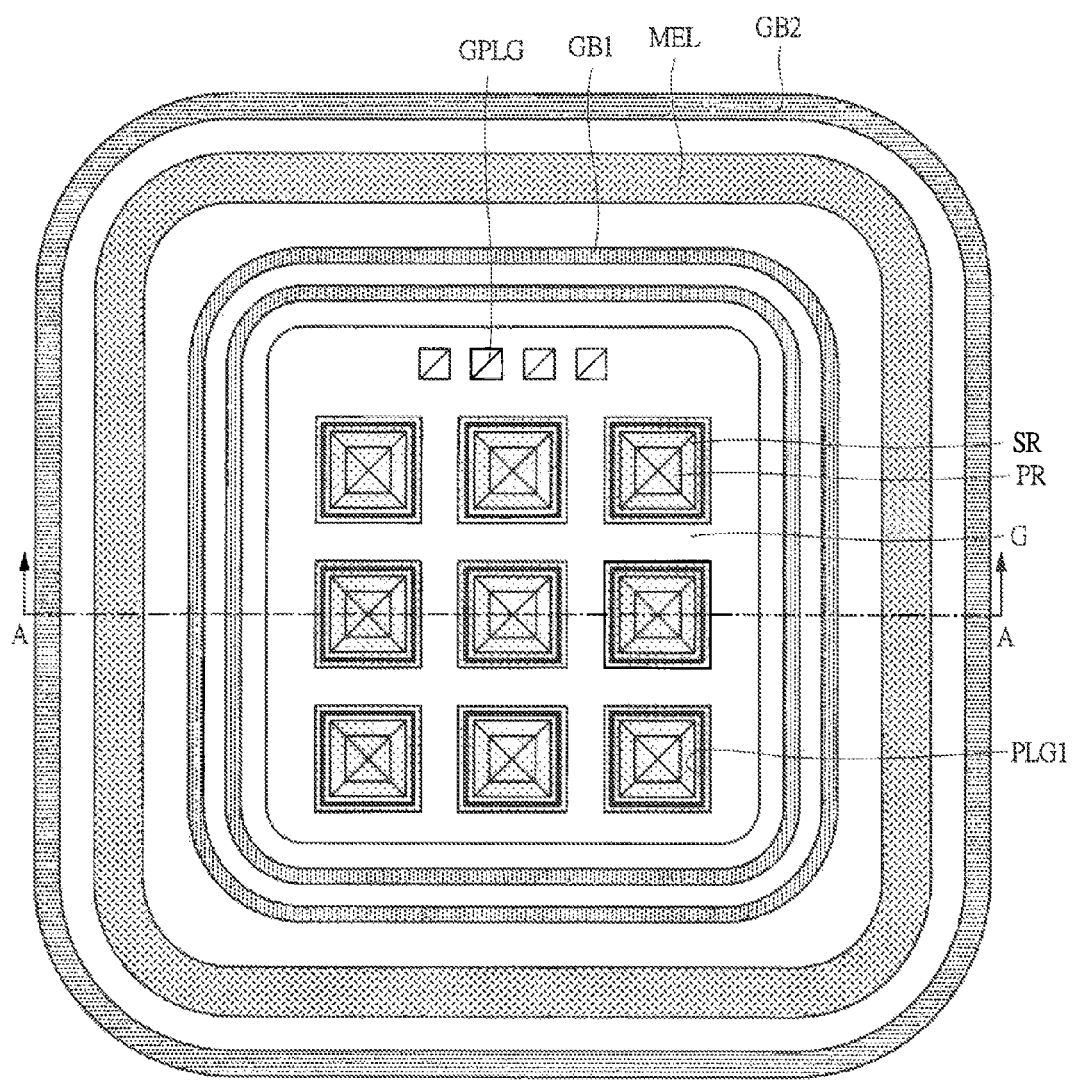
FIG. 94 is a plan view showing a layout structure of the semiconductor device according to the twelfth embodiment.

FIG. 94 shows an example in which a Schottky diode is formed in an outer region of the first guard band region shown in FIG. 93. As shown in FIG. 94, the outer region surrounding the first guard band GB1 becomes a Schottky diode forming region, and in this Schottky diode forming region, a metal electrode MEL constituting the Schottky diode is formed. Further, an outer region surrounding the Schottky diode forming region becomes a second guard band region, and in this second guard band region, a guard band GB2 is formed. This guard band GB2 is provided for maintaining the voltage resistance of the Schottky diode.

Figure 95:
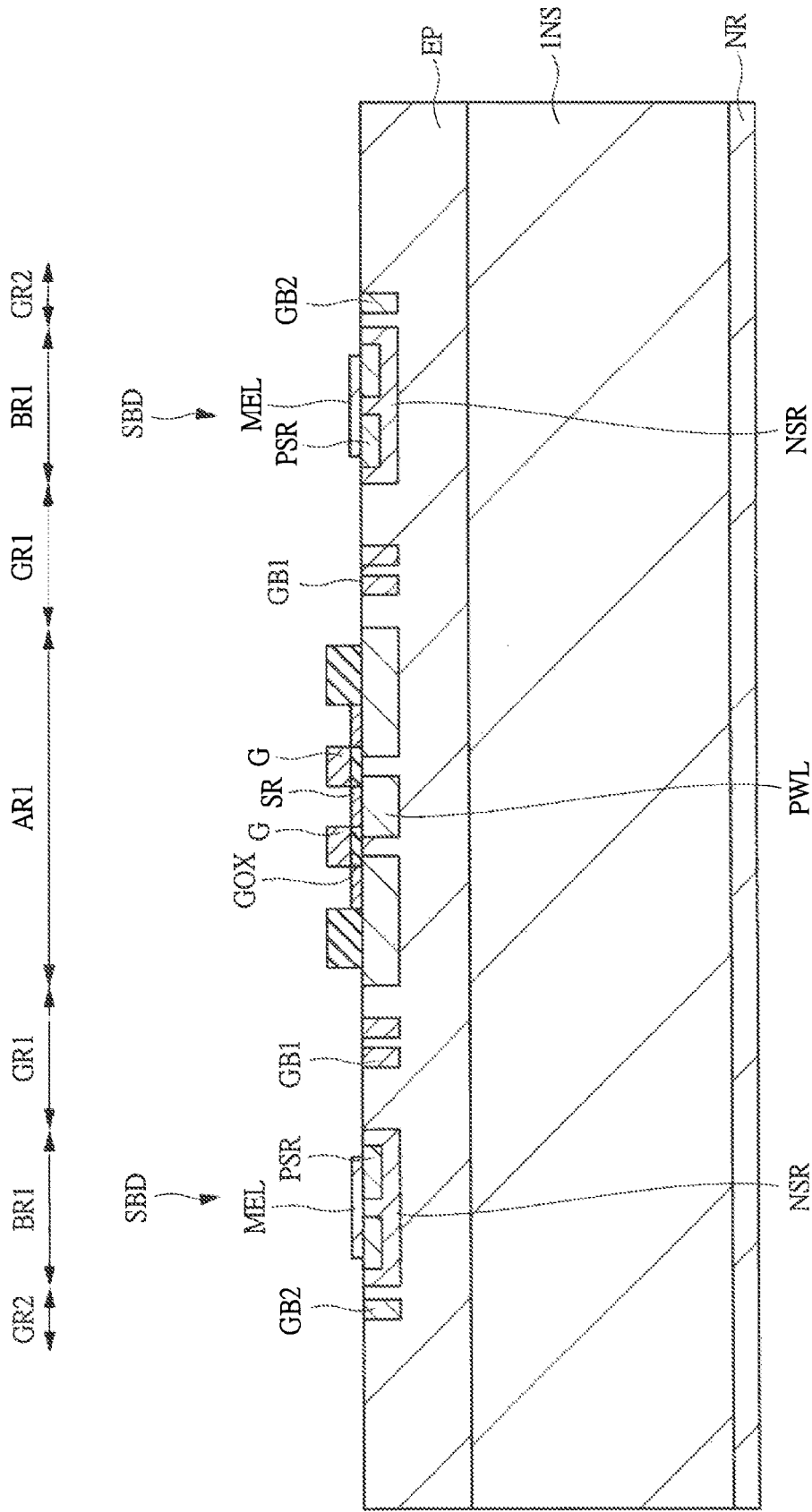
FIG. 95 is a cross-sectional view taken along the line A-A of FIG. 94.

FIG. 95 is a cross-sectional view taken along the line A-A of FIG. 94. In FIG. 95, a region AR1 denotes the MOSFET forming region in which the SiC power MOSFET is formed, and a region GR1 denotes the first guard band region. Further, a region BR1 denotes the Schottky diode forming region in which the Schottky diode SBD is formed, and a region GR2 denotes the second guard band region.

As shown in FIG. 95, the semiconductor device according to this twelfth embodiment has a semiconductor substrate 1NS composed of SiC doped with an n-type impurity such as nitrogen (N), and on the back surface (lower surface) of this semiconductor substrate 1NS, an $n^+$-type semiconductor region NR doped with an n-type impurity at a higher concentration than that of the n-type impurity doped into the semiconductor substrate 1NS is formed. On the other hand, on the front surface (upper surface) of the semiconductor substrate 1NS, an epitaxial layer EP is formed.

In the region AR1, the SiC power MOSFET is formed. Specifically, in the epitaxial layer EP, a p-type well PWL is formed, and on this p-type well PWL, a source region SR is formed. Further, on the upper layer of the p-type well PWL and the epitaxial layer EP, a gate electrode G is formed through a gate insulating film GOX such that it is sandwiched by a pair of source regions SR.

Also in the SiC power MOSFET according to this twelfth embodiment configured in this manner, the source region SR is formed from a nickel silicide film which is a metal material film in the same manner as in the above-described first embodiment, and therefore, a source region SR having a low resistance and a large carrier density can be formed. Further, also in this twelfth embodiment, the conductive impurity DP (phosphorus) is segregated at an interface between the source region SR and the p-type well PWL including the channel forming region, and therefore, the height of a Schottky barrier formed between the source region SR and the channel forming region (p-type well PWL) can be decreased. Due to this, the injection efficiency and injection rate of a carrier (electron) from an edge portion of the source region SR to the channel region can be improved, and as a result, the channel mobility in the SiC power MOSFET can be improved.

Subsequently, in the region GR1 which is formed outside the region AR1, the guard band GB1 composed of the p-type semiconductor region is formed in the epitaxial layer EP. This guard band GB1 has a function of relaxing the electric field in a terminal end portion of the region AR1 (MOSFET forming region).

Subsequently, in the region BR1 which is formed outside the region GR1, the Schottky diode SBD is formed. Specifically, an n-type semiconductor region NSR constituting a part of the Schottky diode SBD is formed in the epitaxial layer EP, and on this n-type semiconductor region NSR, the metal electrode MEL is formed. Therefore, a Schottky barrier junction is formed in a boundary region between the n-type semiconductor region NSR and the metal electrode MEL. Incidentally, a $p^+$-type semiconductor region PSR for protecting the diode is formed in the n-type semiconductor region NSR. Here, a case where only two $p^+$-type semiconductor regions PSR are formed in the n-type semiconductor region NSR is shown, however, a structure of the Schottky barrier diode in which the $p^+$-type semiconductor regions PSR are arranged in the form of an array in this region can also be adopted.

Further, in the region GR2 which is formed outside the region BR1, the guard band GB2 composed of the p-type semiconductor region is formed in the epitaxial layer EP. This guard band GB2 has a function of maintaining the voltage resistance of the Schottky diode SBD.

<Advantage of Twelfth Embodiment>

In the semiconductor device according to this twelfth embodiment configured as described above, the source region SR of the SiC power MOSFET is formed from a metal material (a metal silicide). Due to this, according to this twelfth embodiment, the source region SR of the SiC power MOSFET and the metal electrode MEL of the Schottky diode SBD can be constituted by the same metal material (metal silicide). Therefore, according to this twelfth embodiment, an advantage that the source region SR of the SiC power MOSFET and the metal electrode MEL of the Schottky diode SBD can be produced by the same step is obtained. As a result, an advantage that the process for producing the semiconductor device including the SiC power MOSFET and the Schottky diode SBD can be simplified is obtained.

At this time, the source region SR and the metal electrode MEL are formed by siliciding a polysilicon film, however, by using a method in which after this polysilicon film is deposited, a conductive impurity is doped only into the source forming region, it is possible to provide a state in which the metal electrode forming region composed of the polysilicon film does not contain a conductive impurity. As a result, in the Schottky diode SBD, a high Schottky barrier can be realized.

Further, according to this twelfth embodiment, for example, as shown in FIG. 94, since the Schottky diode forming region is provided so as to surround the outer side of the MOSFET forming region, the integration efficiency of the SiC power MOSFET and the Schottky diode can be improved. As a result, an advantage that the cost for the semiconductor device can be reduced is obtained.

Further, in this twelfth embodiment, the SiC power MOSFET and the Schottky diode are formed on the same semiconductor substrate, and therefore, an advantage that the improvement of characteristics by detailed design of device parameter matching can be achieved is obtained.

Hereinabove, the present invention accomplished by the present inventors have been described in detail with reference to the embodiments, however, it goes without saying that the present invention is not limited to the embodiments described above, and can be modified variously within a range that does not depart from the gist of the invention.

In the above-described embodiments, a case where the technical idea of the invention is applied to a SiC power MOSFET has been mainly described, however, the invention is not limited thereto, and the technical idea of the invention can also be applied to a Si power MOSFET in which silicon is used as a semiconductor material. It is considered that this is because also in a Si power MOSFET, by improving the injection efficiency and injection rate of a carrier (electron) from an edge portion of the source region to the channel region, the channel mobility in the Si power MOSFET can be improved.

Further, in the above-described embodiments, an n-channel MOSFET is described, however, the invention is not limited thereto, and the technical idea of the invention can also be applied to a p-channel MOSFET.

INDUSTRIAL APPLICABILITY

The present invention can be widely applied to the production field in which a semiconductor device is produced.

What is claimed is:

1. A semiconductor device, comprising a field-effect transistor formed in a first region of a semiconductor substrate, wherein the field-effect transistor includes:
    the semiconductor substrate of a first conductivity type which serves as a drain region;
    a drift layer of the first conductivity type which is formed on the semiconductor substrate and has a lower impurity concentration than the semiconductor substrate;
    a well region of a second conductivity type which is in contact with the drift layer;
    a well contact region of the second conductivity type which is in contact with the well region and has a higher impurity concentration than the well region;
    a source region which is in contact with the well region and is constituted by a metal material;
    a channel forming region, which is sandwiched by the source region and the drift layer, in the well region;
    a gate insulating film which is in contact with the channel forming region and the source region; and
    a gate electrode which is above the channel forming region and the source region, overlaps at least a portion of the source region, and is in contact with the gate insulating film,
    wherein the semiconductor substrate and the drift layer are formed from silicon carbide doped with an impurity of the first conductivity type, and
    wherein the well region and the well contact region are formed from silicon carbide doped with an impurity of the second conductivity type.

2. The semiconductor device according to claim 1, wherein a conductive impurity is segregated at an interface between the source region and the well region.

3. The semiconductor device according to claim 2, wherein the conductive impurity is phosphorus or arsenic.

4. The semiconductor device according to claim 1, wherein the metal material is nickel silicide.

5. The semiconductor device according to claim 1, wherein the semiconductor device has a diode in a second region of the semiconductor substrate.

6. The semiconductor device according to claim 5, wherein the second region is formed to surround the periphery of the first region.

7. The semiconductor device according to claim 1, wherein the contact between the source region and the well region is Schottky contact.

8. A method for producing a semiconductor device, comprising the steps of:
    (a) preparing a semiconductor substrate composed of silicon carbide doped with an impurity of a first conductivity type;
    (b) forming a drift layer, which is composed of silicon carbide doped with an impurity of the first conductivity type and has a lower impurity concentration than the semiconductor substrate, on the semiconductor substrate;
    (c) forming a well region which is in contact with the drift layer and is composed of silicon carbide doped with an impurity of a second conductivity type;
    (d) forming a well contact region of the second conductivity type which is in contact with the well region and has a higher impurity concentration than the well region;
    (e) forming a source region which is in contact with the well region and is composed of a metal material;
    (f) forming a gate insulating film which is in contact with the source region and a channel forming region in which a channel is formed in the well region; and
    (g) forming a gate electrode which is above the channel forming region and the source region, overlaps at least a portion of the source region, and is in contact with the gate insulating film.

9. A method for producing a semiconductor device, comprising:
    (a) preparing a semiconductor substrate composed of silicon carbide doped with an impurity of a first conductivity type;
    (b) forming a drift layer, which is composed of silicon carbide doped with an impurity of the first conductivity type and has a lower impurity concentration than the semiconductor substrate, on the semiconductor substrate;
    (c) forming a well region which is in contact with the drift layer and is composed of silicon carbide doped with an impurity of a second conductivity type;
    (d) forming a source region which is in contact with the well region and is composed of a metal material, including:
        (d1) forming a polysilicon film which is in contact with the well region;
        (d2) forming a metal film on the polysilicon film; and
        (d3) subjecting the semiconductor substrate to a heat treatment after the step (d2) to react the polysilicon film with the metal film, thereby forming the source region composed of a metal silicide film;
    (e) forming a gate insulating film which is contact with a channel forming region in which a channel is formed in the well region; and
    (f) forming a gate electrode which is in contact with the gate insulating film.

10. A method for producing a semiconductor device, comprising:
    (a) preparing a semiconductor substrate composed of silicon carbide doped with an impurity of a first conductivity type;
    (b) forming a drift layer, which is composed of silicon carbide doped with an impurity of the first conductivity type and has a lower impurity concentration than the semiconductor substrate, on the semiconductor substrate;

(c) forming a well region which is in contact with the drift layer and is composed of silicon carbide doped with an impurity of a second conductivity type;

(d) forming a source region which is in contact with the well region and is composed of a metal material, including:
  (d1) forming a polysilicon film which is in contact with the well region;
  (d2) doping a conductive impurity into the polysilicon film;
  (d3) forming a metal film on the polysilicon film after the step (d2); and
  (d4) subjecting the semiconductor substrate to a heat treatment after the step (d3) to react the polysilicon film with the metal film, thereby forming the source region composed of a metal silicide film, and segregating the conductive impurity at an interface between the source region and the well region;

(e) forming a gate insulating film which is contact with a channel forming region in which a channel is formed in the well region; and (f) forming a gate electrode which is in contact with the gate insulating film.

* * * * *